United States Patent
Di Paolo et al.

(10) Patent No.: US 12,333,386 B2
(45) Date of Patent: Jun. 17, 2025

(54) TUNABLE INTERACTIONS FOR IMPLEMENTING TWO-QUBIT GATES, AND EXTENSIBLE CIRCUITS BUILT THEREFROM

(71) Applicants: Massachusetts Institute of Technology, Cambridge, MA (US); SOCPRA SCIENCES ET GENIE S.E.C., A/S TransferTech Sherbrooke, Sherbrooke (CA)

(72) Inventors: Agustin Di Paolo, Cambridge, MA (US); William D. Oliver, Lexington, MA (US); Catherine Leroux, Sainte-Julie (CA); Alexandre Blais, Sherbrooke (CA)

(73) Assignees: Massachusetts Institute of Technology, Cambridge, MA (US); SOCPRA SCIENCES ET GENIE S.E.C., A/S TransferTech Sherbrooke, Sherbrooke (CA)

( * ) Notice: Subject to any disclaimer, the term of this patent is extended or adjusted under 35 U.S.C. 154(b) by 0 days.

(21) Appl. No.: 18/048,574

(22) Filed: Oct. 21, 2022

(65) Prior Publication Data
US 2024/0346350 A1   Oct. 17, 2024

Related U.S. Application Data

(60) Provisional application No. 63/292,634, filed on Dec. 22, 2021, provisional application No. 63/328,947, filed on Apr. 8, 2022.

(51) Int. Cl.
*G06N 10/40* (2022.01)
*G06N 10/00* (2022.01)
*H10N 60/12* (2023.01)

(52) U.S. Cl.
CPC ........... *G06N 10/40* (2022.01); *G06N 10/00* (2019.01); *H10N 60/12* (2023.02)

(58) Field of Classification Search
CPC ......... G06N 10/40; G06N 10/00; H10N 60/12
(Continued)

(56) References Cited

U.S. PATENT DOCUMENTS

| 11,244,241 B1 | 2/2022 | Gambetta et al. |
| 11,615,336 B2 | 3/2023 | Oliver et al. |

(Continued)

FOREIGN PATENT DOCUMENTS

| WO | WO 2018/151929 A1 | 8/2018 |
| WO | WO 2021/178042 A1 | 9/2021 |

OTHER PUBLICATIONS

A Couped-Qubit Tavis Cummings Scheme for Prolonging Quantum Coherence Oct. 2013 Physical review A, Atomic, molecular, and optical physics 91(1) DOI:10.1103/PhysRevA.91.012317 SourcearXiv A, De.*

(Continued)

*Primary Examiner* — Arnold M Kinkead
(74) *Attorney, Agent, or Firm* — DALY, CROWLEY, MOFFORD & DURKEE, LLP

(57) ABSTRACT

A system and method provide two-qubit gates and quantum computing circuits built therefrom. Pairs of qubits are inductively or capacitively coupled using a coupler that is driven using an off-resonant microwave drive. By controlling the drive, the ZZ interaction between the qubits can be precisely controlled. In particular, the interaction may be selectively reduced or suppressed, thereby isolating the qubits from each other, or the interaction may be increased to provide fast, controlled-Z, two-qubit gates with high fidelity. Moreover, qubits and couplers may be arranged according to their (Continued)

resonant frequencies into unit cells and replicated to arbitrary size, thereby forming a quantum computer.

13 Claims, 39 Drawing Sheets

(58) Field of Classification Search
USPC .................. 326/4, 1, 7; 327/366; 257/14
See application file for complete search history.

(56) References Cited

U.S. PATENT DOCUMENTS

| | | |
|---|---|---|
| 2020/0287540 A1 | 9/2020 | Smith et al. |
| 2021/0272008 A1 | 9/2021 | Oliver et al. |
| 2022/0108200 A1 | 4/2022 | Suttle et al. |
| 2023/0401475 A1* | 12/2023 | Finck .................. H10N 60/11 |

OTHER PUBLICATIONS

Tuneable hopping and nonlinear cross-Kerr interactions in a high-coherence superconducting circuit M. Kounalakis 1,2, C. Dickel1,2, A. Bruno1,2, N. K. Langford1,2,3 and G. A. Steele1 npj Quantum Information (2018) 4:38 ; doi: 10.1038/s41534-018-0088-9.*
Coatanea-Gouachet et al., "Electromagnetic Quench Detection in ITER Superconducting Magnet Systems"; IEEE Transactions on Applied Superconductivity, vol. 25, No. 3; Jun. 2015; 7 Pages.
Huang et al., "Localized Hotspot Detection for Quench Prevention in HTS Magnets Using Distributed Fiber Bragg Gratings"; Journal of Lightwave Technology, vol. 41, No. 22; Nov. 2023; 9 Pages.
Martovetsky et al., "ITER CS Quench Detection System and Its Qualification by Numerical Modeling"; IEEE Transactions on Applied Superconductivity, vol. 24, No. 3; Jun. 2014; 4 Pages.
U.S. Appl. No. 18/665,909, filed May 16, 2024, Winik et al.
Chu et al., "Coupler-Assisted Controlled-Phase Gate with Enhanced Adiabaticity;" Journal Article from Phys. Rev. Applied 16, 054020; Published Nov. 2, 2021; 22 Pages.
Stehlik et al., "Tunable Coupling Architecture for Fixed-Frequency Transmon Superconducting Qubits;" Journal Article from Physical Review Letters 127, 080505; Jan. 2021; 6 Pages.
U.S. 312 Amendment filed on Feb. 2, 2023 for U.S. Appl. No. 17/188,461; 3 Pages.
Notice of Allowance dated Jan. 6, 2023 for U.S. Appl. No. 17/188,461; 7 Pages.
U.S. Non-Final Office Action dated Jul. 18, 2022 for U.S. Appl. No. 17/188,461; 13 Pages.
Response to U.S. Non-Final Office Action dated Jul. 18, 2022 for U.S. Appl. No. 17/188,461, filed Oct. 18, 2022; 7 Pages.
U.S. Final Office Action dated Nov. 17, 2022 for U.S. Appl. No. 17/188,461; 7 Pages.
Response to U.S. Final Office Action dated Nov. 17, 2022 for U.S. Appl. No. 17/188,461, filed Dec. 19, 2022; 6 Pages.
Arute et al.; "Quantum supremacy using a programmable superconducting processor"; Nature; vol. 574; Oct. 24, 2019; 7 Pages.
Barends et al.; "Diabatic gates for frequency-tunable superconducting qubits"; Physical Review Letters; vol. 123, No. 21; Nov. 19, 2019; 8 Pages.
Berke et al.; "Transmon platform for quantum computing challenged by chaotic fluctuations"; Nature Communications; May 6, 2022; 10 Pages.
Breuer et al.; "Adiabatic processes in the ionization of highly excited hydrogen atoms"; Zeitschrift fur Physik D Atoms, Molecules and Clusters; vol. 11; Mar. 11, 1989; 14 Pages.
Breuer et al.; "Transport of quantum states of periodically driven systems"; Journal de Physique (France); vol. 51; Apr. 15, 1990; 15 Pages.
Brink et al.; "Device challenges for near term super-conducting quantum processors: frequency collisions"; 2018 IEEE International Electron Devices Meeting (IEDM); Dec. 1, 2018; 3 Pages.

Caldwell et al.; "Parametrically activated entangling gates using transmon qubits"; arXiv:1706.06562v2; Dec. 8, 2017; 7 Pages.
Chen et al.; "Qubit architecture with high coherence and fast tunable coupling"; arXiv:1402.7367v1; Feb. 28, 2014; 10 Pages.
Chow et al.; "Complete universal quantum gate set approaching fault-tolerant thresholds with superconducting qubits"; arXiv:1202.5344v1; Feb. 23, 2012; 13 Pages.
Chow et al.; "Microwave-activated conditional-phase gate for superconducting qubits"; New Journal of Physics; vol. 15, Nov. 19, 2013; 11 Pages.
Di Paolo et al.; "Efficient modeling of superconducting quantum circuits with tensor networks"; npj Quantum Information; vol. 7, No. 11; 2021; 11 Pages.
DiCarlo et al.; "Demonstration of two-qubit algorithms with a superconducting quantum processor"; arXiv:0903.2030v2; May 4, 2009; 9 Pages.
Didier et al.; "Ac flux sweet spots in parametrically modulated superconducting qubits"; Physical Review Applied; vol. 12; Nov. 7, 2019; 11 Pages.
Ficheux et al.; "Fast logic with slow qubits: microwave-activated controlled-z gate on low-frequency fluxoniums"; American Physical Society; Physical Review X; vol. 11; May 3, 2021; 16 Pages.
Garcia-Ripoll et al.; "Quantum control of frequency-tunable transmon superconducting qubits"; arXiv:2022.10320v3; Jul. 20, 2020; 11 Pages.
Grifoni et al.; "Driven quantum tunneling"; Elsevier Science B.V.; Physics Reports; vol. 304; 1998; 126 Pages.
Gyneis et al.; "Moving beyond the transmon: Noise-protected superconducting quantum circuits"; American Physical Society; PRX Quantum; vol. 2; 2021; 15 Pages.
Hertzberg et al.; "Laser-annealing Josephson junctions for yielding scaled-up superconducting quantum processors"; Quantum Information; vol. 7, No. 1; Aug. 19, 2021; 8 Pages.
Hone et al.; "Time-dependent floquet theory and absence of an adiabatic limit"; arXiv:cond-mat/9706182v1; Jun. 17, 1997; 15 Pages.
Huang et al.; "Engineering dynamical sweet spots to protect qubits from 1/f noise"; Physical Review Applied 15, 034065; 2021; 19 Pages.
Hutchings et al.; "Tunable superconducting qubits with flux-independent coherence"; arXiv:1702.02253v2; Feb. 12, 2017; 17 Pages.
Johansson et al.; "Qutip: An open-source python framework for the dynamics of open quantum systems"; Computer Physics Communications 183 1760-1772; 2012; 13 Pages.
Kandala et al.; "Demonstration of a high-fidelity CNOT gate for fixed-frequency transmons with engineered ZZ suppression"; arXiv:2011.07050v1; Nov. 13, 2020; 10 Pages.
Kjaergaard et al.; "Superconducting qubits: Current state of play"; Annual Review of Condensed Matter Physics; vol. 11; Mar. 2020; 29 Pages.
Koch et al.; "Charge-insensitive qubit design derived from the cooper pair box"; arXiv:cond-mat/0703002v2; Sep. 26, 2007; 21 Pages.
Krinner et al.; "Benchmarking coherent errors in controlled-phase gates due to spectator qubits"; arXiv:2005.05914v1; May 12, 2020; 9 Pages.
Krinner et al.; "Demonstration of an all-microwave controlled-phase gate between far-detuned qubits"; arXiv:2006.10639v1; Jun. 18, 2020; 10 Pages.
Ku, et al.; "Suppression of unwanted ZZ interactions in a hybrid two-qubit system"; arXiv:2003.02775v2; Apr. 9, 2020; 21 Pages.
Malekakhlagh et al.; "First-principles analysis of cross-resonance gate operation"; arXiv:2005.00133v2; May 5, 2020; 30 Pages.
Martinez-Garaot et al.; "Fast quasiadiabatic dynamics"; American Physical Society; Physical Review A; vol. 92; 2015; 6 Pages.
McKay et al.; "A universal gate for fixed-frequency qubits via a tunable bus"; arXiv:1604.03076v3; Dec. 19, 2016; 10 Pages.
McKay et al.; "Efficient Z-gates for Quantum Computing"; Physical Review A; vol. 96, No. 2; Aug. 31, 2017; 8 Pages.
Magesen et al.; "Effective Hamiltonian models of the cross-resonance gate"; arXiv:1804.04073v2; Feb. 25, 2019; 16 pages.

(56) References Cited

OTHER PUBLICATIONS

Mitchell et al.; "Hardware-Efficient Microwave-Activated Tunable Coupling between Superconducting Qubits"; arXiv:2105.05384v1; May 12, 2021; 12 pages.

Morvan et al.; "Optimizing frequency allocation for fixed-frequency superconducting quantum processors"; American Physical Society; Physical Review Research; vol. 4; Apr. 28, 2022; 6 Pages.

Motzoi et al.; "Simple pulses for elimination of leakage in weakly nonlinear qubits"; arXiv:0901.0534v3; Oct. 11, 2009; 4 Pages.

Mundada et al.; "Floquet-engineered enhancement of coherence times in a driven fluxonium qubit"; arXiv:2007.13756v1; Jul. 27, 2020; 12 Pages.

Murch et al.; "Quantum fluctuations in the chirped pendulum"; Nature Physics; vol. 7; Feb. 2011; 4 Pages.

Neely et al.; "Generation of three-qubit entangled states using superconducting phase qubits"; arXiv:1004.4246v2; Apr. 29, 2010; 9 Pages.

Paik et al.; "Experimental demonstration of a resonator-induced phase gate in a multiqubit circuit-qed system"; Physical Review letters; vol. 117, No. 25; Dec. 13, 2016; 13 Pages.

Pechal et al.; "Direct implementation of a perceptron in superconducting circuit quantum hardware"; American Physical Society; Physical Review Research; vol. 4; Sep. 8, 2022; 10 Pages.

Peskin et al.; "The solution of the time-dependent schrodinger equation by the (t, t') method: Theory, computational algorithm and applications"; The Journal of Chemical Physics; vol. 99, No. 6; Sep. 15, 1993; 7 Pages.

Petrescu et al.; "Accurate methods for the analysis of strong-drive effects in parametric gates"; arXiv:2017.02343v1 preprint; Jul. 6, 2021; 21 Pages.

Pop et al.; "Coherent suppression of electromagnetic dissipation due to superconducting quasiparticles"; Nature; vol. 508; Apr. 17, 2014; 18 Pages.

Rol et al.; "Time-domain characterization and correction of on-chip distortion of control pulses in a quantum processor"; Applied Physics Letters; vol. 116, No. 5; Dec. 20, 2019; 9 Pages.

Salis et al.; "Time-resolved tomography of a driven adiabatic quantum simulation"; Physical Review A; vol. 102, No. 6; 2020; 5 Pages.

Takita, et al.; "Demonstration of weight-four parity measurements in the surface code architecture"; arXiv:1605.0135v3; Apr. 28, 2017; 8 Pages.

Wei et al.; "Quantum crosstalk cancellation for fast entangling gates and improved multi-qubit performance"; arXiv:2106.00675v1; Jun. 1, 2022; 16 Pages.

Weinberg et al.; "Adiabatic perturbation theory and geometry of periodically-driven systems"; Elsevier, Science Direct; Physics Reports; vol. 00; 2017; 41 Pages.

Wood et al.; "Quantification and characterization of leakage errors"; Physical Review A 97, 032306; Mar. 8, 2018; 20 Pages.

Yan et al.; "Engineering Framework for Optimizing Superconducting Qubit Designs"; arXiv:2006.04130v1; Jun. 7, 2020; 6 Pages.

Yatsenko et al.; "Pulse-driven near-resonant quantum adiabatic dynamics: Lifting of quasidegeneracy"; arXiv:quant-ph/0312080v1; Dec. 9, 2003; 21 pages.

Zhang et al.; "Drive-induced nonlinearities of cavity modes coupled to a transmon ancilla"; arXiv:2016.09112v3; Mar. 8, 2022; 32 Pages.

Zhang et al.; "Preparing quasienergy states on demand: A parametric oscillator"; Physical Review A; vol. 95, No. 5; May 16, 2017; 12 Pages.

* cited by examiner

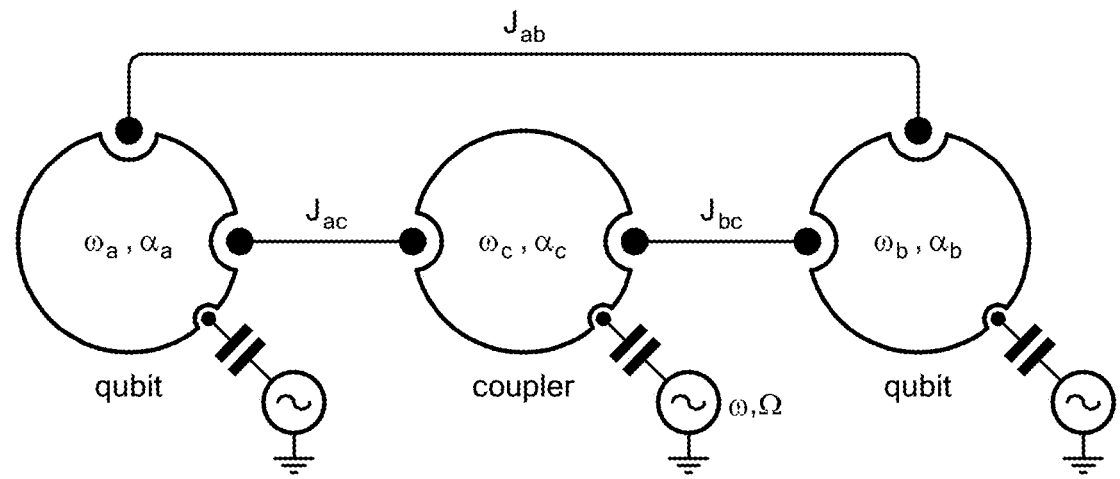
FIG. 12
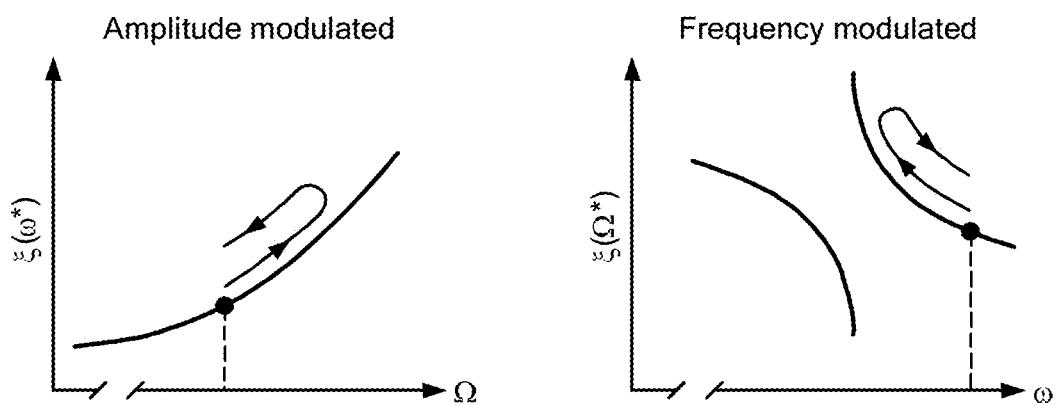
FIG. 13       FIG. 14

TUNABLE INTERACTIONS FOR IMPLEMENTING TWO-QUBIT GATES, AND EXTENSIBLE CIRCUITS BUILT THEREFROM

CROSS-REFERENCE TO RELATED APPLICATIONS

This application claims the benefit of U.S. Provisional Application 63/328,947 filed Apr. 8, 2022 and Application 63/292,634 filed Dec. 22, 2021, the entire contents of which are incorporated herein by reference.

STATEMENT REGARDING FEDERALLY SPONSORED RESEARCH

This invention was made with government support under W911NF -18-1-0411 awarded by the U.S. Army Research Office. The government has certain rights in the invention.

BACKGROUND

Quantum computing is set to change the way in which we solve complex and pressing problems. Several companies are currently working on this space, ranging from hardware providers such as IBM, Google and Amazon, to software providers such as Microsoft.

Scaling up superconducting qubit technology to many qubits is possible but challenging. In fact, as no best or optimal solution to this problem is known to date, tradeoffs between architectural choices need to be considered. Not surprisingly, large corporations have taken different paths to scale up superconducting devices.

The field of quantum information processing with superconducting devices is transitioning from small- to intermediate-scale demonstrations. The modularity of circuit QED has so far made it possible to extend few-qubit designs to multiple qubits. However, as the number of qubits increases, average qubit coherence and two-qubit gate fidelities often tend to degrade. Among the leading causes are the presence of spurious interactions, spectator-qubit effects, crosstalk, and frequency crowding.

There exist two broad categories of extensible transmon-qubit-based architectures in development. One uses fixed-frequency qubits that are capacitively coupled, and all-microwave gates. Fixed-frequency layouts help preserve qubit coherence, and direct two-qubit coupling reduces hardware overhead. However, the need for maximizing desired gate interactions over undesirable, residual couplings, leads to tight frequency-placement constraints. These conditions render this architecture prone to frequency collisions and exacerbate the impact of circuit-element disorder. To some extent, these issues can be mitigated by improving fabrication targeting and reducing qubit connectivity.

The second approach uses tunable-frequency qubits coupled directly or via a tunable coupler. In this case, two-qubit gates are implemented by modulating the qubits' and/or the coupler's frequencies using baseband flux pulses. Such gates are typically faster than all-microwave gates. Furthermore, tunable qubits and couplers help reducing crosstalk and frequency crowding, allowing for high connectivity. However, tunability leads to increased footprint, hardware overhead, and extra calibration steps. In addition, flux tunability introduces sensitivity to flux noise.

SUMMARY

Disclosed embodiments engineer tunable multiqubit interactions by applying off-resonant drives to coupler modes for i) implementing quantum gates and ii) suppressing unwanted couplings in a superconducting quantum processor.

Superconducting quantum circuits are a leading hardware architecture for building quantum computers. Engineering these processors involves designing the qubits, which are used to store and process quantum information, and methods for wiring two or more qubits to enable two-qubit gates.

Qubit connectivity can be realized by direct coupling or by a coupler mode. At the price of a larger hardware footprint, couplers can help increase the on-off ratio of the intended two-qubit coupling and mitigate issues related to qubit frequency crowding in large-scale chips. Moreover, couplers are useful to reduce the strength of spurious multiqubit interactions that are a second-order effect of the qubit connectivity.

Embodiments provide a novel method to enhance and/or suppress multiqubit interactions by the application of off-resonant microwave drives to the coupler modes that connect the qubits. An enhanced interaction strength can be used to implement fast and high-fidelity two-qubit gates and/or counteract spurious two-qubit couplings that corrupt the idling state of the qubits. The parameters of the microwave drives that make this possible, including drive powers, frequencies and phases, are determined by optimizing the two-qubit coupling with the purpose of implementing a gate (enhanced interaction) or decoupling the qubits (suppressed interaction). Since this optimization can be performed as a function of the qubit parameters, our method removes constraints on the operating regime of the qubit themselves.

Thus, a first embodiment is a system comprising a first qubit associated with a first resonant frequency. The system also has a second qubit associated with a second resonant frequency. The system also has a qubit coupler inductively or capacitively coupling the first qubit to the second qubit according to a ZZ interaction strength. The system also has a microwave driver for driving the qubit coupler with microwaves according to a driver power and a third driver frequency that is different than the first resonant frequency and the second resonant frequency. The microwave driver is configurable to selectively increase or decrease the ZZ interaction strength.

In some embodiments, either the first qubit or the second qubit comprises a fixed-frequency transmon, or a tunable-frequency transmon, or a fluxonium.

In some embodiments, the qubit coupler comprises a split-transmon or an inductively-shunted transmon, or a fluxonium.

In some embodiments, the microwave driver is configurable by selectively tuning either the driver power, or the driver frequency, or both.

In some embodiments, the qubit coupler is configurable to reduce spurious interactions between the first qubit and the second qubit by selectively decreasing the ZZ interaction strength.

In some embodiments, the microwave driver is configurable to form a two-qubit gate by selectively increasing the ZZ interaction strength.

In some embodiments, the microwave driver is configurable for selectively tuning to obtain a given leakage rate, or a given gate speed, or a balance between a leakage rate and a gate speed.

In some embodiments further comprising one or more additional qubits, the microwave driver is further configurable to selectively decrease a ZZZ interaction strength or ZZZZ interaction strength between the first qubit, the second qubit, and the one or more additional qubits.

Another embodiment is a method of tuning ZZ interactions between a first qubit and a second qubit that are inductively or capacitively coupled using a qubit coupler. The method includes driving the qubit coupler using microwaves having a driver power, and having a driver frequency that is different than a resonant frequency of the first qubit and a resonant frequency of the second qubit. Driving the qubit coupler selectively increases or decreases a ZZ interaction strength between the first qubit and the second qubit through the qubit coupler.

In some embodiments, driving the qubit coupler comprises selectively tuning either the driver power, or the driver frequency, or both.

Some embodiments further comprise tuning a resonant frequency of the qubit coupler to reduce spurious interactions between the first qubit and the second qubit by selectively decreasing the ZZ interaction strength.

Some embodiments further comprise driving the qubit coupler to selectively increase the ZZ interaction strength, thereby forming a two-qubit gate.

In some embodiments, driving the qubit coupler comprises selectively tuning to obtain a given leakage rate, or a given gate speed, or a balance between a leakage rate and a gate speed.

Some embodiments further comprise driving the qubit coupler to selectively decrease a ZZZ interaction strength or ZZZZ interaction strength between the first qubit, the second qubit, and one or more additional qubits.

Another embodiment is a multi-qubit processor. The processor has a plurality of qubits, each qubit in the plurality of qubits being associated with a respective resonant frequency. The processor also has a plurality of qubit couplers, each qubit coupler in the plurality of qubit couplers being associated with a respective resonant frequency and inductively or capacitively coupling a respective pair of qubits in the plurality of qubits. The processor also has a plurality of microwave drivers, each microwave driver configurable for driving a corresponding qubit coupler with microwaves according to a driver power and a driver frequency, the driver power and driver frequency being selected to reduce crosstalk between the qubits inductively coupled by the corresponding qubit coupler.

Some embodiments further comprise at least one qubit coupler that inductively or capacitively couples a first pair of qubits in the plurality of qubits to a second pair of qubits in the plurality of qubits.

In some embodiments, the plurality of qubits and the plurality of qubit couplers comprise a two-dimensional repeating pattern of unit cells, each unit cell having at least two qubits and at least one qubit coupler.

In some embodiments, each unit cell is characterized by a minimum Manhattan distance between qubits in the plurality of qubits, or couplers in the plurality of couplers, that have the same resonant frequency.

In some embodiments, at least one microwave driver is configured according to a driver power and driver frequency selected to minimize or cancel crosstalk between the qubits inductively coupled by the corresponding qubit coupler.

It is appreciated that the concepts, techniques, and structured disclosed herein may be embodied in ways other than those summarized above, and the inclusion of particular embodiments in this summary should not be viewed to exclude the existence of other embodiments.

DESCRIPTION OF THE SEVERAL VIEWS OF THE DRAWINGS

The manner and process of making and using the disclosed embodiments may be appreciated by reference to the drawings, in which:

FIG. 12 shows a schematic of a two-qubit-coupler architecture in accordance with an embodiment;

FIG. 13 shows ZZ interaction as a function of drive amplitude at fixed frequency □*;

FIG. 14 shows ZZ interaction as a function of drive frequency for fixed drive amplitude Ω*;

DETAILED DESCRIPTION

Figure 1A:
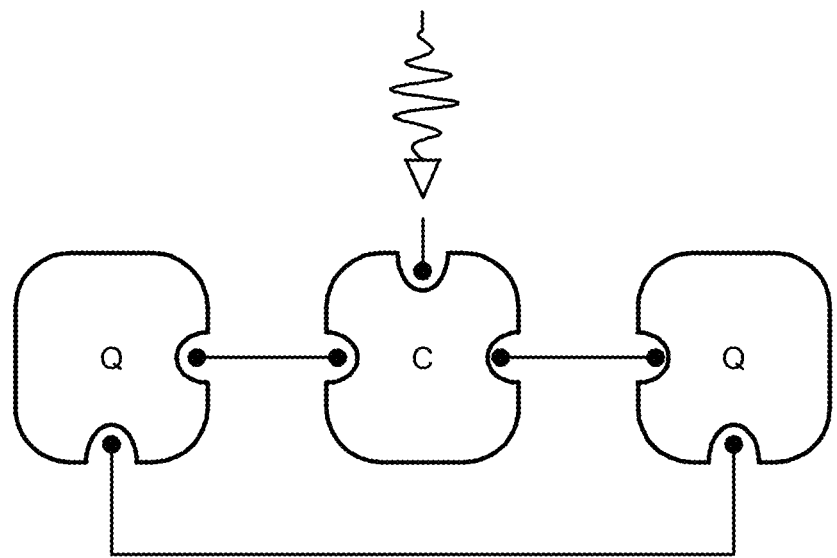
FIGS. 1A-1C show an all-microwave coupler-based superconducting architecture.
Figure 1B:
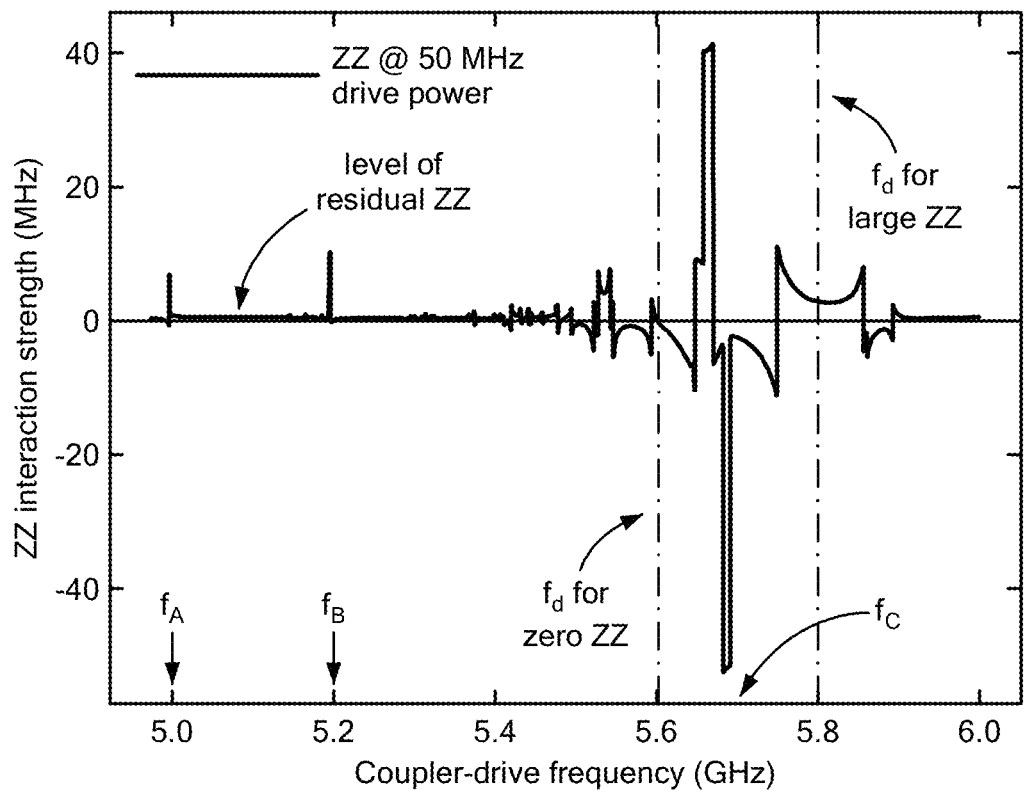
Figure 1C:
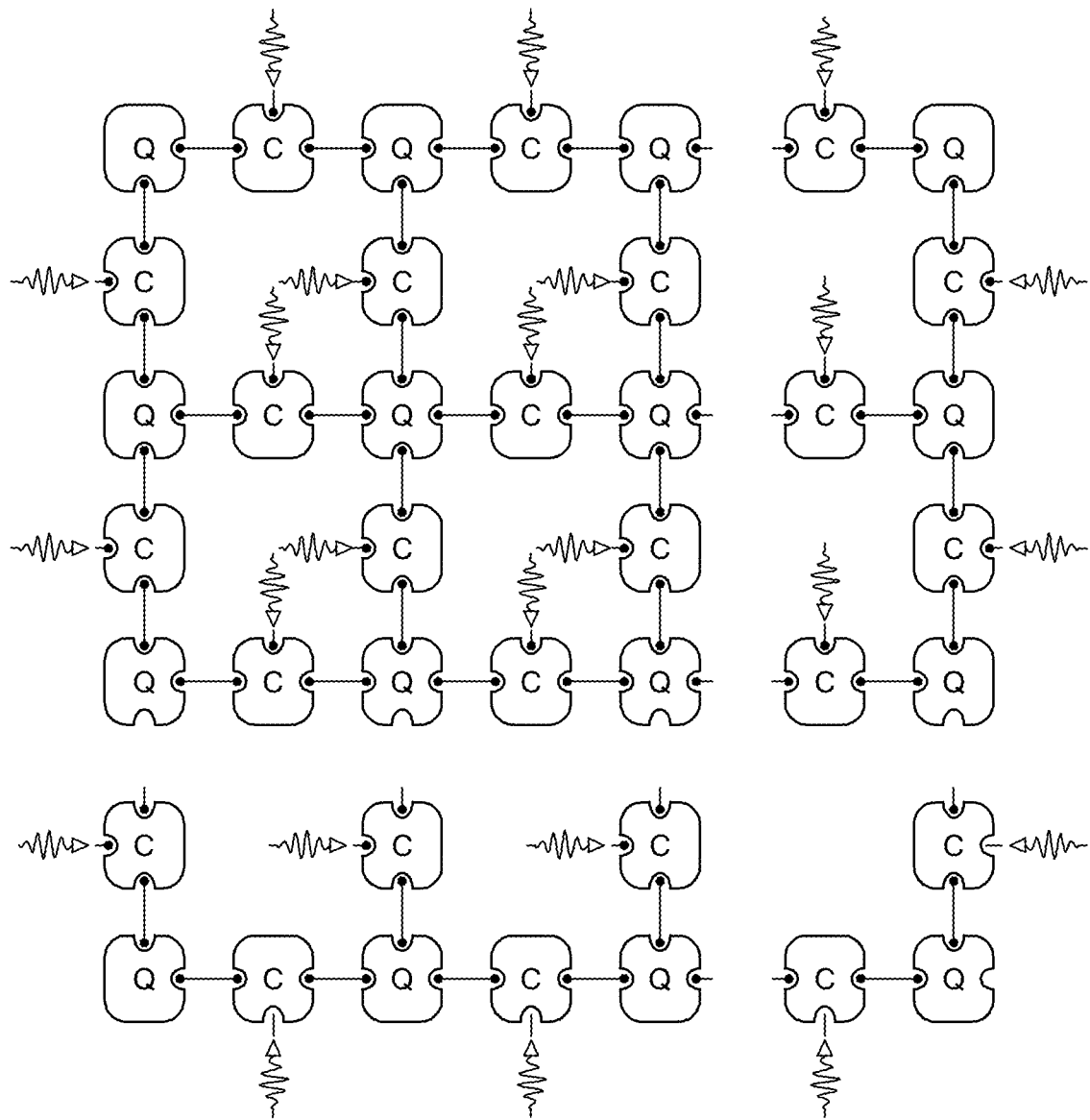

FIGS. 1A-1C show a concept for an all-microwave coupler-based superconducting architecture. FIG. 1A shows two qubits (Q) wired by a driven coupler (C). A microwave drive on the coupler is represented by the wiggly line and direct coupling between the qubits and coupler modes is represented by a full line. FIG. 1B shows driven ZZ interaction for a 50 MHz coupler drive as a function of drive frequency. $f_A$ and $f_B$ indicate the frequencies of two qubits connected by a coupler of frequency $f_C$. The rightmost (respectively, leftmost) line indicates the frequency at which the interaction strength is large (respectively, exactly zero) corresponding to an enhancement (respectively, suppression) of such interaction with respect to the undriven case (level of residual ZZ). FIG. 1C shows an extensible architecture that uses coupled qubits in accordance with an embodiment.

The simplest quantum circuit, shown in FIG. 1A, consists of only two qubits wired by a coupler. In accordance with embodiments, in the presence of an off-resonant microwave drive acting on the coupler mode, the "ZZ" interaction strength between the two qubits can be made arbitrarily large at certain drive frequencies. Furthermore, such divergences can be engineered by adjusting the parameters of the coupler and the qubits including their frequencies and an harmonicities. Moreover, several poles in the "ZZ" interaction strength appear in a relatively narrow frequency range which, when properly engineered, does not overlap with resonant transitions of the two-qubit plus coupler system. In this frequency range, the driven two-qubit interaction acquires a large, finite value away from divergences; see FIG. 1B. This behavior is alike to the straddling regime of transmon qubits and leads to large ZZ interaction rates that are stable in drive power and frequency, and that can be used for implementing a controlled-Z (or CZ) gate.

One major advantage of disclosed embodiments is that the idling and driven properties of the system can be engineered independently. When the system idles and the drive is off, the system parameters, which become fixed after the fabrication of a chip, can be chosen such that spurious two-qubit interactions are conveniently reduced. Following this step, the optimal coupler-drive parameters for enabling two-qubit gates can be found as a function of the already defined system parameters.

Embodiments offer a second important advantage: Because spurious interactions that are always-on while the system idles cannot, in most cases, be completely suppressed, and because the sign and magnitude of the driven interaction strength is controlled by the parameters of the drive, a weaker drive on the coupler can be used to counteract the static unwanted interactions while the qubits idle. This is illustrated in FIG. 1B, where for a certain drive frequency the two-qubit ZZ interaction can be exactly set to zero. Moreover, because it only requires adjusting the parameters of a microwave drive, such a method for suppressing interactions has low added complexity in comparison with other alternatives that place stringent constraints on the qubit modes. This leads to a hardware-efficient method for enhancing and suppressing interactions, improving overall system performance.

The methods described herein can be directly ported to the multiqubit case, an example of which is shown in FIG. 1C. There, the coupler modes are driven with optimized drive parameters that may vary alongside the lattice to implement two-qubit gates or suppressing unwanted interactions. First circuit blocks represent the coupler modes, and second circuit blocks represent the qubit modes. The off-resonant microwave drives on the couplers can be used to enhance the ZZ interaction between a particular pair of qubits with the purpose of doing a CZ gate. These drives can also be used to cancel spurious ZZ interactions and higher-order correlators between qubit modes, such as ZZZ or ZZZZ, in order to improve idle state of the qubits. The extensible circuit-QED architecture of FIG. 1C is discussed in detail below.

Yet another advantage of embodiments is that the operating method is agnostic with respect to the qubit and coupler modality. However, because our scheme does not require tunability of the coupler modes, fixed frequency transmon qubits, which offer the highest qubit coherence to date in multiqubit chips, are particularly attractive for this application. In contrast, some degree of frequency tunability is needed for the coupler, and we identify two possibilities, shown in FIGS. 2A and 2B.

Figure 2A:
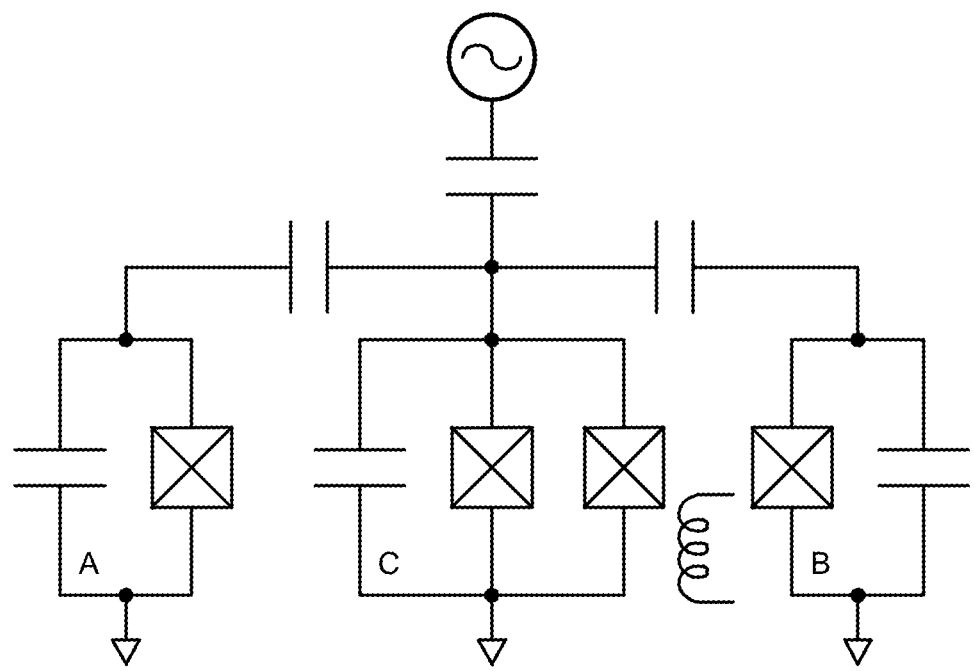
FIGS. 2A-2B show superconducting circuit implementations of FIG. 1A.
Figure 2B:
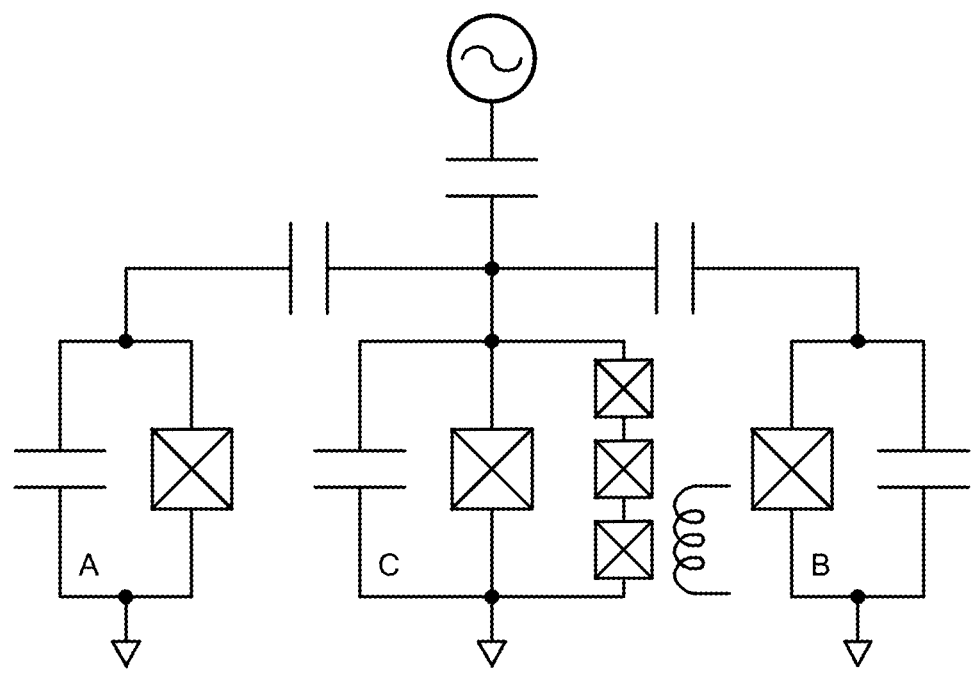

FIGS. 2A-2B show superconducting circuit implementations of FIG. 1A. FIG. 2A shows fixed-frequency transmons (A and B) wired by a split-transmon coupler (C), in a so-called ST-C configuration. FIG. 2B shows fixed frequency transmons (A and B) wired by an inductively shunted transmon coupler (C), in a so-called IST-C configuration. For the split-transmon coupler in FIG. 2A, the anharmonicity is negative, while the inductively shunted transmon coupler in FIG. 2B has positive anharmonicity. Either of these choices can work for both enhancing or suppressing two-qubit interactions. However, couplers with negative (respectively, positive) anharmonicity are more effective at this task for qubits that are weakly (respectively, largely) detuned. Thus, combining these choices in a single qubit architecture might enable optimal frequency placement strategies of the qubit modes.

A voltage source is capacitively coupled to the coupler and can be used to apply an off-resonant microwave drive. A current source is coupled to the coupler by a mutual inductance and can be used to adjust the qubit frequency and anharmonicity and/or drive the coupler with an off-resonant drive. Microwave voltage or flux drives acting on the coupler are intended to be used to reduce or enhance the ZZ interaction between the qubits.

Disclosed embodiments offer a hardware-efficient solution to the problem of addressing qubits for implementing fast and high-fidelity gates while being able to completely decouple these systems at their idling operating point. Because microwave drives can be tuned on and off on-demand, this method enables fast CZ gates with potentially very high on-off ratios. As a difference of other coupler-mediated gates, embodiments do not require the installation of fast-flux lines on a chip, which can be inconvenient for scaling up to many qubits. Moreover, our design is also agnostic with respect to the qubit modality and does not place tight frequency constraints on the qubits nor requires qubit-frequency tunability. Thus, qubits can be operated at their optimal frequency for high qubit coherence and be accommodated in a relatively large frequency band to alleviate issues related to frequency crowding.

In stark contrast, frequency crowding and long-range spurious interactions can easily plague direct-coupling-based architectures, and mitigating these effects is challenging. Our coupler-based architecture with all-microwave interactions can result in substantial gains in gate fidelities and suppress the propagation of coherent (correlated) errors that are highly detrimental to quantum information processing.

Embodiments implement high-fidelity operations in large arrays of qubits by exploiting a unit cell that integrates microwave-driven couplers.

Figure 3:
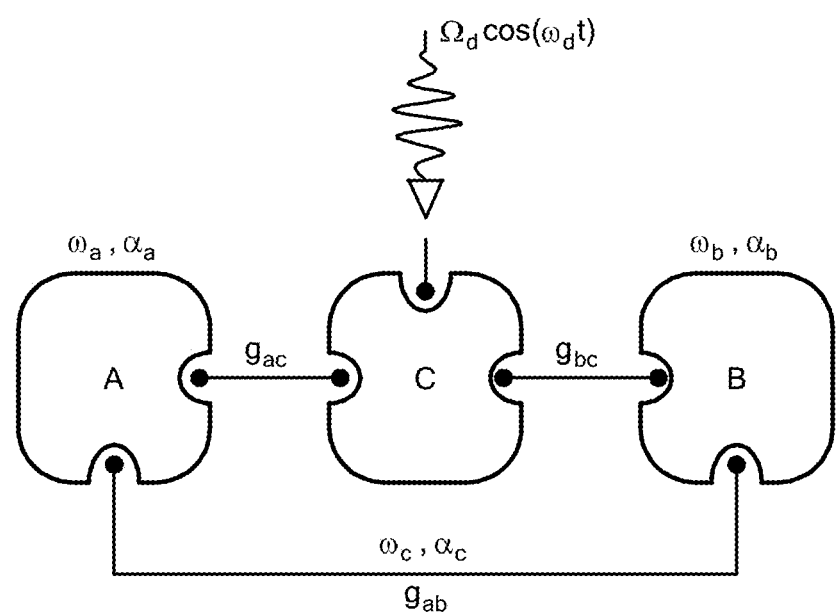
FIG. 3 is a device schematic of the architecture of FIG. 1A.

A particular embodiment and its implementation are now described, with reference to FIG. 3, which is a device schematic of the architecture of FIG. 1A. Two qubits A and B are wired together by a coupler C. The qubits A, B and the coupler C could be, in principle, of any modality or type, including fixed- or tunable-frequency transmons, fluxoniums, or cat qubits, among others. However, for concreteness, below we will consider the qubits to be fixed-frequency transmons. For the coupler, instead, we will consider two models: split-transmon (ST) and inductively-shunted-transmon (IST), which have negative and positive anharmonicity, respectively.

Within a Kerr-nonlinear-oscillator (KNO) approximation, the Hamiltonian of the device of FIG. 3 takes the form $H=H_O+H_d$ where $$H_0/\hbar = \omega_a a^\dagger a + \frac{\alpha_a}{2}a^{\dagger 2}a^2 + \omega_b b^\dagger b + \frac{\alpha_b}{2}b^{\dagger 2}b^2 + \omega_c c^\dagger c + \frac{\alpha_c}{2}c^{\dagger 2}c^2 +$$
$$g_{ac}(a+a^\dagger)(c+c^\dagger) + g_{bc}(b+b^\dagger)(c+c^\dagger) + g_{ab}(a+a^\dagger)(b+b^\dagger).$$

Here, a, b, c denote the annihilation operators associated with the qubit modes (A and B) and the coupler C, with mode frequencies (anharmonicities) $\omega_a$, $\omega_b$, and $\omega_c$ ($\alpha_a$, $\alpha_b$, and $\alpha_c$), respectively. Moreover, $g_{ac}$, $g_{bc}$, and $g_{ab}$ represent the coupling strengths between these modes. For the drive Hamiltonian, we consider the simplest option of an off-resonant drive acting on the coupler mode, such that $$H_d/\hbar = \Omega_d \cos(\omega_d t - \gamma_d)(c+c^\dagger),$$

where $\Omega_d$, $\omega_d$, and $Y_d$ are the power, frequency and phase of the microwave flux or voltage drive.

While this form of the drive Hamiltonian is enough for describing the working principles of our gate scheme, crosstalk or direct microwave drives acting on the qubit modes can also be incorporated in the equation above and could complement the methods described herein.

In operation, embodiments engineer the cross-Kerr (or "ZZ") interaction between two qubits that are wired by a coupler mode, by applying off-resonant microwave drives to the coupler. More generally, higher-order correlators, of the form ZZZ or ZZZZ for instance, may be enhanced or suppressed using the same methods. The engineering of the ZZ interaction has two main purposes: ZZ reduction (or suppression) for improving the idle (i.e. noninteracting) state of multiqubit chips; and ZZ enhancement for enabling fast, controlled-Z two-qubit gates. We discuss both of these possibilities here, which make use of the same techniques and methods.

First, reducing spurious ZZ interaction that is ubiquitous in superconducting qubit devices is imperative. Several proposed approaches to solving this problem include circuit engineering and the use of different qubit modalities. Here we assume that one can use any of these techniques to reduce the idle ZZ interaction, either by tuning the qubits frequencies and anharmonicities or by leveraging the properties of the coupler mode such as frequency and anharmonicity. However, since we are interested in allowing for great flexibility for qubit placement in a large-scale device, here we mainly consider strategies to reduce spurious ZZ coupling by engineering the coupler. We will also avoid having to fine-tune the coupling strengths $g_{ac}$, $g_{bc}$, $g_{ab}$ for this task, since the coupler frequency and anharmonicity are often easier to adjust in practice.

With these constraints in mind, we describe the performance of novel ZZ enhancement two-qubit gate methods used in parameter regimes where the idle ZZ can be reduced. However, we also introduce a new way of reducing spurious couplings by the use of an off-resonant microwave drive on the coupler mode. This new method can be used as a complement of other alternative methods to achieve the same effect or as the sole method to cancel this unwanted interaction.

Regarding ZZ enhancement, we introduce a method to enable fast two-qubit controlled-Z gates by off-resonantly driving the coupler mode with a strong microwave drive. Since the device parameters will in general vary considerably to accommodate the needs of a particular architecture, including for instance the qubit-qubit detuning, anharmonicities, among other parameters, here we focus on engineering the drive power, frequency and phase to produce the desired gate.

The operation protocol is as follows. During idle, the qubits are subject to a weak drive of power $\Omega_d^{idle}$, frequency $\omega_d^{idle}$ and phase $\gamma_d^{idle}$ which is intended to cancel, or partially cancel, the residual ZZ coupling between the two qubits. If other ZZ-cancellation strategies are used, no microwave drive on the coupler may be used to cancel this interaction, i.e. $\Omega_d^{idle} \simeq 0$. To activate the gate, a different microwave drive of power $\Omega_d^{gate}$, frequency $\omega_d^{gate}$ ate and phase $\gamma_d^{gate}$ is applied, such that the ZZ coupling between the qubits is largely increased and that can be used to perform a controlled-Z gate.

In other words, we describe a way to tune the ZZ interaction from zero to a finite (large) value, so that high-fidelity idle and controlled-Z gates can be achieved, respectively. The parameters of the drives that yield an optimal gate interaction will depend on the parameters of the device itself. For this reason, we list possible variants of this architecture depending on the qubit-qubit detuning, coupler parameter and modalities. We present results where the parameters of the drives for suppressing or enhancing the ZZ interaction are optimized as a function of the system parameters. Our results demonstrate the broad applicability of our proposal, which works effectively for any set of system parameters.

We next explore the various parameter regimes by considering different types of qubit-qubit detunings and coupler frequency and anharmonicity. In what follows, we set $g_{ab}=0$ because such a coupling can be made much smaller than $g_{ac}$ and $g_{bc}$ with proper circuit engineering. Moreover, while $g_{ab}$ might be nonzero in an actual device, the presence of this term does not qualitatively alter the behavior of the ZZ reduction and enhancement strategies, as the optimal microwave-drive parameters can be adjusted to account for deviations induced by spurious couplings.

FIGS. 4-11 provide performance plots for each of several parameter sets. Results are based on numerical diagonalization of the first Hamiltonian above. In all cases, the qubit parameters are kept constant with the on-straddling regime choice: $\omega_a/2\pi=5.0$ GHz, $\omega_b/2\pi=5.2$ GHz, and the off-straddling regime choice: $\omega_a/2\pi=5.0$ GHz, $\omega_b/2\pi=5.7$ GHz. The qubit anharmonicities $\alpha_a/2\pi=-300.0$ MHz and $\alpha_b/2\pi=-250.0$ MHz are kept fixed, as well as the qubit-coupler couplings $g_{ac}/2\pi=g_{bc}/2\pi=50.0$ MHz (and $g_{ab}=0$). Other relevant parameters that change with the operation regime, such as the coupler anharmonicity, are provided in the captions of each respective figure and below.

A general description of FIGS. 4-11 is as follows. The figures show a full vertical line at the 0-1 transition of the lowest-frequency qubit (A mode), i.e. 5.0 GHz, and a dotted vertical line representing the 1-2 (i.e. first leakage) transition of the lowest-frequency qubit (A mode), i.e. 4.7 GHz. Another full vertical line represents the 0-1 transition of the highest-frequency qubit (B mode), i.e. 5.2 GHz or 5.7 GHz as the case may be, and a second dotted vertical line is the 1-2 (first leakage) transition of the highest-frequency qubit (B mode), which varies. A dashed-dotted vertical line in the first panel of each Figure represents a selected (fine-tuned or far off-resonant) coupler frequency (C mode). A dashed vertical line in the second panel of each Figure is a selected drive frequency for reducing ZZ interactions with a drive power of 50 MHz for far off-resonant coupler frequencies that are not fine-tuned to yield zero ZZ without the use of a drive. Another dashed-dotted vertical line, also in the second panel, is a selected drive frequency for enhancing ZZ interactions (i.e. to enable a two-qubit gate).

The star marker in the third panel represents a saturation power for the two-qubit gate.

Figure 4:
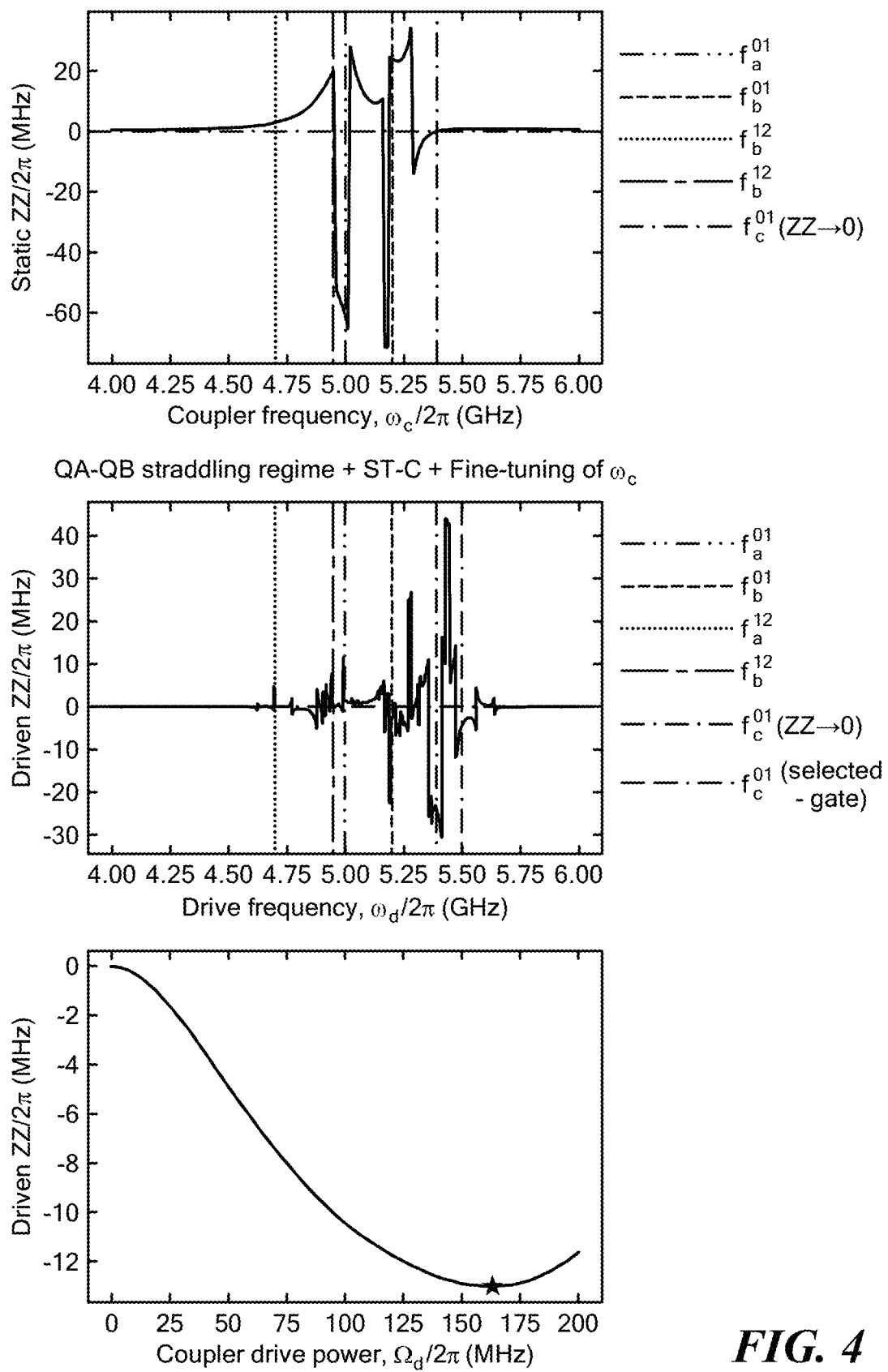
FIG. 4 shows simulated performance of a two-qubit system with parameters: $\omega_q/2\pi=5.324$ GHz, $\alpha_q/2\pi=-350$ MHz, $\omega_d^{gate}/2\pi=5.5$ GHz.
Figure 5:
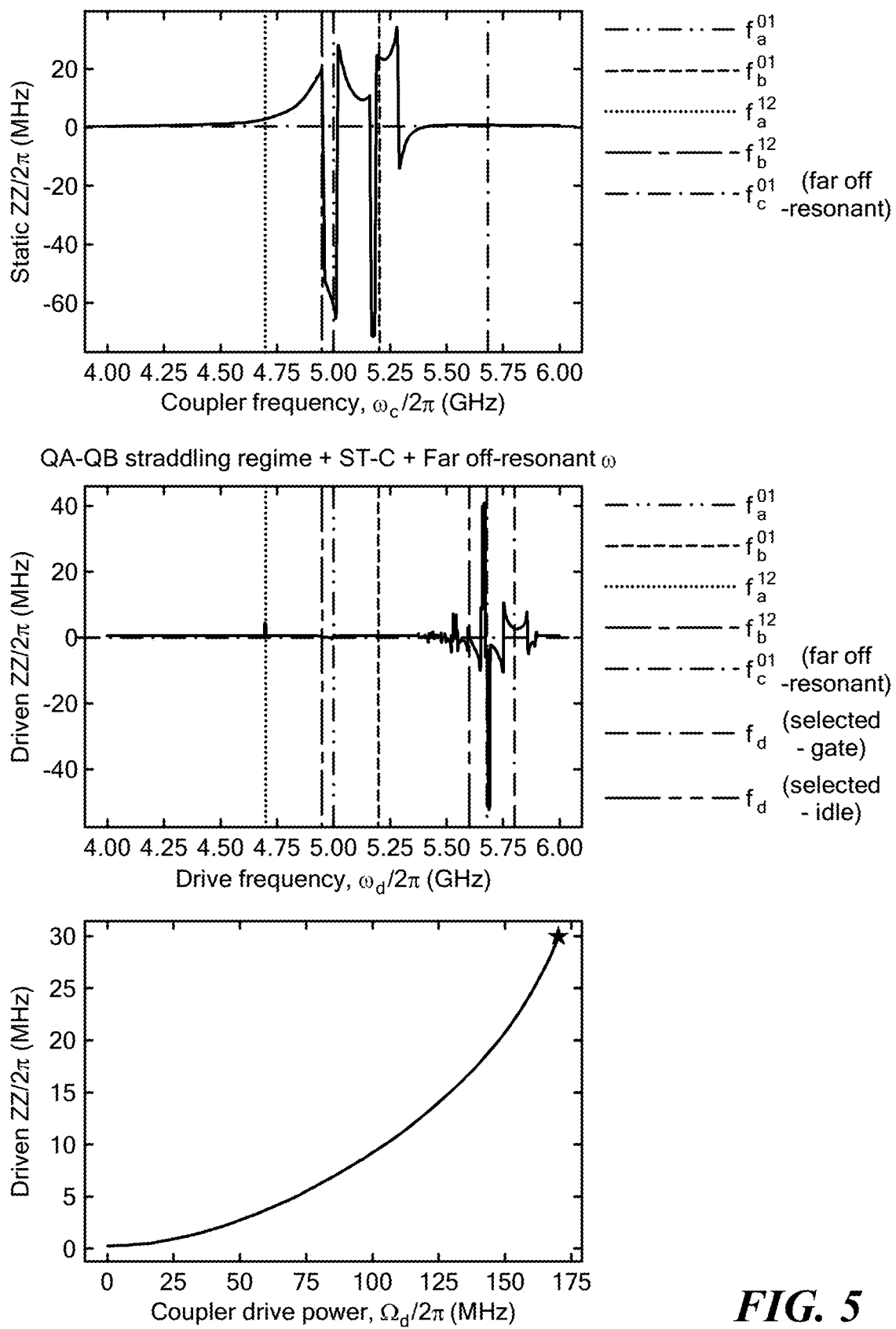
FIG. 5 shows simulated performance of a two-qubit system with parameters: $\omega_q/2\pi=5.68$ GHz, $\alpha_q/2\pi=-350$ MHz,) $\omega_d^{idle}=5.6$ GHz, $\omega_d^{gate}/2\pi=5.8$ GHz.
Figure 6:
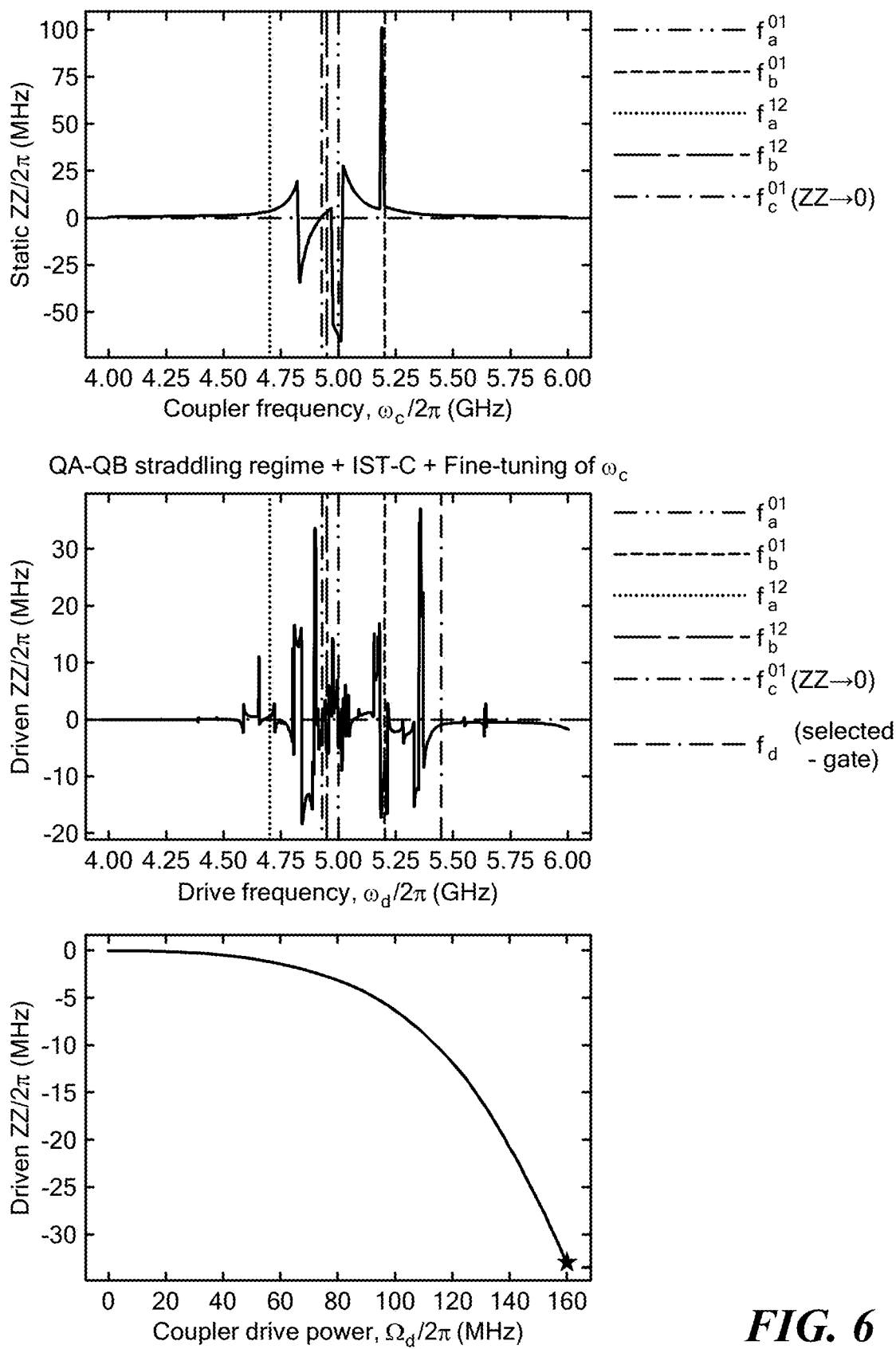
FIG. 6 shows simulated performance of a two-qubit system with parameters: $\omega_q/2\pi=4.93$ GHz, $\alpha_q/2\pi=500$ MHz, $\omega_d^{gate}/2\pi=5.45$ GHz.
Figure 7:
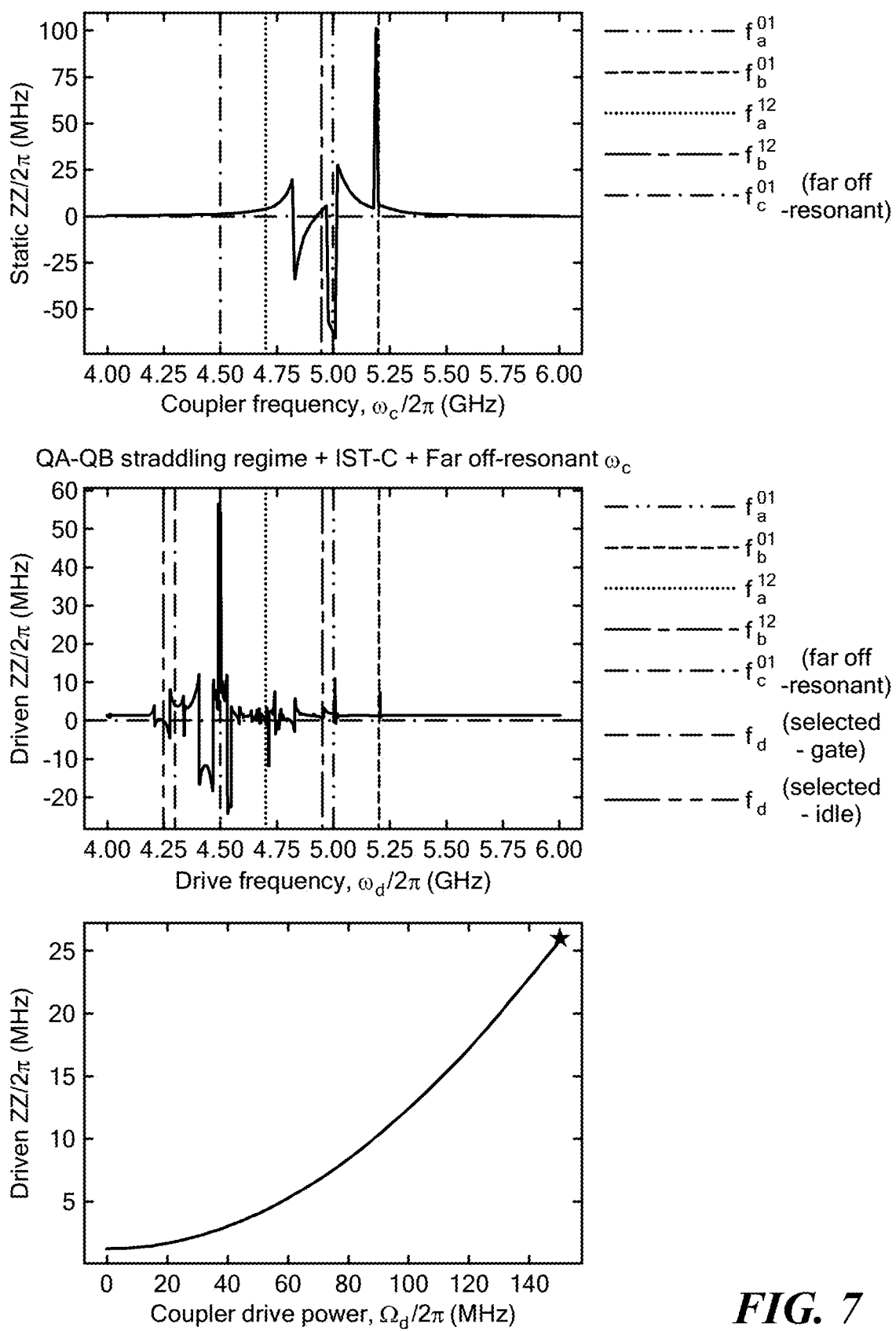
FIG. 7 shows simulated performance of a two-qubit system with parameters: $\omega_q/2\pi=4.5$ GHz, $\alpha_q/2\pi=500$ MHz, $\omega_d^{gate}=4.25$ GHz, $\omega_d^{gate}/2\pi=4.3$ GHz.
Figure 8:
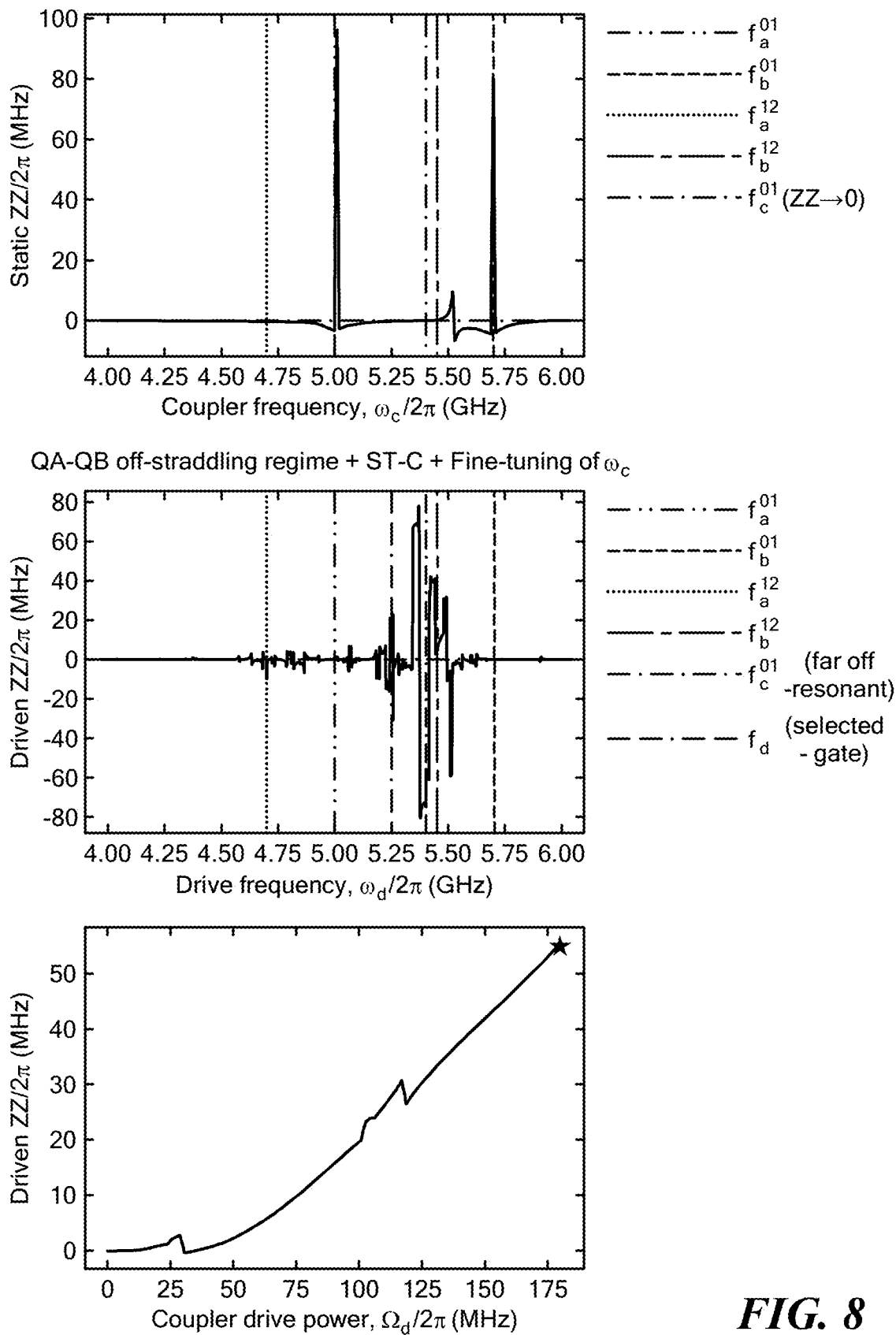
FIG. 8 shows simulated performance of a two-qubit system with parameters: $\omega_q/2\pi=5.4$ GHz, $\alpha_q/2\pi=-350$ MHz, $\omega_d^{gate}/2\pi=5.25$ GHz.
Figure 9:
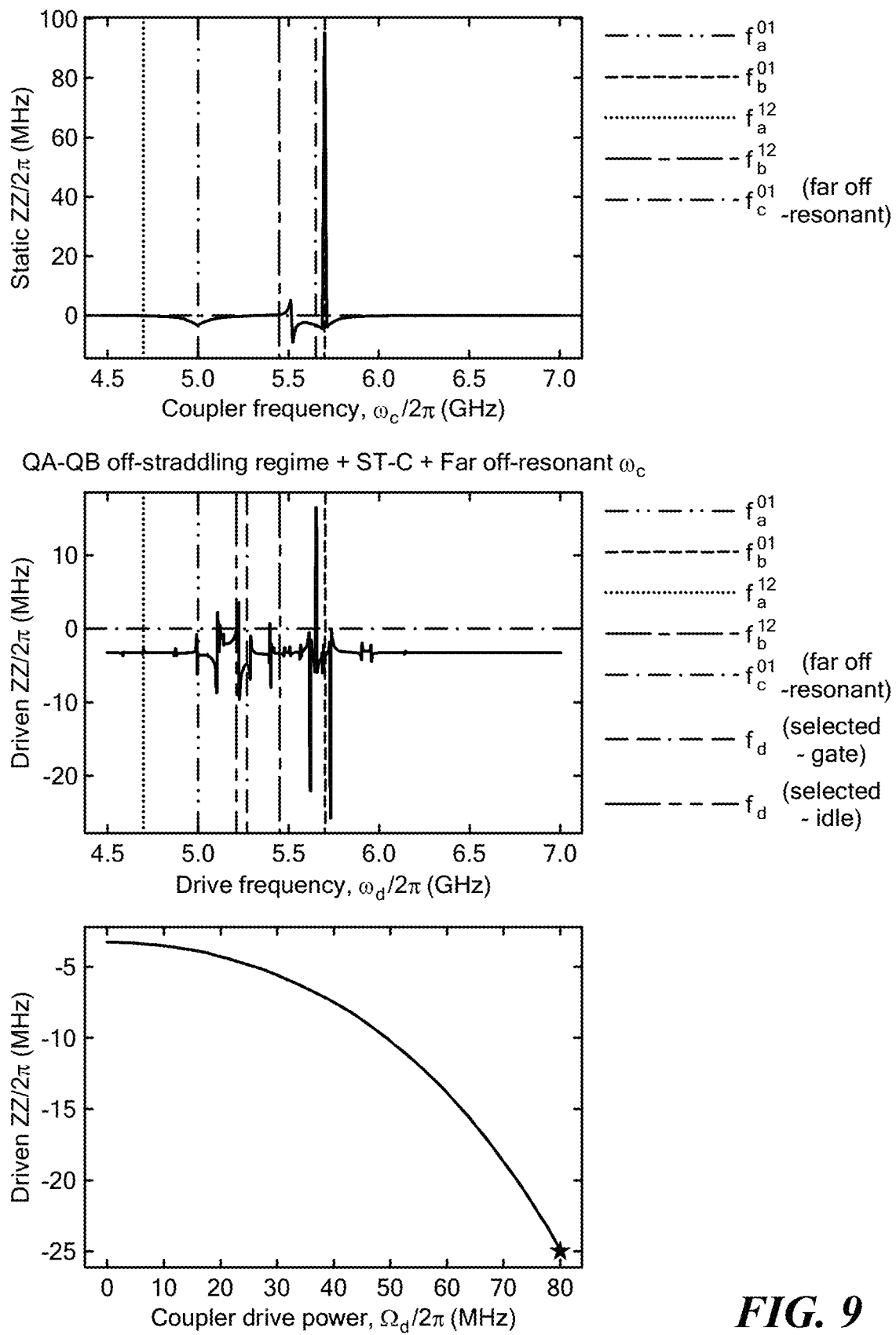
FIG. 9 shows simulated performance of a two-qubit system with parameters: $\omega_q/2\pi=5.65$ GHz, $\alpha_q/2\pi=-350$ MHz, $\omega_d^{idle}=5.21$ GHz, $\omega_d^{gate}/2\pi=5.27$ GHz.
Figure 10:
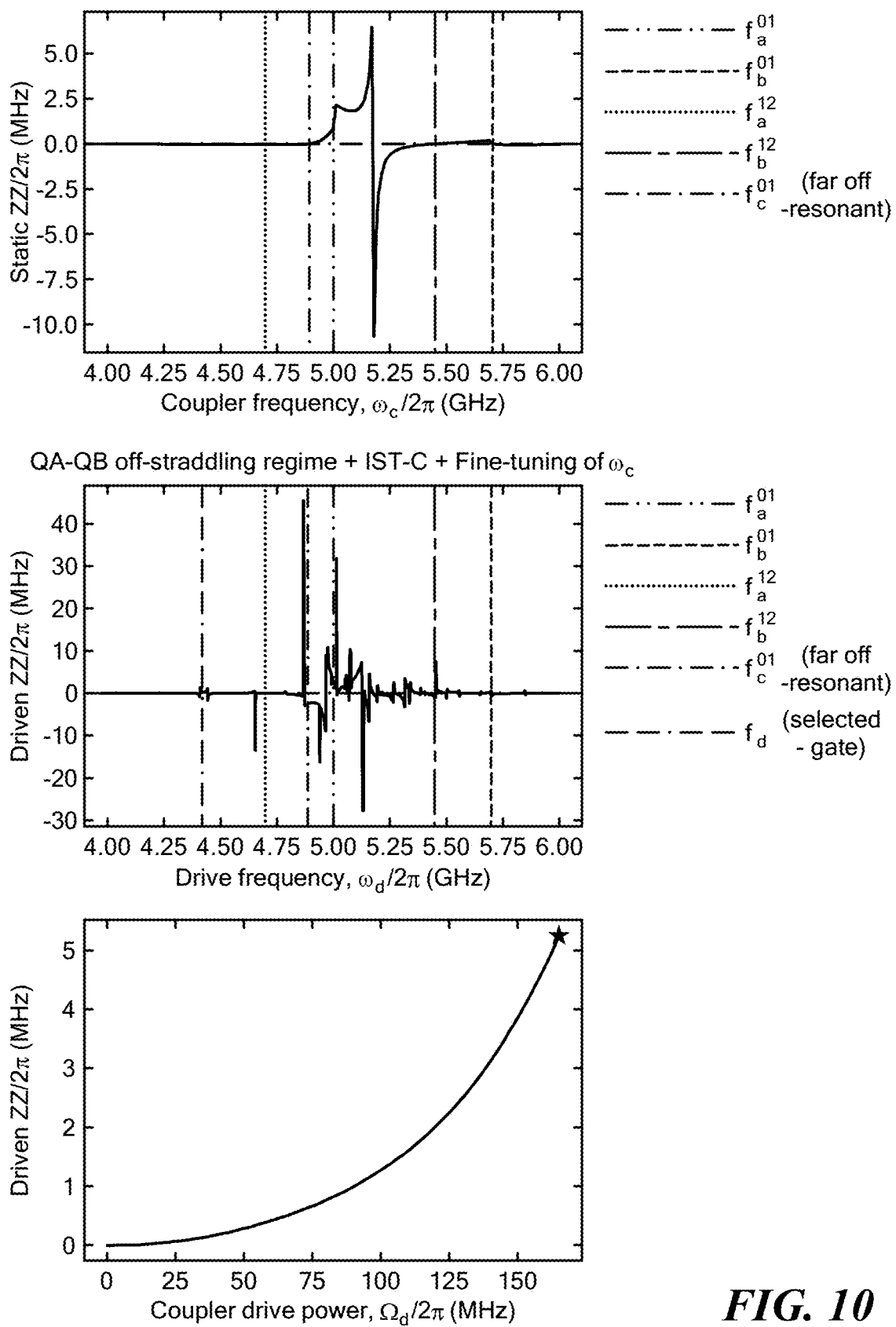
FIG. 10 shows simulated performance of a two-qubit system with parameters: $\omega_q/2\pi=4.89$ GHz, $\alpha_q/2\pi=350$ MHz, $\omega_d^{gate}/2\pi=4.423$ GHz.
Figure 11:
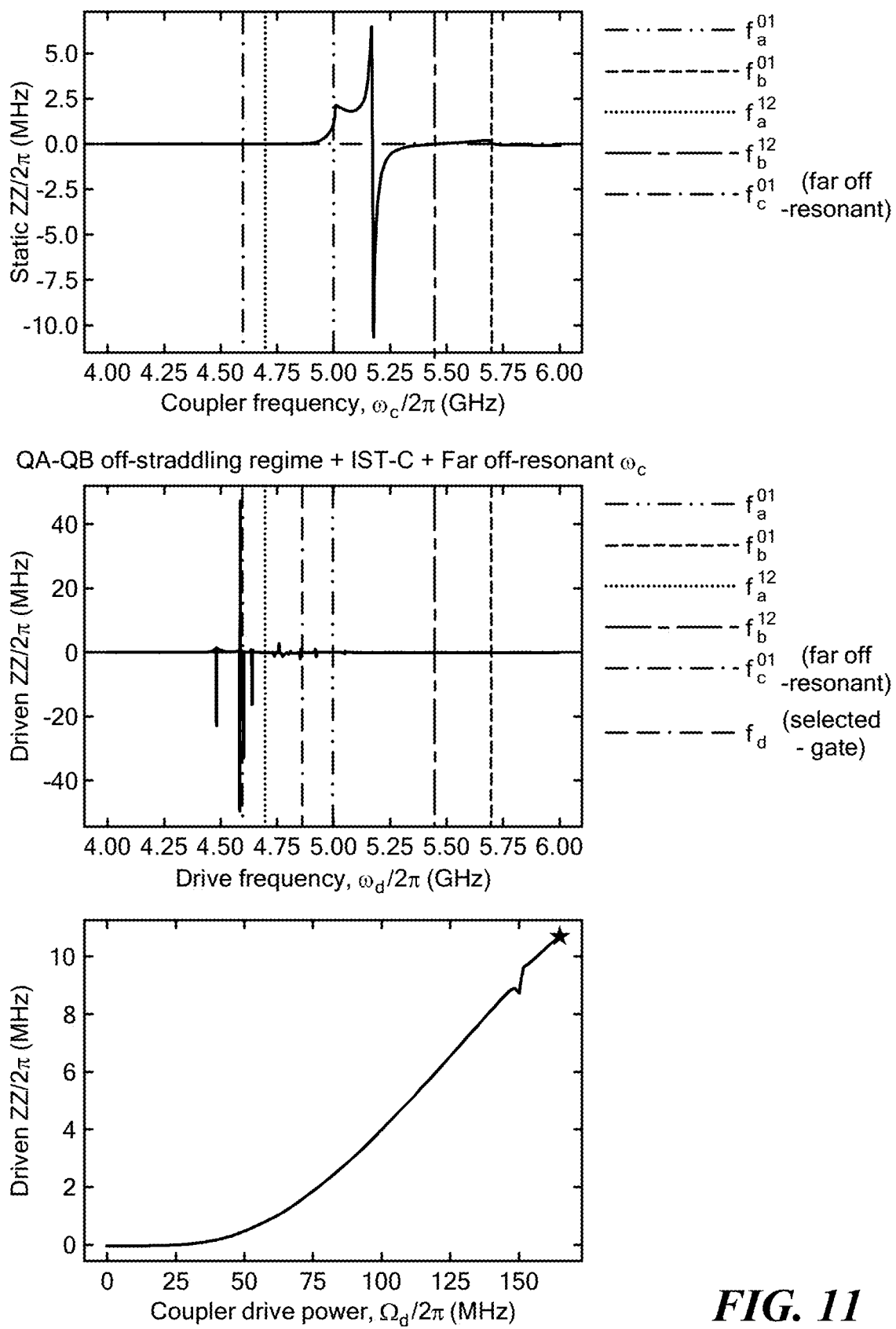
FIG. 11 shows simulated performance of a two-qubit system with parameters: $\omega_q/2\pi=4.6$ GHz, $\alpha_q/2\pi=350$ MHz, $\omega_d^{idle}=4.41$ GHz, $\omega_d^{gate}/2\pi=4.865$ GHz.

With this in mind, FIG. 4 shows simulated performance of a two-qubit system with parameters: $\omega_c/2\pi=5.324$ GHz, $\alpha_c/2\pi=-350$ MHz, $\omega_d^{gate}/2\pi=5.5$ GHz. FIG. 5 shows simulated performance of a two-qubit system with parameters: $\omega_c/2\pi=5.68$ GHz, $\alpha_c/2\pi=-350$ MHz, $\omega_d^{idle}=5.6$ GHz, $\omega_d^{gate}/2\pi=5.8$ GHz. FIG. 6 shows simulated performance of a two-qubit system with parameters: $\omega_c/2\pi=4.93$ GHz, $\alpha_c/2\pi=500$ MHz, $\omega_d^{gate}/2\pi=5.45$ GHz. FIG. 7 shows simulated performance of a two-qubit system with parameters: $\omega_c/2\pi=4.5$ GHz, $\alpha_c/2\pi=500$ MHz, $\omega_d^{idle}=4.25$ GHz, $\omega_d^{gate}/2\pi=4.3$ GHz. FIG. 8 shows simulated performance of a two-qubit system with parameters: $\omega_c/2\pi=5.4$ GHz, $\alpha_c/2\pi=-350$ MHz, $\omega_d^{gate}/2\pi=5.25$ GHz. FIG. 9 shows simulated performance of a two-qubit system with parameters: $\omega_c/2\pi=5.65$ GHz, $\alpha_c/2\pi=-350$ MHz, $\omega_d^{idle}=5.21$ GHz, $\omega_d^{gate}/2\pi=5.27$ GHz. FIG. 10 shows simulated performance of a two-qubit system with parameters: $\omega_c/2\pi=4.89$ GHz, $\alpha_c/2\pi=350$ MHz, $\omega_d^{gate}/2\pi=4.423$ GHz. And FIG. 11 shows simulated performance of a two-qubit system with parameters: $\omega_c/2\pi=4.6$ GHz, $\alpha_c/2\pi=350$ MHz, $\omega_d^{idle}=4.41$ GHz, $\omega_d^{gate}/2\pi=4.865$ GHz.

These plots have the purpose of demonstrating flexibility of the proposed framework for decoupling the qubits and engineering controlled-Z gates. The selected parameters are simply illustrative and aim to cover all design options, but by no means are necessary. Indeed, given the qubit parameters, one may select the coupler frequency, anharmonicity, drive power, and drive frequency to either reduce or enhance the two-qubit ZZ interaction in all cases.

The above discussion relates to embodiments of tunable interactions for implementing two-qubit gates and suppressing spurious couplings via off-resonantly driven coupler modes in a superconducting chip. It is appreciated that these embodiments may be used in conjunction with an extensible circuit-QED architecture via amplitude- and frequency-variable microwaves to form a quantum processor, as now described.

Our scheme can be extended to the multiqubit setting (see FIG. 1C and the description below) with the purpose of i) implementing microwave-activated controlled-Z gates between pair of qubits in a multiqubit device and ii) reducing spurious multiqubit interactions of the form ZZ, ZZZ and higher-order correlators that corrupt the idling state of the qubits and are source of coherent and correlated errors. Denoting by Z_{i, j} the Pauli-Z operator associated with a qubit located in the (i; j) position of a two-dimensional grid and $\iota_{k,l}(0)=|0\rangle\langle0|$ the 0-state projector for a coupler located in the (k;l) position, the Hamiltonian of the device of FIG. 1C takes the form $$H = \sum_{\text{set in powerset}} c_{\text{set}} \left[ \prod_{(i,j) \text{ even in set},(k,l) \text{ odd in set}} Z_{i,j} \sigma(0)_{k,l} \right] + H_d,$$

where $H_d$ denotes a drive Hamiltonian that could be used to implement the microwave drives needed to reduced or enhance ZZ-type interactions or perform gates. Here, we assume that the qubits are located in sites labeled by even index in a grid and that the couplers are located in sites labeled by odd index in the same lattice. However, the Hamiltonian above is general and does not imply a particular device architecture or layout. Furthermore, $C_{set}$ is a coefficient that weights a particular Pauli product of the Hamiltonian that can be tuned by means of the microwave drives.

Next, we investigate a transmon-qubit-based architecture that combines the advantages of fixed-frequency qubits with microwave-driven tunable couplers. The parameters of the coupler mode and its potentially always-on microwave drive are chosen to reduce, minimize, or cancel the ZZ interaction while the qubits idle. To perform two-qubit gates, the amplitude and frequency of the coupler drive are modulated to enhance the desired two-qubit ZZ interaction for a predetermined amount of time, leading to the accumulation of a conditional phase. The drive parameters are changed in time according to a pulse schedule that minimizes leakage by leveraging knowledge of the driven system Hamiltonian.

While microwave-activated interactions are typically weaker than those implemented by direct two-qubit coupling, disclosed two-qubit gates are fast (50-120 ns) and have predicted average gate fidelities greater than 99.9%, including dissipation. Moreover, because the microwave-activated ZZ interaction is largely tunable over a broad frequency range, it can be used to alleviate frequency crowding and counteract the impact of circuit-element disorder.

To address the problem at hand with generality, we present a comprehensive treatment of driven interactions in circuit QED using two complementary methods for the perturbative and the nonperturbative regimes of the drive amplitude and coupling strengths. Furthermore, we describe the two-qubit gate operation developing a version of Floquet theory where the 'slow' time-dynamics of the drive amplitude and frequency can be analyzed independently of the 'fast' time-dynamics of the drive phase.

The remainder of the disclosure is organized as follows. We first introduce the two-qubit architecture and study the ZZ interaction rate using a diagrammatic method, also developed in this work. We compare the results from perturbation theory obtained for a simplified model of the circuit Hamiltonian against numerical results based on Floquet theory, demonstrating an excellent quantitative agreement between these two techniques and validating our diagrammatic approach. Next, and inspired by previous works, we develop a version of Floquet theory for the time-evolution operator valid for sufficiently slow changes of the drive parameters with respect to the drive frequency. Equipped with this framework, we introduce a pulse-shaping strategy that incorporates knowledge of the Floquet quasi-energy spectrum to prevent nonadiabatic transitions between Floquet states that can cause leakage.

Then, we use Floquet theory to describe the working principles of a number of controlled-phase gates based on drive-amplitude and/or drive-frequency modulation. We take advantage of our pulse-shaping strategy to derive a convenient parametrization for the two-qubit gate pulses, and perform time-domain simulations with and without dissipation. We moreover define average-gate-fidelity and leakage metrics in presence of always-on microwave drives, and compute these quantities for our different two-qubit gate implementations. We show that the average gate fidelity for controlled-phase rotations based on drive-amplitude and/or frequency modulation can exceed 99.9% for realistic circuit parameters. Finally, we analyze the extensibility of our architecture to multi-qubit devices, treating the frequency allocation problem with the help of perturbation theory, and discussing multi-qubit control.

Two-Qubit-Coupler Architecture

In this section, we introduce the circuit-QED architecture and describe two techniques to compute both spurious and gate interaction rates. The first method relies on a perturbative expansion and is useful to understand the low-power behavior of the ZZ coupling. The second method uses Floquet theory and is nonperturbative. We compare our perturbation-theory estimations against the exact numerical result provided by Floquet theory, finding an excellent agreement. Next, we use perturbation theory to understand the dominant processes that explain the ZZ interaction in the presence of a drive.

FIG. 12 shows a schematic where two qubits (a and b) and a coupler (c) are coupled by generic two-body interactions. The qubit modes are driven via independent voltage sources used for single-qubit operations. The coupler mode is driven by an additional voltage source to enhance and/or suppress the ZZ interaction between the qubits. Each circuit mode is represented by a Kerr-nonlinear oscillator (KNO) of frequency $\omega_\mu$ and anharmonicity $\alpha_\mu$, with $\mu$=a, b for the qubits and $\mu$=c for the coupler. $J_{\mu\nu}$ represents the coupling between modes $\mu$ and $\nu$. The coupler mode is driven by a microwave voltage source (red) of amplitude $\Omega$ and frequency $\omega$. The qubits are individually driven by independent voltage sources to perform single-qubit operations.

We focus on two-qubit gates enabled by the coupler drive rather than on drive-activated ZZ cancellation. Although we develop the two-qubit gate theory with generality concerning the circuit Hamiltonian, our numerical simulations consider an implementation where the qubit modes are fixed-frequency transmons, the coupler is a tunable transmon, and the two-mode couplings are implemented by capacitors. In absence of drives, the circuit Hamiltonian takes the form $$\hat{H}_s = \sum_\mu 4E_{C_\mu} \hat{n}_\mu^2 - E_{J_\mu} \cos\hat{\phi}_\mu + \sum_{\mu,\nu} \hbar g_{\mu\nu} \hat{n}_\mu \hat{n}_\nu, \quad (1)$$

where the first (second) sum runs over all (pairs of) circuit modes. $E_{C_\mu}$ and $E_{j_\mu 0}$ the single-electron charging energies and Josephson energies, respectively, of the circuit mode labelled by $\mu$, and $g_{\mu\nu}$ is the effective capacitive coupling between modes ($\mu$, $\nu$). Charge offsets on the circuit islands are neglected in the transmon limit. Since the coupler mode is a tunable transmon, $E_{j_c} \to E_{j_c}(\Phi_{ext})$, where $\Phi_{ext}$ is the external flux threading the coupler's SQUID loop. The microwave drive applied to the coupler is described by the Hamiltonian $$\hat{H}_{drive}(t) = 2eV_c(t)\sin[\omega(t)t + \theta_0](\hat{n}_c + \beta_a \hat{n}_a + \beta_b \hat{n}_b), \quad (2)$$

where $V_c(t)$ and $\omega(t)$ are the drive-voltage amplitude and frequency, $\theta_0$ is a reference phase, and $\beta_{a,b}$ parametrize crosstalk. We set $\theta_0=0$ and $\beta_a=\beta_b=0$. It will become clear below that this simplification does not affect the generality of our results.

Given qubit and coupling parameters, we choose the coupler mode frequency such as to minimize the ZZ interaction between the qubits. In cases where static ZZ cancellation is not possible, we consider applying an off-resonant coupler drive to counteract the spurious ZZ coupling. Similarly, two-qubit gates are implemented by ir-radiating the coupler mode with a microwave drive of large amplitude, resulting in a nonzero ZZ interaction.

We consider two possible pulse schedules for the two-qubit gate. The first one relies on amplitude modulation of a fixed-frequency drive, and is illustrated in FIG. 13 which shows ZZ interaction as a function of drive amplitude at fixed frequency □*. A controlled-phase gate is performed by modulating the drive amplitude. The second leverages the dispersion of the driven ZZ interaction against drive frequency, for fixed drive amplitude and is illustrated in FIG. 14 which shows ZZ interaction as a function of drive frequency for fixed drive amplitude $\Omega^*$. A multi-photon resonance close to the operating point leads to a discontinuity of the ZZ coupling strength as a function of drive frequency. A controlled-phase gate is performed by modulating the drive frequency.

Below, we show how these seemingly distinct pulse schedules can be treated using a common formalism where the drive amplitude and frequency appear on equal footing. We also engineer the two-qubit gate controls in a way that can in principle tolerate multiple always-on drives, and thus be amenable to driven architectures.

Before describing the two-qubit gates, however, we study the strength of microwave-activated interactions for constant drive parameters. We use perturbation theory to understand the effects of the microwave drive at low power. To this end, we move to a frame rotating at the drive frequency where the problem becomes time-independent under a rotating-wave approximation. Introducing the bosonic annihilation operators $\hat{a}$, $\hat{b}$, and $\hat{c}$ for the circuit modes a, b, and c, respectively, the system Hamiltonian is approximated as $$\frac{\hat{H}}{\hbar} = \sum_\mu \Delta_\mu \hat{\mu}^\dagger \hat{\mu} + \frac{\alpha_\mu}{2} \hat{\mu}^{\dagger 2} \hat{\mu}^2 + \sum_{\mu,\nu} J_{\mu\nu}(\hat{\mu}\hat{\nu}^\dagger + \hat{\mu}^\dagger\hat{\nu}) + \frac{\Omega}{2}(\hat{c} + \hat{c}^\dagger), \quad (3)$$

where $\hat{\mu},\hat{\nu} \in \{\hat{a}, \hat{b}, \hat{c}\}$, and the first (second) sum runs over all (pair of) modes. In this model, $\Delta\mu=\omega\mu-\omega$ is the detuning between the mode frequency $\omega_\mu$ and the drive frequency, $\alpha_\mu$ is the mode anharmonicity, $J_{\mu\nu}$ is the effective two-mode coupling rate, and $\Omega$ is the effective coupler-drive amplitude. We refer to Eq. (3) as the Kerr-nonlinear-oscillator (KNO) model. We write Eq. (3) as $\hat{H}=\hat{H}^0+\eta\hat{V}$, where $\hat{H}^0$ is the noninteracting part and $\eta\hat{V}$ groups the two-mode interactions and the drive Hamiltonian. We denote the eigen-states (eigenvalues) of $\hat{H}^0$ by $|\phi^0_\alpha\rangle$ ($\epsilon^0_\alpha$). In Appendix A, we introduce a resummation technique to approximate the self-energies $$\Sigma_\alpha = \sum_{k=1} \sum_{\alpha_1,...,\alpha_k} \langle \Phi^0_\alpha|\eta\hat{V}|\Phi^0_{\alpha_1}\rangle \frac{\langle \Phi^0_{\alpha_1}|\eta\hat{V}|\Phi^0_{\alpha_2}\rangle}{\epsilon_\alpha(\Sigma_\alpha)-\epsilon^0_{\alpha_1}} \cdots \frac{\langle \Phi^0_{\alpha_k}|\eta\hat{V}|\Phi^0_\alpha\rangle}{\epsilon_\alpha(\Sigma_\alpha)-\epsilon^0_{\alpha_k}}, \quad (4)$$

where $\epsilon_\alpha(\Sigma_\alpha)=\epsilon^0_\alpha+\Sigma_\alpha$, and $\epsilon_\alpha$ is an eigenvalue of $\hat{H}$ in the presence of drives and interactions. We refer to our method as SCPT, for "Self-Consistent Perturbation Theory". The resulting semi-analytical expressions for the ZZ coupling are useful to understand the origin of the drive-activated interactions.

The implicit nature of Eq. (4) prevents divergences due to degeneracies of $\hat{H}^0$ and makes the perturbative expansion well-defined even in the case of exact resonance conditions, where finite-order perturbation-theory estimations based on unitary generators can diverge. As an example, let us consider the subspace spanned by the two bare states $\{|\phi^0_\alpha\rangle, |\phi^0_\beta\rangle\}$ that we assume are then coupled by a nearly resonant drive. Recasting Eq. (4) as a geometric series, we find $$\Sigma_{\alpha,\beta} = \pm \frac{\epsilon^0_\beta - \epsilon^0_\alpha}{2}\left(1 - \sqrt{1 + \frac{4|\langle \Phi^0_\beta|\eta\hat{V}|\Phi^0_\alpha\rangle|^2}{(\epsilon^0_\beta-\epsilon^0_\alpha)^2}}\right), \quad (5)$$

which does not diverge for $\epsilon^0_\beta-\epsilon^0_\alpha \to 0$. Such a regularization is critical to predict the ZZ interaction near multi-photon resonances of the form $|\epsilon^0_\alpha - \epsilon^0_\beta| \approx m\omega$ with m an integer, which enable high-fidelity gates as we show below. Note that the coupling between the two bare states $\{|\phi^0_\alpha\rangle, |\phi^0_\beta\rangle\}$ is simply $|\Sigma_\beta-\Sigma_\alpha|$, and represents the size of their anticrossing for $\Omega \neq 0$.

We now describe essential ingredients of Floquet theory that are needed to compare the perturbation-theory result against Floquet numerics. For constant drive frequency, the Hamiltonian $\hat{H}_s+\hat{H}_{drive}(t)$ is invariant under discrete time translations of the form $t \to t+T$, where $T=2\pi/\omega$ is the period of the drive. According to the Floquet theorem, there exist linearly independent solutions to the Schrödinger equation of the form $\psi_\alpha(\phi, t)=\exp(-i\varepsilon_\alpha t)u_\alpha(\phi, t)$. Here, $\hbar\varepsilon_\alpha$ and $u_\alpha(\phi, t)$ are the quasienergy and Floquet mode associated with the Floquet state $\psi_\alpha(\phi, t)$, respectively. The Floquet modes are time-periodic and form a complete basis at any time t. An initial condition $|\psi(0)\rangle=\Sigma_\alpha c_\alpha|u_\alpha(0)\rangle$ can be expanded in this basis with $C_\alpha = \langle\psi(0)|u_\alpha(0)\rangle$, and propagated as $$|\psi(t)\rangle = \sum_\alpha c_\alpha \exp(-i\varepsilon_\alpha t)|u_\alpha(t)\rangle. \quad (6)$$

For a single superconducting qubit, the Floquet modes are more commonly referred to as dressed eigenstates of the qubit and the driving field. Because the populations of the Floquet modes remain constant in time during driven time-evolution, the Floquet modes are analogous to Hamiltonian eigenstates in the time-independent case. This observation enables us to quantify the ZZ interaction (or cross-Kerr)

between two qubits in the presence of a drive. By introducing the time-dependent computational basis $\{|u_{\alpha_{ij}}(t)\rangle\}$, where $\alpha_{ij}$ indexes the Floquet mode adiabatically connected to the system eigenstate $|\Phi_{ij}\rangle\rangle$ (which includes qubit-qubit coupling, qubit-coupler couplings, and assumes the coupler is in its ground state), the ZZ interaction rate reads $$\xi = \varepsilon_{11} + \varepsilon_{00} - \varepsilon_{10} - \varepsilon_{01}. \quad (7)$$

Note that the assumption of a one-to-one mapping between the static and driven computational bases is implicit in this definition. This is not justified, however, when the drive frequency is resonant with an energy transition of $\hat{H}_s$, and will be revisited below. In the remainder of this section, we compute the ZZ interaction for the KNO model using perturbation theory, and benchmark the result against Floquet numerics.

TABLE I

Mode and coupling parameters within the Kerr-nonlinear oscillator model. All values are provided in GHz. $\omega_c^*$ denotes the coupler frequency for which the static ZZ interaction cancels out.

| $\frac{\omega_a}{2\pi}$ | $\frac{\omega_b}{2\pi}$ | $\frac{\omega_c^*}{2\pi}$ | $\frac{\alpha_a}{2\pi}$ | $\frac{\alpha_b}{2\pi}$ | $\frac{\alpha_c}{2\pi}$ | $\frac{J_{ac}}{2\pi}$ | $\frac{J_{bc}}{2\pi}$ | $\frac{J_{ab}}{2\pi}$ |
|---|---|---|---|---|---|---|---|---|
| 5.1 | 5.6 | 5.464 | −0.26 | −0.28 | −0.34 | 0.095 | 0.105 | 0.010 |

We consider the example parameter set in Table I above for the model in Eq. (3). The detuning between the qubits is 500 MHz (outside of the straddling regime) and the qubit-coupler coupling strength is 100 MHz on average, with a variation of the order of 10%. We also assume a direct two-qubit coupling of 10 MHz, representing a spurious interaction.

Figure 15A:
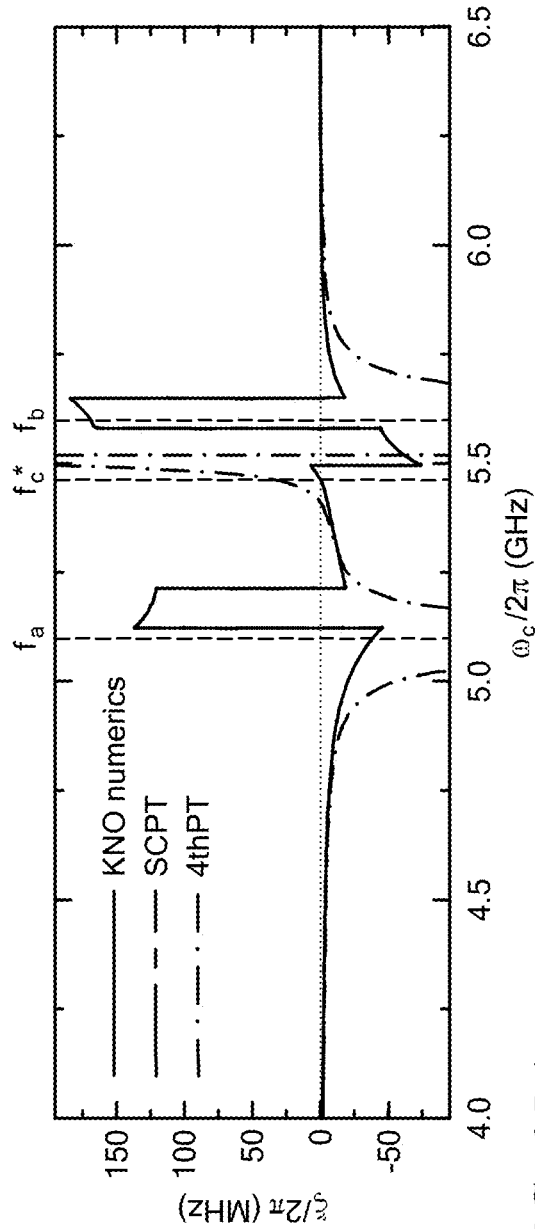
FIG. 15a shows a comparison between KNO numerics, our perturbation theory (SCPT), and fourth-order perturbation theory (4thPT)

FIG. 15a shows the static ZZ interaction as a function of coupler drive frequency $\Box/2\pi$ for $\Omega/2\pi=100$ MHz. The coupler frequency is $\omega_c^*$ in Table I, for which the static ZZ interaction is zero. We show the comparison between KNO Floquet numerics and SCPT.

Because of the excitation-number-conserving symmetry of the KNO Hamiltonian, the SCPT estimation (SCPT) is numerically exact and agrees with the numerical result (KNO numerics) up to numerical accuracy. To highlight this fact, we contrast the SCPT result against standard fourth-order perturbation theory (4thPT), which fails when the qubit-coupler detuning is small with respect to the coupling strengths. These numerical results demonstrate that the KNO model is an excellent approximation to the full system Hamiltonian, and justifies our simplified perturbative approach, which is remarkably accurate in the KNO limit.

Figure 15B:
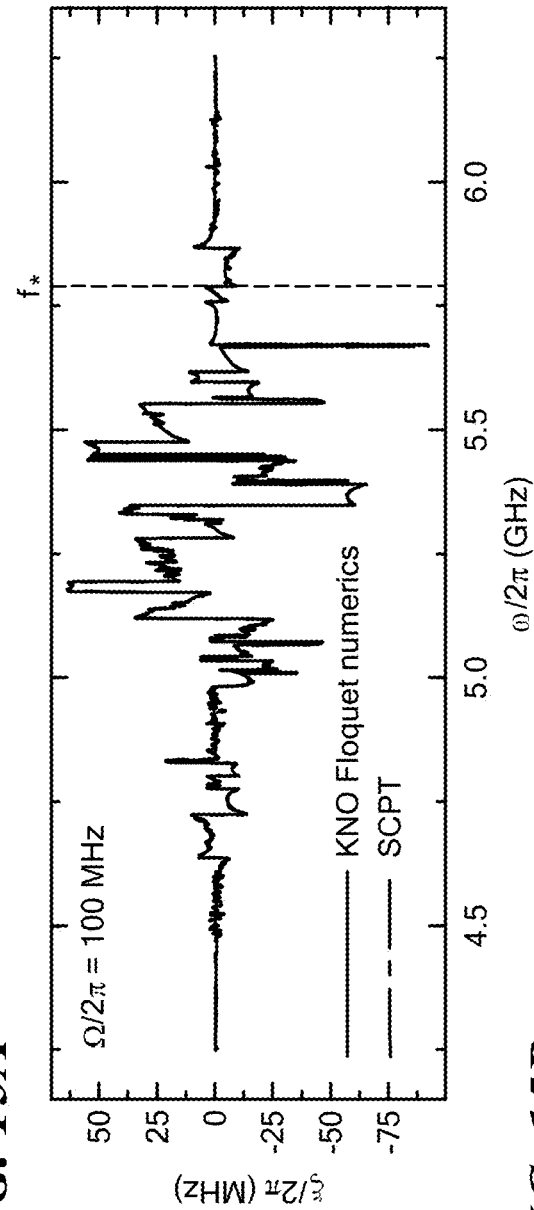
FIG. 15b shows the static ZZ interaction as a function of coupler frequency in an illustrative embodiment.

Next, with the coupler frequency set to $f_c^*$ from FIG. 15a, for which the static ZZ interaction is zero, FIG. 15b shows the ZZ interaction predicted for the KNO model as a function of drive frequency $\omega$, for $\Omega/2\pi=100$ MHz. We compare SCPT against Floquet numerics, observing an excellent agreement between these two methods. Indeed, perturbation theory not only estimates the ZZ interaction quantitatively, but also correctly captures the frequencies at which the ZZ coupling appears discontinuous due to multi-photon transitions. Note that the driven ZZ interaction can be nonzero in a large frequency bandwidth for strong drives and coupling strengths. This widely tunable ZZ coupling is the basis for our two-qubit gates. While the ZZ coupling is renormalized by the full transmon potential and the presence of counter-rotating terms in the full-circuit model, these simulations show that the KNO model is still a good approximation to understand the ZZ interaction in the presence of a drive.

Figure 15C:
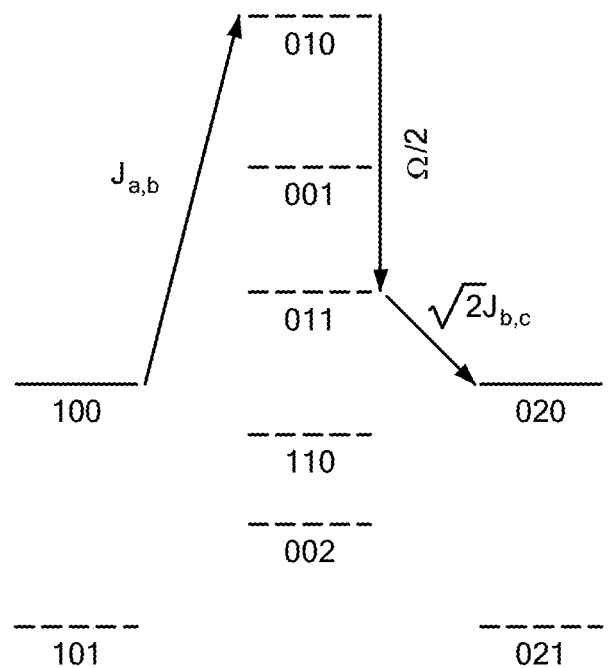
FIG. 15c shows an energy level diagram of a third-order process in which the drive frequency is indicated as $f_*$ in FIG. 15b.

Given the good agreement between our perturbative approach (SCPT) and the numerical results, we use SCPT to gain insights into the origin of the drive-activated ZZ interaction. We reduce the problem to an effective two-state subspace close to a multi-photon resonance, where Eq. (5) provides an approximation for the interaction rate. As an example, we consider the drive frequency f. ≈5.8 GHz in FIG. 15b, for which the eigenstates $|\Phi_{100}\rangle$ and $|\Phi_{020}\rangle$ of Eq. (3) are nearly resonant, and derive an effective coupling strength, J, using Eq. (4). For simplicity, we consider processes which connect $|\Phi_{100}\rangle$ and $|\Phi_{020}\rangle$ up to fourth order, and which involve states in a 1 GHz bandwidth centered around $\in_{100}{}^0/h$. FIGS. 15c and d show two (of eight) processes that contribute at third-and fourth-order to the effective coupling, respectively. We have shown that the self-energy of the state $|\Phi_{100}\rangle$ can be approximated to eighth order in couplings and drive amplitude as $$\Sigma_{100}^{(8)} \approx \frac{\Delta}{2}\left(1 - \sqrt{1 + \left|\frac{2J^{(4)}}{\Delta}\right|^2}\right), \quad (8)$$

where $\Delta = \in_{100}{}^0 - \in_{020}{}^0 - \Lambda_{020}{}^{(2)}$ and $\Lambda_{020}{}^{(2)}$ is a second-order energy shift of $|\Phi_{020}\rangle$ due to the drive. In this approximation, the driven ZZ rate can be estimated as $-\Sigma_{100}{}^{(8)}$, revealing, for instance, the scaling of this interaction with the different systems parameters.

Parametric Microwave Control

Equipped with theoretical tools for understanding interactions during driven time-evolution, we now turn to the problem of engineering a controlled-phase gate using the driven ZZ interaction. To make our description general and valid for any drive amplitude, we approach this problem using Floquet theory.

Figure 16A:
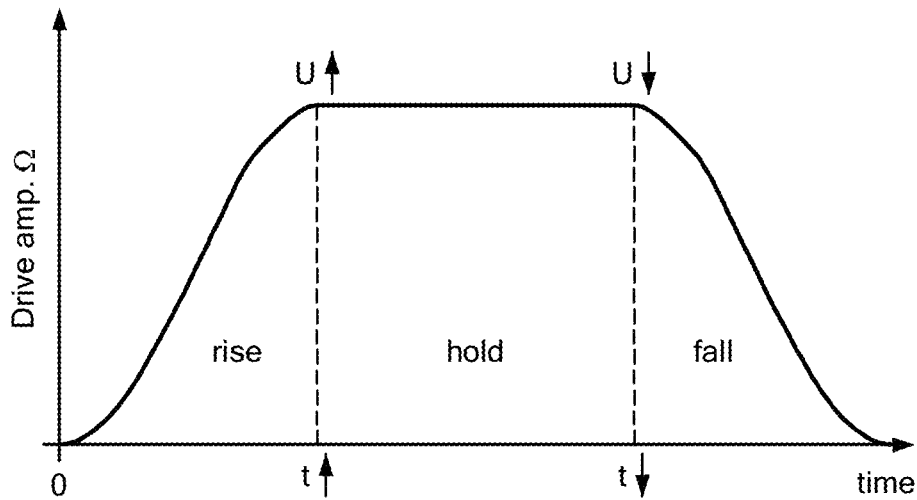
FIG. 16a shows a pulse envelope for microwave two-qubit gates, comprised of the three sections: 'rise', 'hold' and 'fall'.

We begin by deconstructing a pulse into three sections: rise, hold, and fall, as shown in FIG. 16a. In this figure, $U_\uparrow$ and $U_\downarrow$ correspond to the unitary operations implemented by the rise and fall sections, respectively. First, during the rise section, the system transitions to a driven state by increasing the drive amplitude to a maximum value at time $t_\uparrow$. The unitary $U_\uparrow = \Sigma_{ij} e^{-i\zeta_{ij}} |u_{\alpha_{ij}}(t_\downarrow)\rangle\langle\Phi_{ij}| \equiv \mathcal{U}(0, t_\uparrow)$, where $\zeta_{ij}(t_\uparrow)$ is a system-state-dependent phase, describes the time-evolution during the rise section up to time $t_\uparrow$. Second, for the hold section, the drive remains 'on' for a duration $t_\downarrow - t_\uparrow$. Time-evolution under the driven Hamiltonian—in conjunction with small (but non-negligible) contributions from the rise and fall sections of the pulse—implements the desired gate operation. Finally, during the fall section of the pulse, the drive amplitude is returned to zero, ideally transitioning the system back to the undriven computational space and completing the gate. The unitary $U_\downarrow = \Sigma_{ij} e^{i\zeta'_{ij}}|\Phi_{ij}\rangle\langle u_{\alpha_{ij}}(t_\downarrow)| \equiv \mathcal{U}(t_\downarrow, t_\uparrow + t_\downarrow)$ describes this final step, where $\zeta'_{ij}$ is again a system-state-dependent phase.

The above deconstruction includes the Floquet modes $\{|u_{\alpha_{ij}}(t)\rangle\}$, which rapidly oscillate at the fundamental and integer multiples of the drive frequency. Tools for quantum optimal control can certainly be used to engineer fast pulses that feature stabilized Floquet modes and have high-fidelity. However, solutions to this control problem are not guaranteed to be well-behaved, due to the time-dependent nature of the Floquet modes during the rise and fall sections of the pulse envelope ($U_{\uparrow,\downarrow}$). For instance, due to the rapid oscillations, a slight timing error $\delta t$, such that $t_\uparrow \to t_\uparrow + \delta t$, would in general imply a substantial change in the target unitary $U\uparrow$, rendering the original control solution ineffective. Furthermore, even for a symmetric rise and fall of the pulse envelope (see FIG. 16a), due to the time-dependence of the Floquet modes, $U\uparrow$ and $U_\downarrow$ are not conjugate operations, as one might expect. Rather, $U_\downarrow = U_\uparrow^\dagger$ only for times $t_\downarrow - t_\uparrow$ that are commensurate with the period of the drive. These facts become increasingly important for the high drive powers needed for fast two-qubit gates and in the presence of multiple drives (see below).

Central to our control strategy is the concept of adiabaticity in a rotating frame. Adiabatic time-evolution mitigates the issues associated with the fast-oscillating Floquet modes described in the previous section, and it does so in a way that requires less fine-tuning of the pulse envelope. The price to pay for this benefit is a potentially longer gate time. Nonetheless, as we shall show, this "slow-down" can be largely overcome by designing fast 'quasiadiabatic' waveforms.

We develop an approach that boosts the system Hamiltonian to an expanded Hilbert space (see FIG. 16b), enabling us to separate fast and slow time dynamics, and thereby define a quasiadiabatic pulse envelope.

Although inspired by the t-t' method, our approach provides an explicit expression for the propagator. This expression enables us to understand the dynamics at all times during the pulse, and it forms the foundation for a practical framework that is used to describe and engineer all-microwave two-qubit gates.

We begin by rewriting the Hamiltonian in the form $$\hat{H}(\hat{\phi}, \hat{n}, t) = \hat{H}_s(\hat{\phi}, \hat{n}) + \hat{H}_{drive}[\hat{\phi}, \hat{n}, \Omega(t), \theta(t)], \quad (9)$$

where $\hat{H}_{drive}[\hat{\phi}, \hat{n}, \Omega(t), \theta(t)]$ is the drive Hamiltonian that depends on the drive amplitude $\Omega(t)$—the slow dynamics—and the drive phase $\theta(t)$—the fast dynamics. The fast dynamical variable $\theta(t)$ in Eq. (9) is conveniently treated by expanding the original Hilbert space to a larger, fictitious one, the "expanded Hilbert space".

We boost the Hamiltonian $\hat{H}(t)$ to its expanded-space counterpart $\hat{H}_{eff}(t)$ by promoting $\theta(t)$ to a $2\pi$-periodic quantum degree of freedom $\hat{\vartheta}$, with conjugate momenta $\hat{m} = -i\hat{\partial}_\vartheta$. Accordingly, we promote the initial condition $|\psi(0)\rangle$ to its expanded-space representation, $|\Psi(0)\rangle$, using the operation $$|\Psi(0)\rangle = \frac{1}{2\pi}\int d\vartheta |\vartheta\rangle \otimes |\psi(0)\rangle, \quad (10)$$

where $\hat{\vartheta}|\vartheta\rangle = \vartheta|\vartheta\rangle$ and $\langle\vartheta'|\vartheta\rangle = 2\pi\delta(\vartheta-\vartheta')$ in this representation. This is the expansion step in FIG. 16b.

In the expanded Hilbert space, the system evolves under the effective Hamiltonian $$\hat{H}_{eff}(\hat{\vartheta}, \hat{m}, \hat{\phi}, \hat{n}, t) = \hat{H}(\hat{\phi}, \hat{n}, t) + \hbar\omega_{eff}(t)\hat{m}, \quad (11)$$

where $\omega_{eff}(t) \equiv \dot{\theta}(t) = (d/dt)[\omega(t)t]$. Note that if $\omega$ is time-independent, then $\omega_{eff} = \omega$ is simply the drive frequency. This is not generally true, however, for frequency-modulated drives. The fast time-dynamics of the original Hamiltonian $\hat{H}(t)$, i.e., the drive phase $\theta(t)$, are no longer explicitly present in the expanded Hamiltonian $\hat{H}_{eff}(t)$. Rather, $\hat{H}_{eff}(t)$ only inherits slow time-dynamics via the explicit time-dependence of the drive parameters $\Omega(t)$ and $\omega_{eff}(t)$. Nonetheless, $\hat{H}_{eff}(t)$ implicitly accounts for the fast dynamics through the promoted operator $\hat{\vartheta}$.

Finally, by projecting $|\Psi(\hat{\vartheta}, \hat{\phi}, t)\rangle$ for a specific value of the drive phase $\theta(t_*)$ at time $t_*$, $$|\psi(\hat{\phi}, t_*)\rangle = \langle \theta(t_*)|\Psi(\hat{\vartheta}, \hat{\phi}, t_*)\rangle, \quad (12)$$

we recover the solution $|\psi(\hat{\phi}, t_*)\rangle$ to the Schrödinger equation in the original space associated with Eq. (9). This is the projection step in FIG. 16b.

Figure 16B:
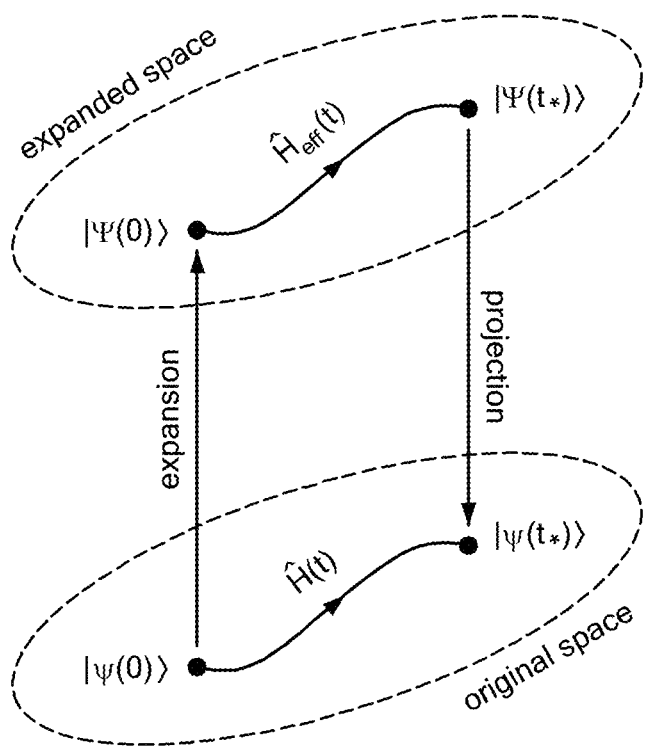
FIG. 16b shows solving the time-dependent Schrödinger equation in an expanded Hilbert space.

Thus, FIG. 16b shows a schematic of our procedure for solving the time-dependent Schrödinger equation using the expanded-Hilbert-space representation, including the expansion and projection operations. Time evolution under Eq. (9) is equivalent to the combination of operations: expansion, time-evolution under Eq. (11), and then projection back to the original space.

Figure 16C:
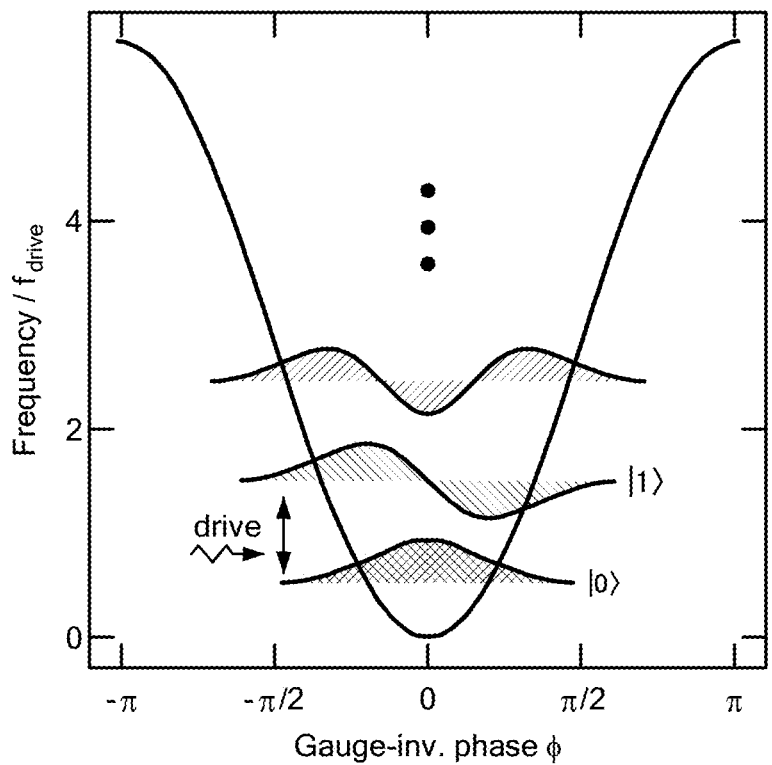
FIG. 16c shows transmon-qubit wavefunctions for a driven transmon qubit as a function of the gauge-invariant phase ϕ.
Figure 16D:
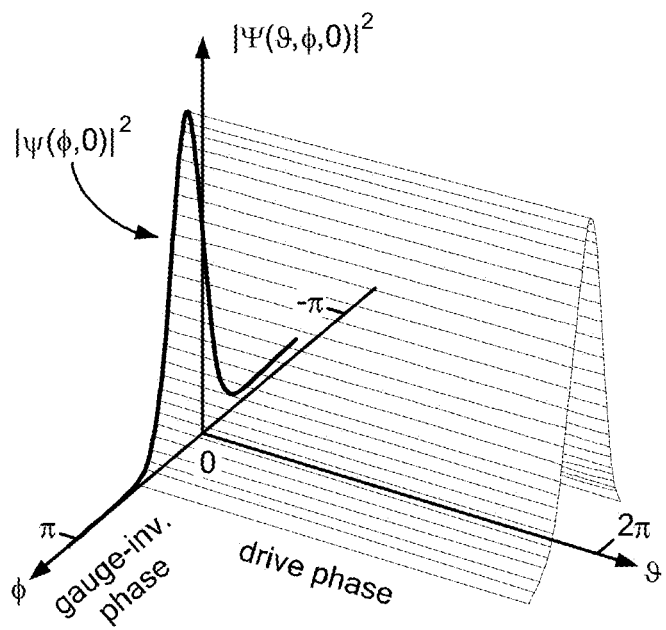
FIG. 16d shows an expansion operation.
Figure 16E:
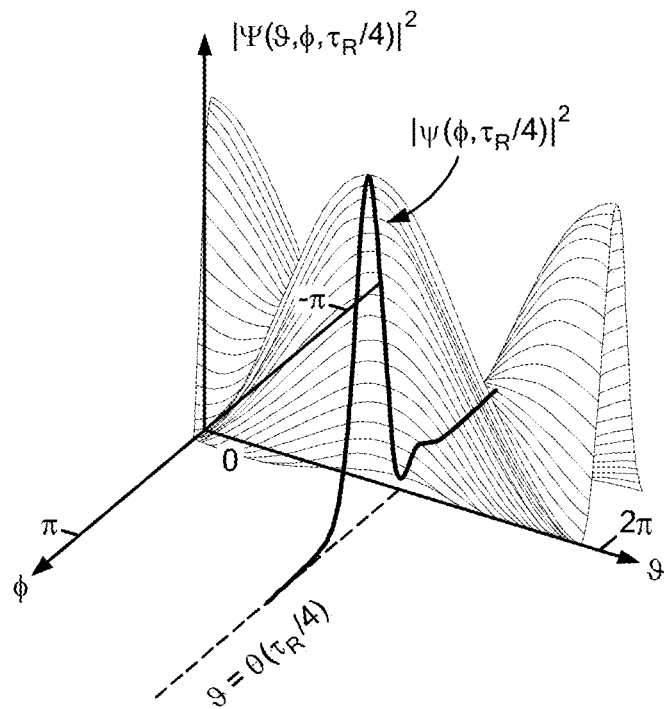
FIGS. 16e and 16f show a projection operation.
Figure 16F:
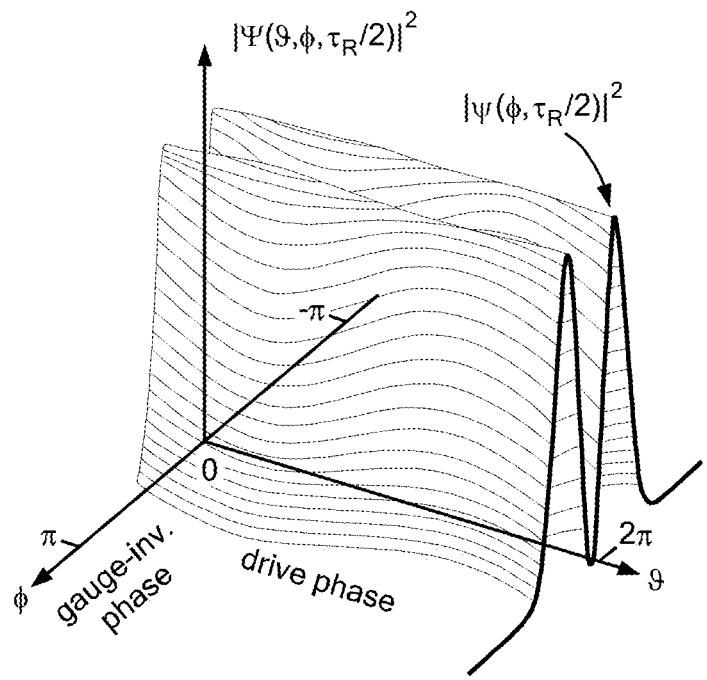

For example, consider a single-mode driven system such as a resonantly driven transmon qubit with gauge-invariant phase $\hat{\phi}$ as shown in FIG. 16c. The energy spectrum is inscribed in the Josephson potential and shown in units of the drive frequency, resonant with the qubit transition frequency. FIG. 16d-f illustrate the expansion and projection operations on the original-space (FIG. 16d) and the expanded-space wavefunctions (FIGS. 16e-16f). In FIG. 16d, the original-space wavefunction $\psi(\phi, 0)$ of the transmon in its ground state at t=0 (solid line) is promoted to the expanded space wavefunction $\psi(\vartheta, \phi, 0)$ (shaded region). Equivalently, the line is the projection or "contraction" of the expanded-space wavefunction back to the original-space wavefunction at t=0.

FIGS. 16e and 16f show the projection operation during the system time-evolution at times corresponding to a $\pi/2$ and $\pi$ pulse, respectively. Expanded-space wavefunction and original-space projection at $t_* = \tau_R/4$ (respectively $t_* = \tau_R/2$), where $\tau_R = 2\pi/\Omega$ is the time associated with the Rabi frequency $\Omega$, corresponding to a $\pi/2$ (respectively $\pi$) pulse. In FIG. 16e, $\vartheta = \theta(\tau_R/4)$ indicates the instantaneous phase of the drive at $t_* = \tau_R/4$. Note that the phase of the Rabi oscillation is unrelated to the projected value of the quantum operator $\hat{\vartheta}$, which is the drive phase $\theta(t) = \omega t \mod 2\pi$.

We next use the expanded-Hilbert-space representation to describe the system dynamics under changes to the drive parameters (amplitude and frequency) that are slow compared to the drive frequency. This is done by invoking the adiabatic theorem in a series of steps.

We begin by representing $\hat{H}_{eff}$ in the $\hat{m}$ basis. To this end, we introduce the eigenfunctions $\langle\vartheta|m\rangle = e^{im\vartheta}$ related to the conjugate operators $\hat{\vartheta}$ and $\hat{m}$, where $\hat{m}|m\rangle = m|m\rangle$ with m an integer. We then expand the effective Hamiltonian in terms of the basis functions $\{e^{il\hat{\vartheta}}\}$, with l an integer. Using the orthogonality relation $\langle m'|e^{il\hat{\vartheta}}|m\rangle = \delta_{m',l+m}$ where $\delta_{i,j}$ is the Kronecker delta, we arrive at the expression $$\hat{H}_{eff}(t) = \sum_m \left(\hat{h}_0[\Omega(t)] + \hbar\omega_{eff}(t)m\right)|m\rangle\langle m| + \sum_{l\neq 0}\sum_m \hat{h}_l[\Omega(t)]|m+l\rangle \quad (13)$$

$$\langle m| + H.c.,$$

where $\hat{h}_l[\Omega(t)]$ is the coefficient associated with $e^{il\hat{\vartheta}}$. Note that no approximation has been made to this point.

We next analyze time-evolution under Eq. (13) using the parametric eigenvalue equation $$\hat{H}_{eff}(t)|\Psi_\alpha^m(t)\rangle = \hbar\varepsilon_\alpha^m(t)|\Psi_\alpha^m(t)\rangle. \quad (14)$$

The set of time-dependent eigenvalues and eigenstates $\{\varepsilon_\alpha^m(t), |\Psi_\alpha^m(t)\rangle\}$ are labelled by the double index $(\alpha, m)$ as follows. Introducing the ladder operators $\hat{m}^- = \sum_{m=-\infty}^{\infty}|m-1\rangle\langle m| + H.c.$ and $\hat{m}^+ = (\hat{m}^-)^\dagger$, and assuming that $|\Psi(t)\rangle$ is an eigenstate of $\hat{H}_{eff}(t)$ with quasienergy $\hbar\varepsilon(t)$, the commutation rules $[\hat{m}, \hat{m}^\pm] = \pm\hat{m}^\pm$ imply that $\hat{H}_{eff}(t)\hat{m}^\pm|\Psi(t)\rangle = \hbar[\varepsilon(t)\pm\omega_{eff}(t)]\hat{m}^\pm|\Psi(t)\rangle$. Thus, the eigenstates of Eq. (14) at a given time t are generated by only N distinct eigenstates $|\Psi_\alpha^0(t)\rangle$ with eigenvalues $\varepsilon_\alpha^0(t)$, where N is the dimension of the system Hilbert space. The spectrum of $\hat{H}_{eff}(t)$ is of the form $\varepsilon_\alpha^l(t) = \varepsilon_\alpha^0(t) + l\omega_{eff}(t)$ with respective eigenstates $|\Psi_\alpha^l(t)\rangle = (\hat{m}^+)^l|\Psi_\alpha^0(t)\rangle$, where $(\hat{m}^+)^l|m=0\rangle = |m=l\rangle$, with $(\hat{m}^+)^{l>0} = (\hat{m}^-)^{l<0}$. By analogy with the spectrum of a quantized oscillator mode, $\hat{m}$ can be interpreted as a fictitious photon-number operator, with m the photon number.

According to the adiabatic theorem, in absence of eigenvalue degeneracies and under sufficiently slow changes of the drive parameters $\lambda(t) = [\Omega(t), \omega_{eff}(t)]^T$, an initial condition $|\Psi(0)\rangle = \sum_{\alpha,m}|\Psi_\alpha^m[\lambda(0)]\rangle$ in the extended Hilbert space propagates as According to the adiabatic theorem, in absence of eigenvalue degeneracies and under sufficiently slow changes of the drive parameters $\lambda(t) = [\Omega(t), \omega_{eff}(t)]^T$, an initial condition $|\Psi(0)\rangle = \sum_{\alpha,m}|\Psi_\alpha^m[\lambda(0)]\rangle$ in the extended Hilbert space propagates as $$|\Psi(t)\rangle = \sum_{\alpha,m} c_\alpha^m |\Psi_\alpha^m[\lambda(t)]\rangle e^{-i\int_0^t \varepsilon_\alpha^m[\lambda(t')]dt'}. \quad (15)$$

Here, the implicit phases of the time-dependent eigenstates $|\Psi_\alpha^m[\lambda(t)]\rangle$ are chosen such that $\langle\Psi_\alpha^m[\lambda(t)]|\nabla_\lambda\Psi_\alpha^m[\lambda(t)]\rangle\cdot\dot{\lambda}(t) = 0$, accounting for possible geometric phases.

We next use Eq. (15) to construct the time-evolution operator associated with $|\psi(t)\rangle$. We begin by promoting the initial condition $|\psi(0)\rangle$ to $|\Psi(0)\rangle$ using Eq. (10). Noticing that $(2\pi)^{-1}\int d\vartheta|\vartheta\rangle = |m=0\rangle$, Eq. (10) can be put in the form $|\Psi(0)\rangle = |0\rangle|\psi(0)\rangle$, from where the expansion coefficients $c_\alpha^m = \langle\Psi_\alpha^m[\lambda(0)]|-m,\psi(0)\rangle$ follow straightforwardly. Next, using the prescription in Eq. (12), with $\langle\vartheta| = \sum_m e^{i\vartheta m}\langle m|$, we arrive at the propagator $$\mathcal{U}(t) = \sum_{\alpha,m,m'} \langle m'-m|\Psi_\alpha^0[\lambda(t)]\rangle\langle\Psi_\alpha^0[\lambda(0)]|-m\rangle \times e^{i\theta(t)m'} e^{-i\int_0^t \varepsilon_\alpha^m[\lambda(t')]dt'}. \quad (16)$$

This is an explicit representation of the time-evolution operator for a driven system under slow changes of the drive parameters.

To better understand the meaning of Eq. (16), let us consider the case of an off-resonant drive with zero drive amplitude at t=0, which is of particular interest in this work. The eigenstates of the extended-Hilbert-space Hamiltonian at t=0 are $|\Psi_\alpha^0\rangle = |0\rangle|\Phi_\alpha\rangle$, where $\{|\Phi_\alpha\rangle\}$ are the eigenstates of the system Hamiltonian in absence of the drive. Accordingly, we have $$\mathcal{U}(t) = \sum_\alpha |u_\alpha[\lambda(t)]\rangle\langle\Phi_\alpha| e^{-i\int_0^t \varepsilon_\alpha^0[\lambda(t')]dt'}, \quad (17)$$

where we have defined the Floquet modes $|u_\alpha[\lambda(t)]\rangle = \sum_m e^{i\theta(t)m}\langle m|\Psi_\alpha^0[\lambda(t)]\rangle$. Equation (17) demonstrates the notion of adiabatic connection explicitly, and should be compared to the former definitions of $U\uparrow$ and $U\downarrow$ above. Additionally, Eq. (17) reduces to the correct Floquet propagator for constant drive parameters. To the best of our knowledge, this demonstration has not been reported elsewhere, and justifies our approach below.

As Eq. (16) shows, the eigenstates of $\hat{H}_{eff}(t)$ propagate the system and the Floquet modes at any time within one period of the drive, and thus encode the solution of the time-dependent Schrödinger equation at all times. We implement Eq. (14) and Eq. (16) for all of our Floquet calculations. We leverage the structure of the eigenspectrum of $\hat{H}_{eff}(t)$ to target only a few eigenvalues in the frequency ranges around $\{\varepsilon_\alpha^0(t)\}$ with a sparse eigensolver.

Using the theory introduced above, we now focus on engineering adiabatic microwave controls that are also reasonably fast, or quasiadiabatic. As a first step in this direction, we define a convenient parametrization of the pulse shape. We are interested operating close to the speed limit where nonadiabatic transitions cause leakage errors of the order of $10^{-4}$.

For exact adiabatic time-evolution, the populations $|c_\alpha^m|^2$ in Eq. (15) remain constant in time. In practice, however, a change in the drive parameters with the eigenstates finite speed leads to nonadiabatic transitions between $\hat{H}_{eff}(t)$. To understand how these transitions impact the dynamics, let us consider the system initialized in the eigenstate $|\psi(0)\rangle = |\Phi_\alpha\rangle$ for $\Omega(0) = 0$. The extended-Hilbert-space wavefunction at t=0 is $|\psi(0)\rangle = |0\rangle|\phi_\alpha\rangle$. We assume that the system evolves according to Eq. (17) until time t*, when the nonadiabatic transition $(\alpha, 0) \to (\alpha', m)$ takes place, leading to a nonzero $|c_{\alpha'}^m(t^*)|$. Adiabatic evolution follows for $t > t^*$ and the drive amplitude is modulated back to zero at time $t_g$, where $|\Psi_{\alpha'}^m(t_g)\rangle \simeq |m\rangle|\Phi_{\alpha'}\rangle$. This builds population in the noncomputational state $|\Phi_{\alpha'}\rangle$.

Realizing adiabatic time-evolution in the extended Hilbert space is thus a necessary condition for engineering adiabatic pulses. While the drive frequency does not seem to play a role in our analysis, because the maximum energy difference between two eigenstates of $\hat{H}_{eff}(t)$ is set by $\hbar\omega_{eff}(t)$, realizing adiabatic time-evolution in the extended Hilbert space is more challenging for slow drive frequencies. We should point out, however, that a rigorous analysis of this problem with full generality is challenging, and adiabatic time-evolution in the extended Hilbert space does not guarantee driven-adiabatic time-evolution at finite drive frequency. To overcome this fact, we address this problem in a practical way by first defining a pulse shape that incorporates the details of the extended-Hilbert-space problem, and independently adjust the time-scale of the pulse such that leakage is minimized in time-dependent simulations. We find that this strategy works well in all analyzed cases.

More precisely, we design the pulse shape using an estimate of the amount of leakage that can result from nonadiabatic transitions of the form $(\alpha, l) \to (\alpha', m)$ in the extended Hilbert space. First-order time-dependent perturbation theory leads to the expression $$|c_{\alpha'}^m(t)| \approx \frac{1}{\hbar} \frac{|\langle \Psi_{\alpha'}^m(\lambda)|\nabla_\lambda H_{ext}(\lambda)|\Psi_\alpha^l(\lambda)\rangle \cdot \dot{\lambda}|}{[\varepsilon_{\alpha'}^m(\lambda) - \varepsilon_\alpha^l(\lambda)]^2}, \quad (18)$$

where some of the explicit time-dependence of the right hand side has been omitted for clarity. According to this estimation, nonadiabatic transitions are more likely for densely packed quasienergy spectra and effective Hamiltonians with strong dispersion against the drive parameters $\lambda$. This information can be incorporated into the pulse shape by setting $|c_{\alpha'}^m(t)|$ to a constant much smaller than unity, and solving for $\dot{\lambda}(t)$. This leads to the equation $\dot{\lambda}(t) = \Lambda(t)$, where the function $\Lambda$ follows from Eq. (18). In this way, we arrive at a 'fast-quasiadiabatic' pulse shape where leakage is approximately bounded to a desired tolerance at all times. Moreover, the equation for the pulse shape can account for transitions out of a subspace of interest $\{|\psi_l^\alpha\rangle\}$, by ensuring that $|c_{\alpha'}^m(t)|$ remains bounded for all initial conditions in $\{|\psi_\alpha^l\rangle\}$.

To implement various embodiments, we use the fast-quasiadiabatic approach to calculate a suitable pulse shape for $U\uparrow$ in FIG. 16a. As $\Lambda(\lambda)$ is in general nonzero at the boundaries $\lambda_0$ and $\lambda_1$, we incorporate a time-dependent filter function $w_\tau(t)$ such that $\Lambda(\lambda) \to w_\tau(t)\Lambda(\lambda)$. The purpose of $w_\tau(t)$ is to smooth the pulse envelope at $t=0$ and $t=t_\uparrow$, such that its time derivative is continuous at all times. In particular, we consider a cosine filter-function of the form $w_\tau(t)=1$ for $\tau/2 \leq t \leq t_{flat}+\tau/2$, while $2w_\tau(t)=1-\cos(2\pi t/\tau)$ for $t < \tau/2$ and $w_\tau(t)=1-\cos[2\pi(t-t_{flat})/\tau]$ for $t > t_{flat}+\tau/2$. Here, $\tau$ is an additional pulse parameter that can be optimized to minimize leakage, and $t_{flat}$ follows from the gate time as $t_{flat}=t_g-\tau$. Finally, $\dot{\lambda}(t)=w_\tau(t)\Lambda(\lambda)$ is normalized and solved such that the boundary conditions $\lambda(0)=\lambda_0$ and $\lambda(t_g)=\lambda_1$ are respected. Because we use this method to engineer driven time-evolution, we refer to these waveforms as Minimum-leAkaGe-mICrowave (MAGIC) pulses.

If necessary, we complement the MAGIC pulse with a square pulse of duration $t\downarrow - t\uparrow$, during which the drive parameters are constant and equal to $\lambda_1$. Moreover, since we operate in the adiabatic limit, we use the time-reversed version of the MAGIC pulse to implement $U\downarrow \approx (U\uparrow)^\dagger$. In total, the pulse parameters are only a few, including the span $[\lambda_0, \lambda_1]$, $t_{\uparrow,\downarrow}$, and $\tau$. While the MAGIC waveform is usually well-behaved, it can significantly change with the system and drive parameters, as it encodes details of the extended-Hilbert-space Hamiltonian. Some of the pulse parameters, such as the gate time, can be estimated using the parametric quasifrequency spectrum. However, parameters such as $t_\uparrow$ and $\tau$, which impact the rate of nonadiabatic transitions, are numerically found by running time-dependent simulations that determine what 'sufficiently slow' means in practice. We discuss additional implementation details below.

Controlled-Phase Gates

In this section, we focus on the implementation of controlled-phase gates based on amplitude and frequency modulation of the coupler drive. We describe these gate operations using the tools developed in previous sections, both conceptually and quantitatively.

Here we discuss controlled-phase gates that use drive-amplitude modulation. For concreteness, we describe the gate operation assuming that the drive amplitude is zero at the beginning of the pulse ($\Omega_0=0$), and reaches a maximum value $\Omega_1$. This assumption does not limit the applicability of our results.

To model these two-qubit gates, we consider the Hamiltonian $$\hat{H}(\hat{\phi}, \hat{n}, t) = \hat{H}_s(\hat{\phi}, \hat{n}) + \hbar\Omega(t)\sin(\omega t)\hat{n}_c, \quad (19)$$

where $\Omega(t)(\omega)$ is the voltage-drive amplitude (frequency) applied to the coupler mode.

Figure 17A:
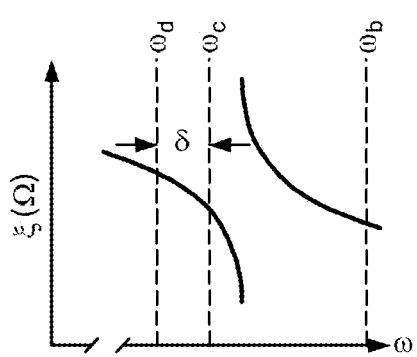
FIG. 17a shows, for three different drive-amplitude adiabatic gates, a ZZ interaction, ξ, as a function of drive frequency for fixed drive amplitude Ω.

FIGS. 17a-d illustrate drive-amplitude adiabatic gates where the drive frequency leads to qualitatively different dynamics. FIG. 17a shows ZZ interaction, $\xi$, as a function of drive frequency for fixed drive amplitude $\Omega$. Example frequencies (dashed lines) correspond to the situations illustrated in FIGS. 17b-d. $\delta$ represents a detuning with respect to a resonant condition at $\omega c$ for zero drive amplitude.

Figure 17B:
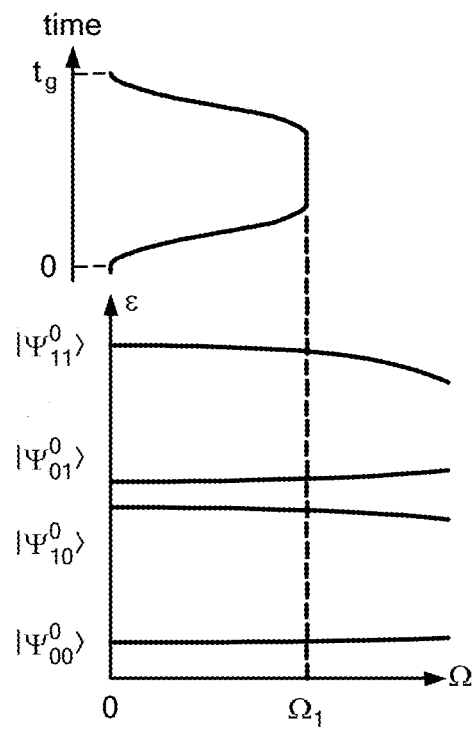
FIG. 17b illustrates an off-resonant drive-amplitude adiabatic gate.

Let us first examine the case of a drive with frequency far off-resonant from all multi-photon transitions for $\Omega(t) \in [\Omega_0, \Omega_1]$ (see FIG. 17b). The drive amplitude $\Omega(t)$ is 0 at $t=0$, and adiabatically reaches a maximum $\Omega_1$ for which the ZZ interaction between the two qubits is large in magnitude. Time-evolution under the strong drive leads to the accumulation of a conditional phase, and the gate is completed by setting the drive amplitude back to zero at $t=t_g$. The pulse schedule is illustrated in FIG. 17b, where we also show the extended-Hilbert-space states that are adiabatically connected to the computational levels $$|\psi(t_g)\rangle = \sum_{ij} c_{ij} e^{-i\int_0^{t_g} \varepsilon_{ij}[\Omega(t)]dt} |\Phi_{ij}\rangle. \quad (20)$$

The bottom panel of FIG. 17b shows logical-subspace quasifrequencies as a function of the instantaneous drive amplitude $\Omega$, while the top panel shows drive amplitude as a function of time.

Recall that the two-qubit states $|\Phi_{ij}\rangle$ are full-device eigenstates where the coupler ground state is omitted for brevity. The conditional phase accumulated during the adiabatic trajectory is given by $$\varphi = \int_0^{t_g} dt \xi[\Omega(t)], \quad (21)$$

leading to a controlled-phase gate for $\varphi=\pi$, up to zero-duration single-qubit Z rotations.

Figure 17C:
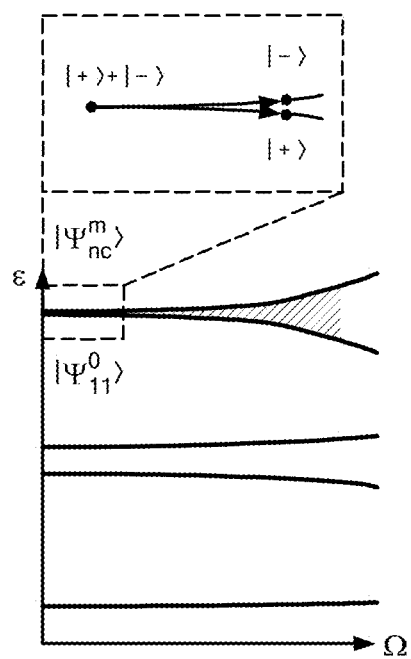
FIG. 17c illustrates a resonant drive-amplitude adiabatic gate.

Next, consider a situation where the drive frequency is resonant with an m-photon transition of the static Hamiltonian (see FIG. 17c). In this Figure, the bottom panel level $|\Phi_{11}\rangle$ is resonant with a noncomputational state, $|\Phi_{nc}\rangle$, by a m-photon transition. The top panel shows adiabatic evolution in a two-state subspace $\{|+\rangle, |-\rangle\}$, which are eigenstates of the extended-Hilbert-space Hamiltonian. The resonance condition between a given computational state $|\Phi_{ij}\rangle$ and a noncomputational one $|\psi_{nc}\rangle$ leads to a degeneracy between the extended-Hilbert-space states $|\Psi_{ij}^0\rangle = |0\rangle|\Phi_{ij}\rangle$ and $|\Psi_{nc}^m\rangle = |m\rangle|\psi_{nc}\rangle$ for $\Omega=0$. For nonzero drive amplitude, the bonding and antibonding superpositions $|\pm(\Omega)\rangle = (|\Psi_{\tilde{i}\tilde{j}}^0(\Omega)\rangle \pm |\Psi_{nc}^m(\Omega)\rangle)/\sqrt{2}$ diagonalize $H_{\textit{eff}}[\Omega]$. The initial condition $|\psi(0)\rangle = \Sigma_{ij}c_{ij}|\Phi_{ij}\rangle$ can be written in the extended Hilbert space as $$|\Psi(0)\rangle = \sum_{kj \neq \tilde{i}\tilde{j}} c_{ij}|\Psi_{ij}\rangle + \frac{c_{\tilde{i}\tilde{j}}}{\sqrt{2}}[|+\rangle + |-\rangle]_{\Omega \to 0}. \quad (22)$$

As the drive amplitude increases, the degeneracy between the states $|+\rangle$ and $|-\rangle$ is lifted. Assuming adiabatic evolution at all times, the extended-Hilbert-space wave-function at time $t_g$ takes the form $$|\Psi(t_g)\rangle = \sum_{kj \neq \tilde{i}\tilde{j}} c_{ij} e^{-i\int_0^{t_g} \varepsilon_{ij}[\Omega(t)]dt} |\Psi_{ij}\rangle + \frac{c_{\tilde{i}\tilde{j}} e^{-i\frac{\Delta_+}{2}}}{\sqrt{2}} \left[ e^{-i\frac{\Delta_-}{2}}|+\rangle + e^{i\frac{\Delta_-}{2}}|-\rangle \right]_{\Omega \to 0}, \quad (23)$$

where $$\Delta_\pm = \int_0^{t_g} \{\varepsilon_+[\Omega(t)] \pm \varepsilon_-[\Omega(t)]\} dt. \quad (24)$$

Here, $\varepsilon_\pm[\Omega]$ are the quasifrequencies associated with the eigenstates $|\pm(\Omega)\rangle$, respectively.

Since at the end of the pulse the population in $|\Psi_{nc}^m\rangle$ must be zero to prevent leakage out of the computational manifold, the interference condition $\Delta_-/2 = 0 \mod 2\pi$ needs to be satisfied. In other words, the gate evolution must complete a generalized $2\pi$-pulse between the computational and noncomputational states, accumulating a conditional phase $$\varphi = \sum_{kj \neq \tilde{i}\tilde{j}} (-1)^{i+j} \int_0^{t_g} \varepsilon_{ij}[\Omega(t)]dt + (-1)^{\tilde{i}+\tilde{j}} \frac{\Delta_+}{2}. \quad (25)$$

Because this two-qubit gate exploits the resonant coupling between a computational and a noncomputational state, typical gate times can be shorter than in the off-resonant case.

Figure 17D:
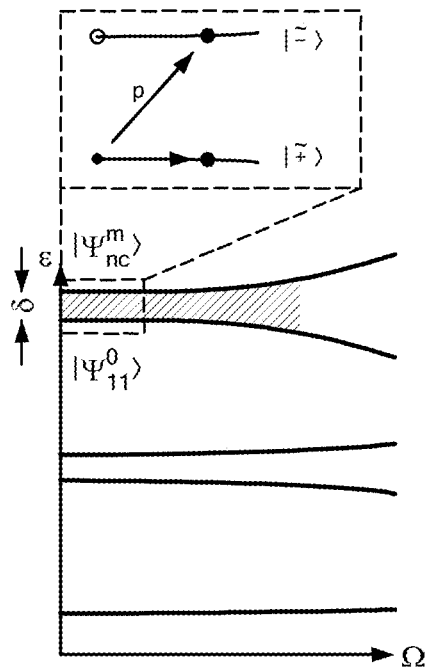
FIG. 17d illustrates a nearly resonant drive-amplitude adiabatic gate.

Now assume that the drive frequency is nearly resonant with an m-photon transition between the same states. For $\Omega=0$, the quasifrequencies associated with $|\Psi_{ij}^0\rangle$ and $|\Psi_{nc}^m\rangle$ differ by the detuning $\delta$. This is shown in FIG. 17d. In the bottom panel, level $|\Phi_{11}\rangle$ is nearly resonant with $|\Phi_{nc}^m\rangle$ by a m-photon transition. In the top panel is shown sudden-adiabatic evolution corresponding to the off-resonant drive of an m-photon transition between state $|\Phi_{11}\rangle$ and the noncomputational state $|\Phi_{nn}^m\rangle$. Here, p represents the probability of a nonadiabatic transition between the respective extended-Hilbert-space eigenstates.

The dynamics in the extended Hilbert space depend on the speed at which the drive amplitude is modulated. If the drive amplitude changes slowly compared to the time-scale associated with the gap between the two nearly degenerate states, the population of the noncomputational state remains approximately zero for an initial condition in the computational subspace.

In the opposite limit where $\dot{\Omega} \gg \delta^2$, a Landau-Zener-like transition takes place. This process, which we leverage for the two-qubit gate, transfers population from the computational to the noncomputational subspace, introducing nonadiabatic phases. The initial population in $|\Psi_{\tilde{i}\tilde{j}}^0\rangle$ splits into two branches defined by the states $|+(\Omega)\rangle$ and $|-(\Omega)\rangle$, and we assume is followed by adiabatic time-evolution for larger drive amplitudes. A second Landau-Zener-like process occurs at the end of the pulse, when the drive amplitude falls back to zero.

The above description is a simplified interpretation of a rather complex process. Importantly, however, it allows us to formulate two-qubit gate conditions for the nearly resonant drive, by extending the reasoning of the resonant case. More precisely, we expect the conditional phase in Eq. (25) to predict the amount of leakage and the net conditional-phase accumulated during time-evolution for $\dot{\Omega} \gg \delta^2$. Below, we numerically show that this is indeed the case to a good approximation. Finally, the interference condition $\Delta_-/2 = 0 \mod 2\pi$ now corresponds to a $2\pi$-off-resonant Rabi oscillation in the two-state manifold $\{|\Psi_{ij}^0\rangle, |\Psi_{nc}^m\rangle\}$.

Before presenting the numerical simulations, we briefly discuss open-system dynamics and introduce our leakage and fidelity metrics.

The two-qubit gates discussed so far leverage adiabatic time-evolution to a great extent, and can thus benefit from the pulse-shaping strategy introduced above. To set up the differential equation for the MAGIC pulse, we consider the set of levels $(\alpha,1)$ that include all computational and noncomputational states involved in the gate. In the case of resonant (respectively nearly resonant) driving, we exclude from this equation the contribution of the states that undergo a (respectively an off-resonant) Rabi rotation, but we still account for transitions between them and other states. For the Hamiltonian in Eq. (19), we have $\partial_\Omega \hat{H}_{\textit{eff}}/\hbar = \sin \hat{\theta} \hat{n}_c$, where $\sin \hat{\theta} = \Sigma_m (2i)^{-1}|m+1\rangle\langle m|+\text{H.c.}$ The total duration of the complete pulse, which could include a square pulse of amplitude $\Omega_1$, is estimated given a target rotation and using Eq. (21) and Eq. (25), accordingly.

We diagonalize the device Hamiltonian keeping a set of 40-50 device eigenstates at zero drive power, evaluating the convergence of the time-domain simulation with respect to an accuracy target. In the same basis, we specify the Lindblad master equation $$\dot{\hat{\rho}}(t) = -i[\hat{H}(t)/\hbar, \hat{\rho}(t)] + \sum_{\alpha \neq \beta} \gamma_{\alpha\beta}^1 \mathcal{D}[\hat{\sigma}_{\beta\alpha}]\hat{\rho}(t) + \sum_{\alpha,\beta} \gamma_{\alpha\beta}^\varphi \mathcal{D}[\hat{\sigma}_{\alpha\alpha}, \hat{\sigma}_{\beta\beta}]\hat{\rho}(t), \quad (26)$$

$\hat{\sigma}_{\alpha\beta} = |\Phi_\alpha\rangle\langle\Phi_\beta|$ and the dissipator superoperator $\mathcal{D}[\hat{x}, \hat{y}] \bullet = \hat{x} \bullet \hat{y}^\dagger - \{\hat{y}^\dagger \hat{x}, \bullet\}$ with $\mathcal{D}[\hat{x}]\bullet = \mathcal{D}[\hat{x},\hat{x}]\bullet$. The rates $\gamma_{\alpha\beta}^1$ describe multi-level relaxation and excitation processes, whereas pure-dephasing is modeled by the rates $\gamma_{\alpha\beta}^\varphi$. We numerically solved Eq. (26) using QuTiP's mesolve with error tolerances set by convergence checks.

Dissipation was modeled using a frequency-independent quality factor Q for capacitive loss, which we assume to be same for the qubits and coupler modes. Moreover, we assumed that pure-dephasing is dominated by 1/f flux noise. Modeling 1/f noise using Eq. (26) is rather inconvenient because it involves time-dependent rates that depend on the details of the noise. To study the gate fidelity in terms of a simpler metric, we derived a multi-level white-noise approximation to $\gamma_\alpha^\varphi$, parametrized by the coupler's pure-dephasing time $T_\varphi$. We considered a split-transmon model of the coupler with SQUID-junction asymmetry ratio r=7. While we do not account for additional pure-dephasing channels for the qubit modes, Eq. (26) properly captures flux-noise dephasing of the qubit states due to hybridization with the coupler mode.

To determine average gate fidelity and leakage, we partition the system Hilbert space X into two disjoint subspaces $X = X_t^1 \oplus X_t^2$. $X_t^1$ is a $d_1$-dimensional subspace with projector $\mathbb{1}_t^1 = \Sigma_\alpha |u_\alpha(t)\rangle \langle u_\alpha(t)|$, where the sum runs over computational states. $X_t^2$ is the $d_2$-dimensional complement of $X_t^1$, with associated projector $\mathbb{1}_t^2 = \mathbb{1} - \mathbb{1}_t^1$. We define the average gate fidelity as $$F_{avg} = \int d\psi_t^1 \langle \psi_t^1 | U_{tg}^\dagger \mathcal{E}_t(\Pi_t^\dagger |\psi_t^1\rangle \langle \psi_t^1| \Pi_t) U_{tg} |\psi_t^1\rangle, \quad (27)$$

where the integral is performed over the Haar measure in $X_t^1$. To accommodate the time-dependence of the computational states, our fidelity definition incorporates the additional operator $\Pi_t$ that maps $\mathbb{1}_0^1$ to $\mathbb{1}_t^1$. The meaning of Eq. (27) is however simple: $F_{avg}=1$ if and only if the process $\mathcal{E} = \mathcal{E}_{U_{tg}^\dagger} \circ \mathcal{E}_{0 \to t} \circ \mathcal{E}_{\Pi_t^\dagger}$ maps $\mathbb{1}_t^1$ to itself, where $\mathcal{E}_{U_{tg}^\dagger}$ is the channel associated with the adjoint of the target operation. The average gate fidelity takes the form $$F_{avg} = \frac{d_1 F_{proc}(\mathcal{E}) + 1 - L_1}{d_1 + 1}, \quad (28)$$

where $F_{proc}(\mathcal{E})$ is the process fidelity associated with $\mathcal{E}$. $L_1$ quantifies leakage as the trace of the operator that results from projecting $\mathcal{E}(\mathbb{1}_t^1/d_1)$ on the complement $X_t^2$.

Incorporating $\Pi_t$ in Eq. (27) is crucial for properly quantifying the fidelity of an operation on driven modes.

We now present, in connection with FIGS. 18-21, the result of numerical simulations of the various two-qubit gates described above in connection with FIG. 17a-17d, considering the full-circuit and drive Hamiltonian in Eq. (19) with parameters given in Table II below. We demonstrate the proposed gates schemes using transitions that not only involve noncomputational qubit states, but also coupler excitations. We find that, even in such cases, the gate fidelity can exceed 99.9% for current transmon coherence times.

a function of drive amplitude in the range 0-250 MHz, and select the drive frequency $\omega/2\pi = 5.815$ GHz. The chosen frequency remains well off-resonant with respect to multiphoton transitions for all drive amplitudes in the range of interest. FIG. 18d shows the ZZ interaction as a function of drive amplitude for the selected drive frequency. The ZZ coupling reaches about $-30$ MHz as the drive amplitude approaches 250 MHz.

We use the parametric quasienergy spectrum to engineer the pulse schedule. This pulse leads to a unitary CZ average-gate-fidelity $F_{avg} = 99.98\%$ up to single-qubit-Z rotations and leakage $L_1 = 0.016\%$ [see Eq. (28)]. FIG. 18e shows the resulting MAGIC pulse shape (dashed line), which we concatenate with a pulse of constant amplitude and the time-reverse version of the MAGIC pulse (solid line), such that the accumulated conditional phase is $\pi$ radians. Indeed, in FIG. 18f we show the conditional phase as a function of time, which we estimate from the instantaneous quasienergies as a function of drive amplitude $\Omega(t)$. We find an excellent agreement between this estimation and the conditional phase obtained in time-domain simulations.

Figure 18A:
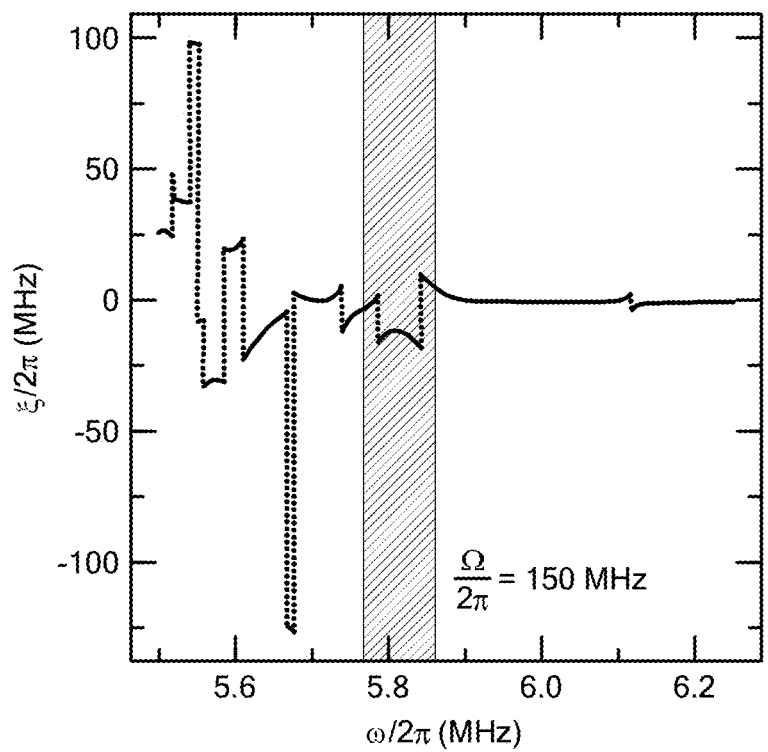
FIG. 18a shows, for off-resonant drive-amplitude adiabatic gates, a ZZ interaction, $\xi$, as a function of drive frequency for $\Omega/2\pi=150$ MHz.
Figure 18B:
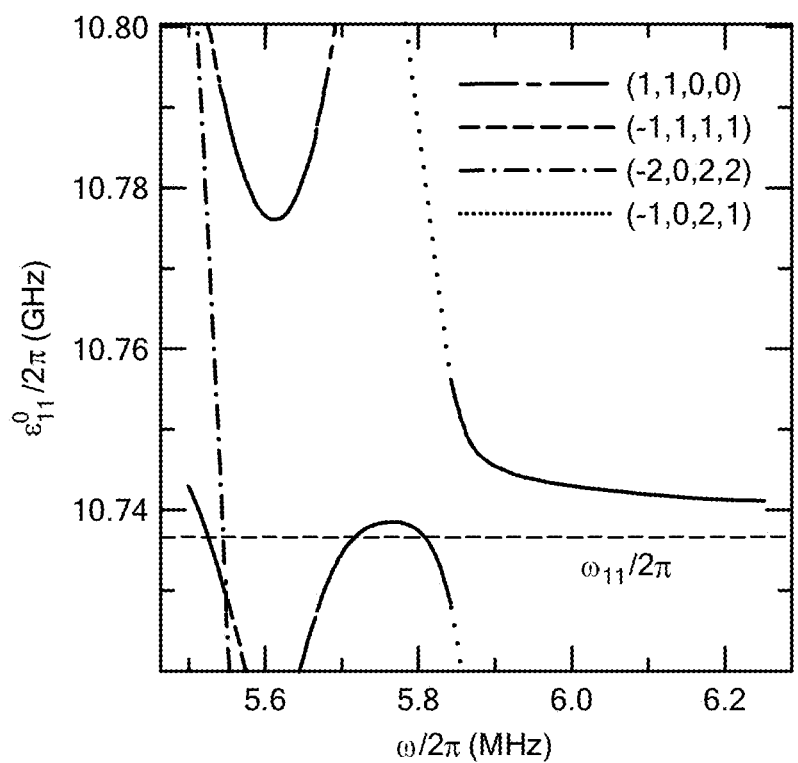
FIG. 18b shows the quasifrequency spectrum near the static two-qubit eigenfrequency $\omega_{11}/2\pi$(dashed line)
Figure 18C:
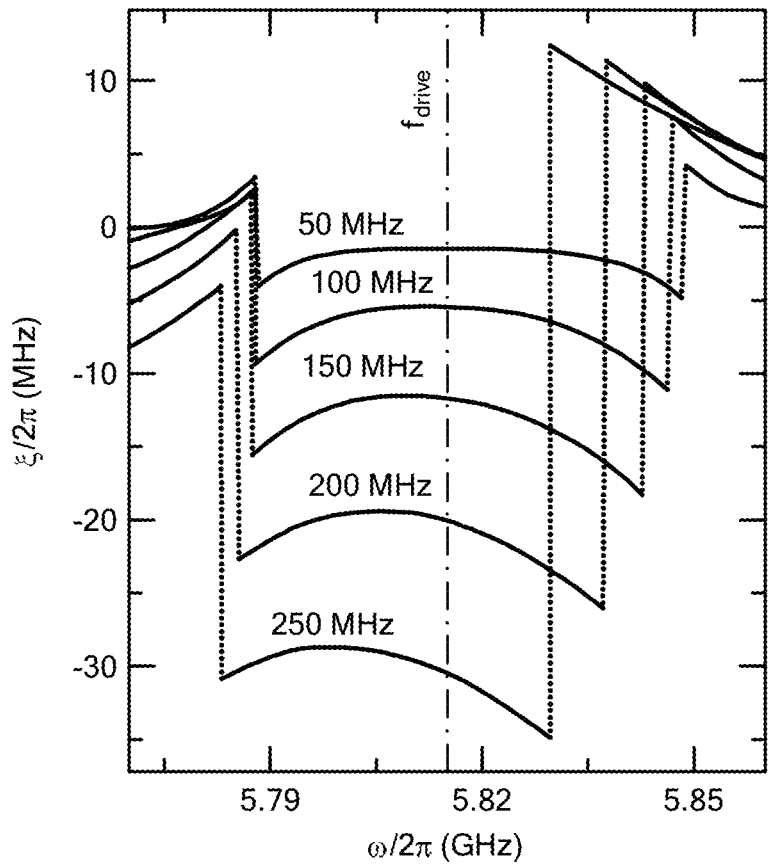
FIG. 18c shows ZZ interaction in a narrow frequency bandwidth for drive amplitudes in the range 50-250 MHz.
Figure 18D:
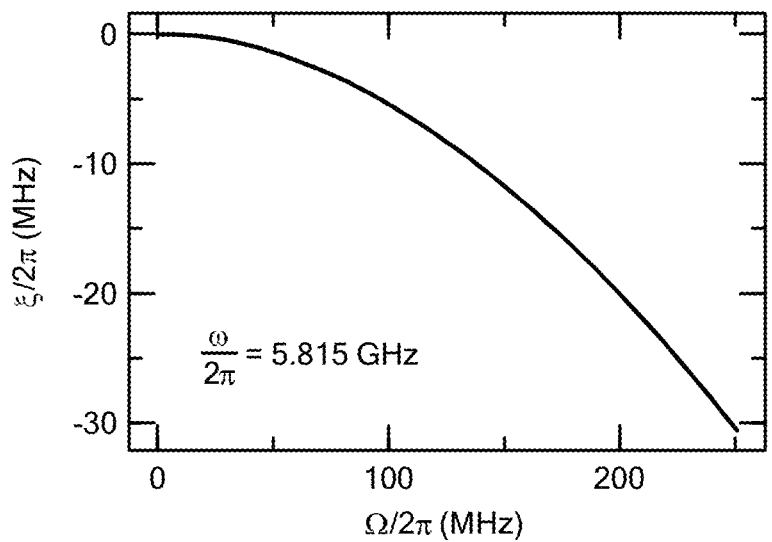
FIG. 18d shows ZZ interaction as a function of drive amplitude for the drive frequency $f_{drive}=5.815$ GHz.
Figure 18E:
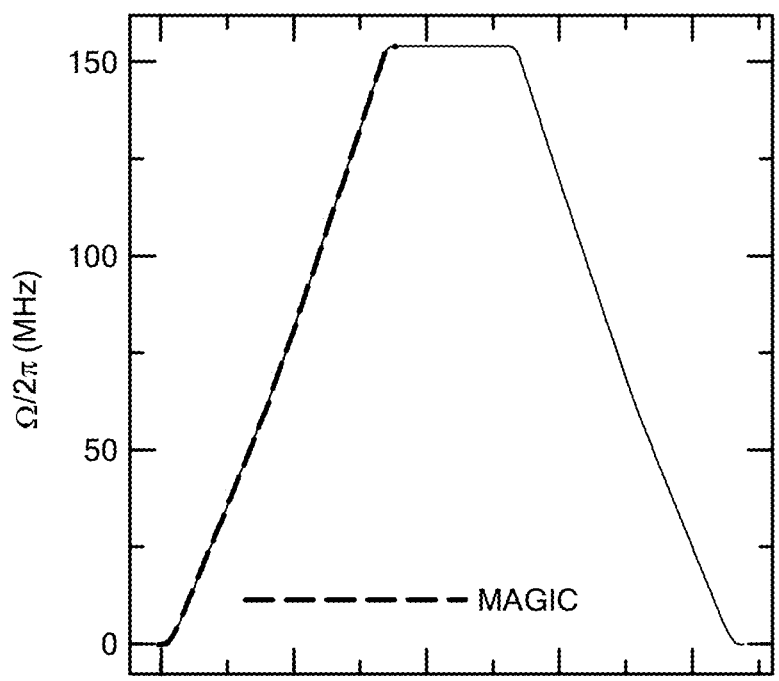
FIG. 18e shows MAGIC (dashed line) and complete (solid line) pulse schedules as a function of time.
Figure 18F:
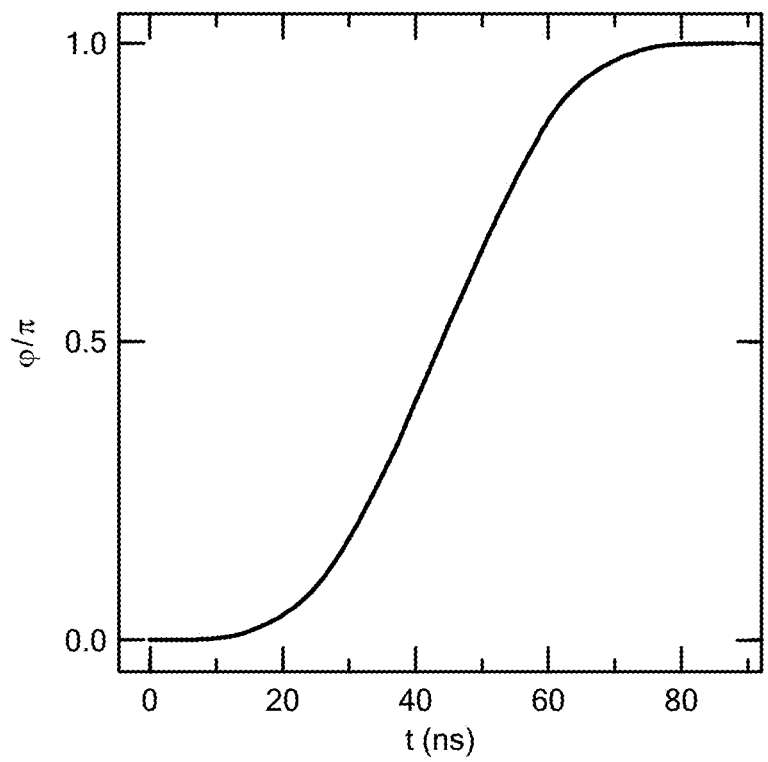
FIG. 18f shows accumulated conditional phase as a function of time for the complete two-qubit gate pulse in FIG. 18e.
Figure 18G:
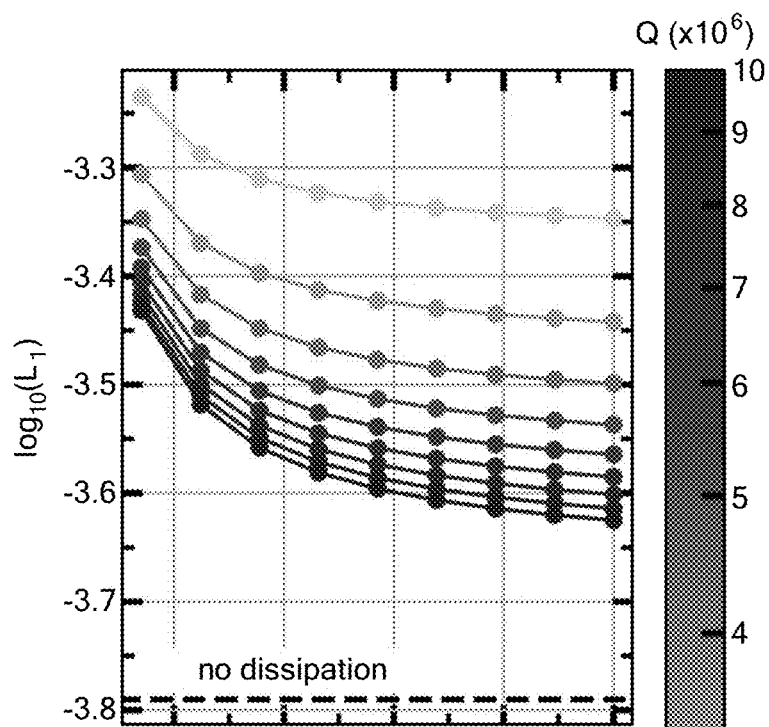
FIGS. 18g and 18h show leakage and average-gate-fidelity up to single-qubit-Z rotations as a function of coupler pure-dephasing time $T_\varphi$ and capacitive quality factor Q.
Figure 18H:
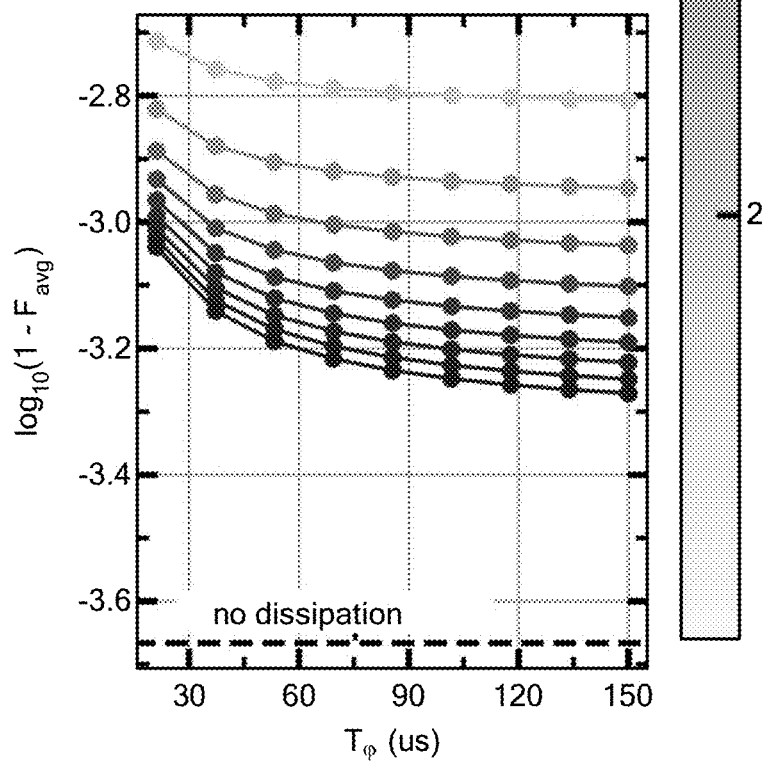

FIGS. 18g and 18h show $L_1$ and $F_{avg}$ respectively, as a function of $T_\varphi$ and Q, in the presence of dissipation. We estimate that two-qubit gate fidelities beyond 99.9% are possible for realistic circuit parameters. Despite a total gate time of about 90 ns, which is fast compared to typical microwave two-qubit gate pulses, we find that the average gate fidelity is no longer limited by leakage when dissipation is included. This is reasonable, however, as the drive dresses the computational levels with excited states subject to faster decay and dephasing rates. This fact can be taken into account when selecting the drive frequencies for high-fidelity gates on near-term devices with limited coherence.

Figure 19A:
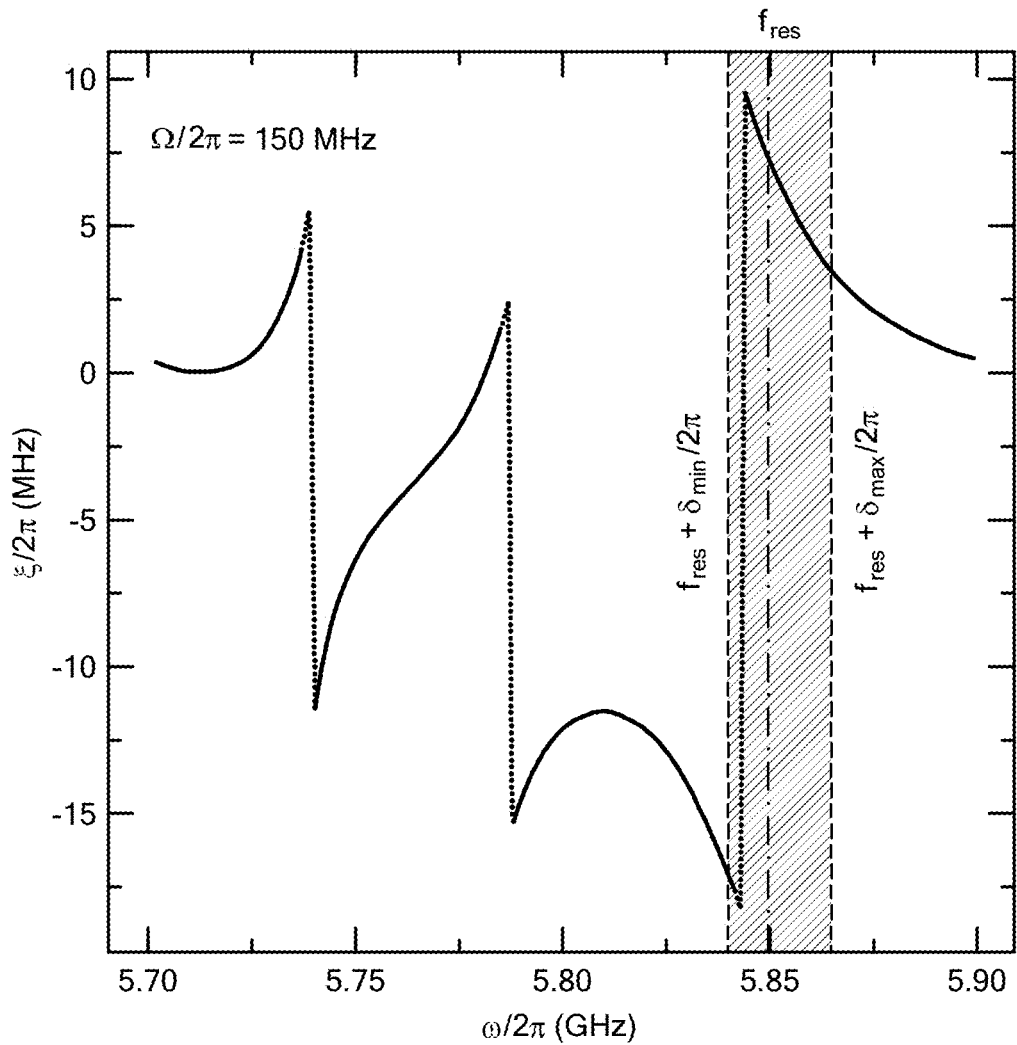
FIG. 19a shows, for drive-amplitude adiabatic resonant and nearly resonant gates, ZZ interaction as a function of drive frequency.

In FIGS. 19a-19i, we consider the resonant and nearly resonant gates. FIG. 19a shows the ZZ interaction in a narrow frequency range that includes the frequency $f_{res} \approx 5.850$ GHz of the $|\Phi_{110}\rangle \to |\Phi_{021}\rangle$ transition at zero

TABLE II

Energy parameters for the full-circuit Hamiltonian. All values are provided in GHz. 'Zero static ZZ' specifies the parameters used in FIGS. 18, 19, and 21. 'Nonzero static ZZ' reports the circuit parameters used in FIG. 20.

| Parameter set | $E_{C_a}/h$ | $E_{C_b}/h$ | $E_{C_c}/h$ | $E_{J_a}/h$ | $E_{J_b}/h$ | $E_{J_b}/h$ | $g_{ac}/2\pi$ | $g_{bc}/2\pi$ | $g_{ab}/2\pi$ |
|---|---|---|---|---|---|---|---|---|---|
| Zero static ZZ | 0.2315 | 0.2499 | 0.2947 | 15.414 | 17.189 | 14.152 | 0.0752 | 0.0825 | 0.0072 |
| Nonzero static ZZ | 0.2315 | 0.2499 | 0.2987 | 15.414 | 17.189 | 16.687 | 0.0723 | 0.0792 | 0.0072 |

Figure 15D:
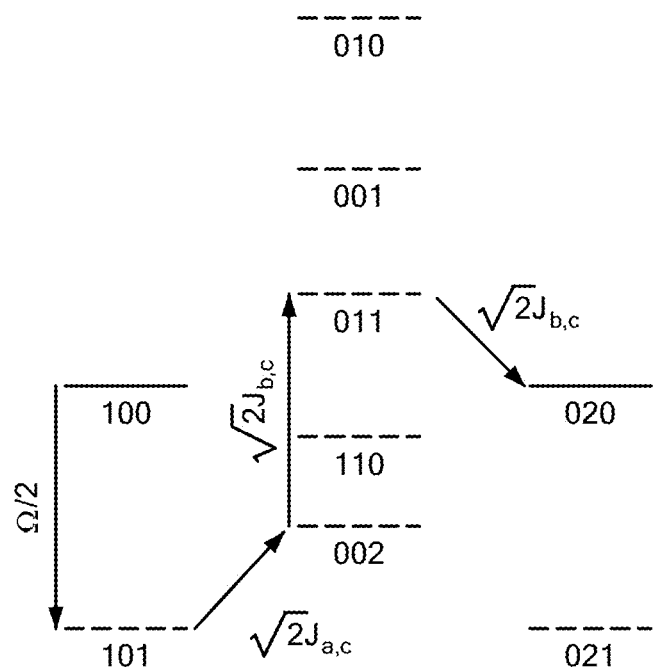
FIG. 15d shows an energy level diagram of a fourth-order process.

We start with the off-resonant amplitude-adiabatic gate, FIGS. 18a-18h. FIG. 18a shows the driven ZZ interaction as a function of drive frequency for $\Omega/2\pi = 150$ MHz. While the driven ZZ coupling is nontrivial in a frequency range of about 2 GHz (see also FIG. 15d), we now focus on drive frequencies above 5.5 GHz. The rich structure of the ZZ interaction can be understood in terms of the quasifrequency spectrum, as shown in FIG. 18b for states near $|\Phi_{11}\rangle$, with frequency $\omega_{11}/2\pi$. The label (m,i,j,k) incorporates the Floquet photon number m and the excitations (i,j,k) of qubit a, b and coupler c, respectively. There, the quasifrequency $\varepsilon_{11}^0$, of the Floquet mode adiabatically connected to $|\Phi_{11}\rangle$, appears discontinuous at specific drive frequencies due to anti-crossings with noncomputational states in the extended Hilbert space.

Next, in FIG. 18c, we examine more closely the ZZ interaction in a narrower frequency range where the ZZ coupling is large in magnitude. We plot the ZZ interaction as drive power (dash-dotted vertical line). We consider drive frequencies in the range $[f_{res} + \delta_{min}/2\pi, f_{res} + \delta_{max}/2\pi]$ (shaded area), where $\delta_{min}$ ($\delta_{max}$) is the minimum (maximum) detuning in relation to $f_{res}$.

Figure 19D:
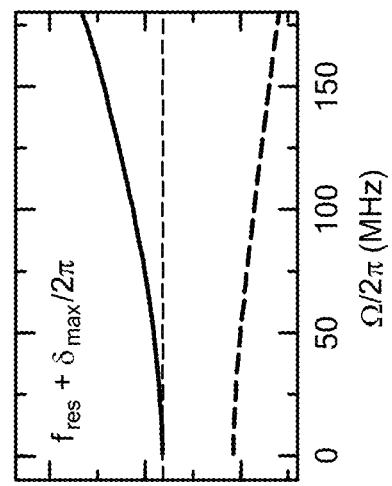
FIG. 19d shows blue-detuned drive of frequency $f_{res}+\delta_{max}/2\pi\approx 5.865$ GHz.
Figure 19C:
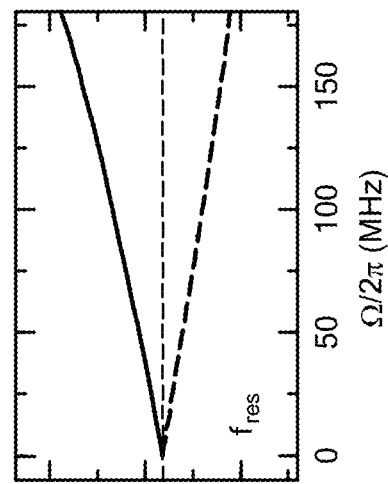
FIG. 19c shows the exact resonance condition.
Figure 19B:
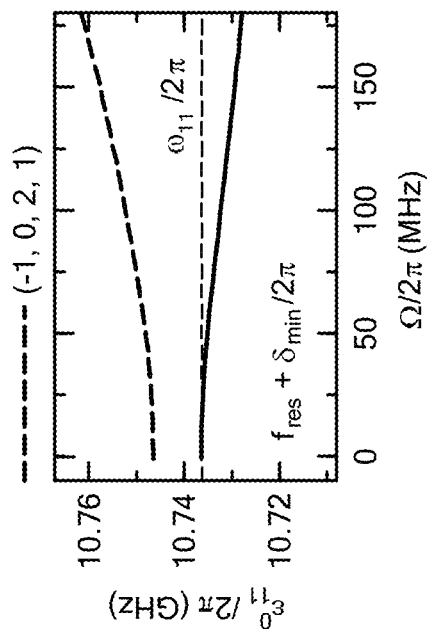
FIG. 19b shows red-detuned drive of frequency $f_{res}+\delta_{min}/2\pi\approx 5.840$ GHz.

FIGS. 19b-19d show the quasifrequencies of the extended-Hilbert-space eigenstates corresponding to the nearly degenerate states that are coupled by the drive as a function of drive power and frequency (see also FIG. 17c-17d). FIGS. 19b and 19d show the result for nearly resonant drive frequencies, whereas FIG. 19c corresponds to $f_{drive}$-$f_{res}$. The frequency $\omega_{11}$ of the computational state $|\Phi_{110}\rangle$ is shown for comparison (horizontal dashed line).

We first consider the case $f_{drive}$-$f_{res}$. Similarly to the simulation in FIG. 18, we set the maximum drive power to $\Omega_1/2\pi = 150$ MHz, and design a MAGIC pulse such that the total conditional phase is $\varphi = -\pi + \epsilon$, with $|\epsilon| \ll \pi$. While $\epsilon$ is in general nonzero because of the contribution of the off-resonant computational states in Eq. (25), we discuss below how to target $\epsilon \to 0$ by selecting the drive frequency. The resulting pulse shape is similar to that shown in FIG. 18e, with a comparable gate time $t_g \approx 87$ ns. Because this pulse schedule populates the noncomputational state $|\Psi_{021}^{-1}\rangle$ in the extended Hilbert space, the pulse time must be set to restore the initial population to $|\Psi_{110}^{0}\rangle$ at the end of the gate. The two-qubit gate implements a total conditional-phase $\varphi \approx \pi$ (see FIG. 19b) with $F_{avg}=99.97\%$ up to single-qubit-Z operations and leakage $L_1 \approx 0.03\%$. FIGS. 19f-19g show leakage and average-gate-fidelity, respectively, as a function of T $\in [20, 150]$ µs and capacitive quality factor Q. Due to the stronger coupling to the noncomputational state and a comparable gate time, the impact of dissipation is greater than what we predict for the off-resonant gate. However, average gate fidelities above 99.9% are still possible for typical circuit parameters, according to our simulations.

Figure 19E:
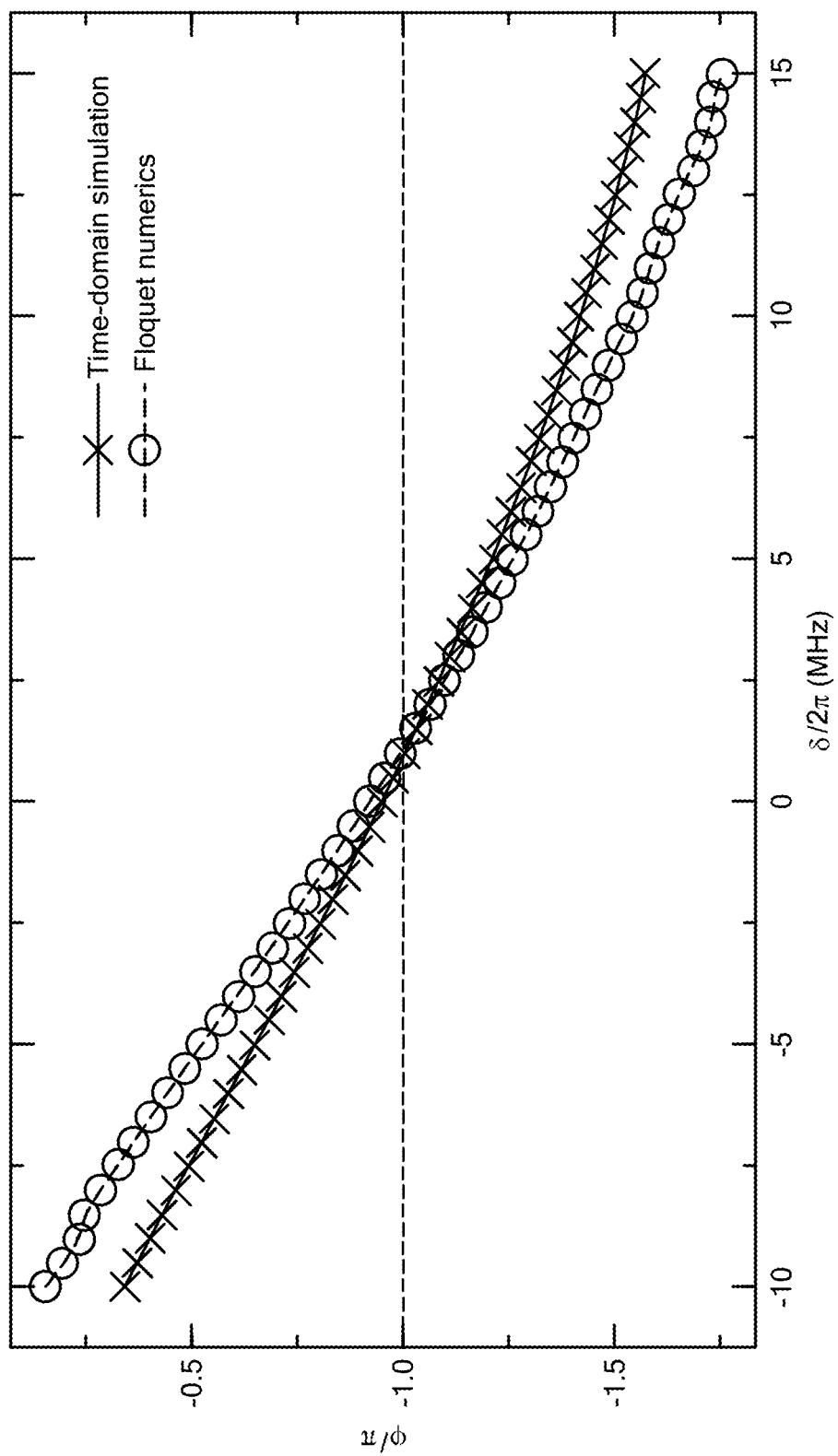
FIG. 19e shows accumulated conditional phase as a function of drive detuning $\delta$.
Figure 19F:
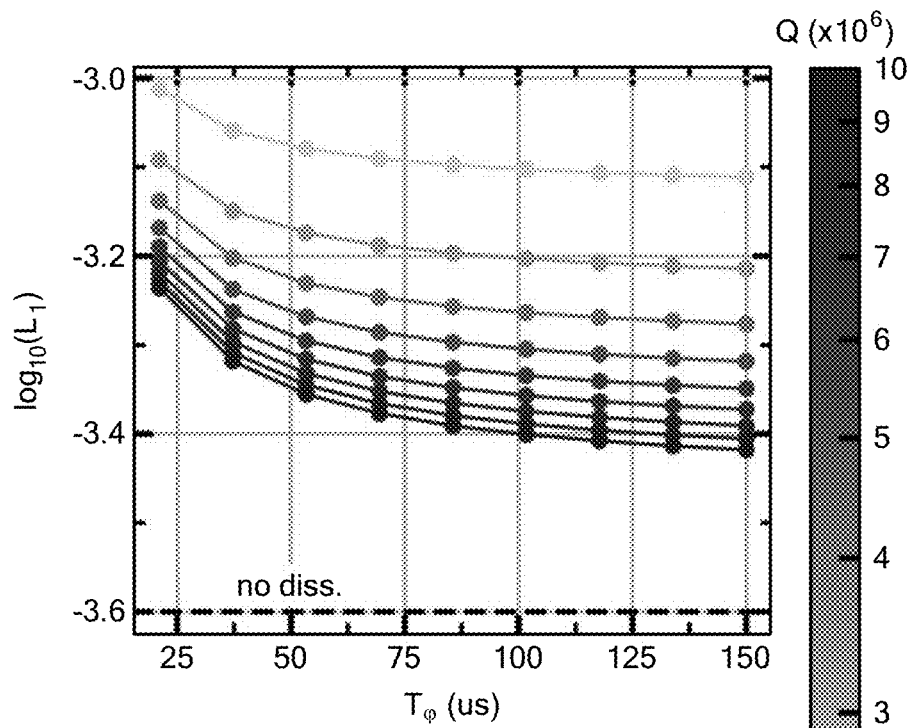
FIGS. 19f-19g show leakage and average gate fidelity up to single-qubit-Z rotations, respectively, as a function of $T_\varphi$ and Q.
Figure 19G:
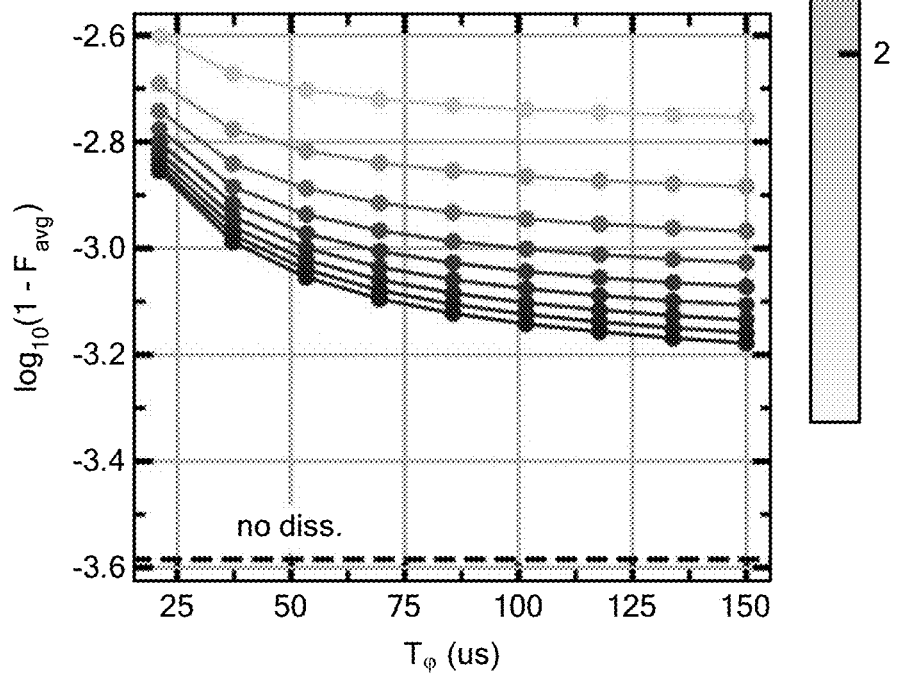

Next, we investigate the gate operation as a function of de-tuning $\delta$ for nearly resonant gates, with results shown in FIG. 19e. We compare the result from time-domain simulations against predictions based on Floquet theory. The MAGIC pulse shape used in the two-qubit gate simulations is independently optimized for each drive frequency. The total gate time varies in the range 65-90 ns as the drive frequency goes from blue- to red-detuned, and is numerically optimized to satisfy the resonant and nearly resonant leakage-cancellation conditions.

We use Floquet numerics to determine suitable initial values for the pulse parameters: Given $t_\uparrow$, we estimate the required duration $t_\downarrow$-$t_\uparrow$ by integrating the quasienergies such that the zero-leakage condition $\Delta/2=0 \mod 2\pi$ [see Eq. (24)] is met for each drive frequency. We also perform time-domain simulations to slightly optimize $\tau$, $t_\uparrow$ and the total duration of the pulse, such that leakage is further minimized. Because the zero-leakage condition depends on $\delta$, the accumulated conditional phase $\varphi$ varies with detuning. Thus, FIG. 19e compares the conditional phase obtained by time-domain simulations to that predicted by Eq. (25). These two estimations are in agreement for small detunings, but deviations appear for $|\delta/2\pi| \gtrsim 5$ MHz. We attribute this discrepancy to the nonadiabatic phases introduced by the off-resonant drive, as discussed above, which are not taken into account in Eq. (25).

Figure 19H:
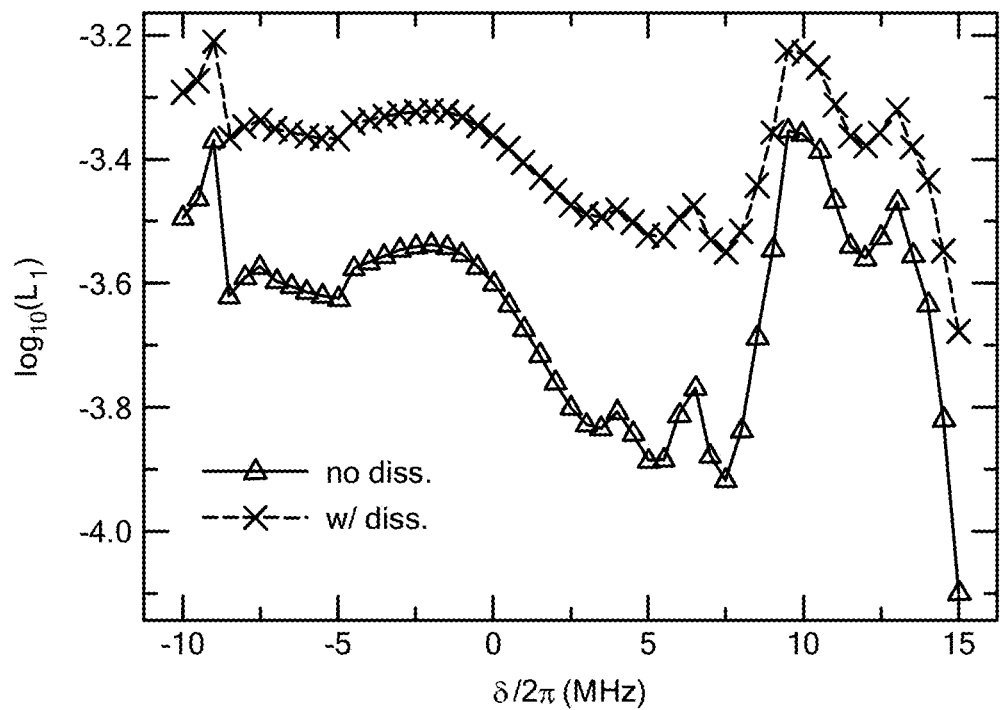
FIGS. 19h-19i show leakage and average gate fidelity, respectively, as a function of $\delta$, with and without dissipation.
Figure 19I:
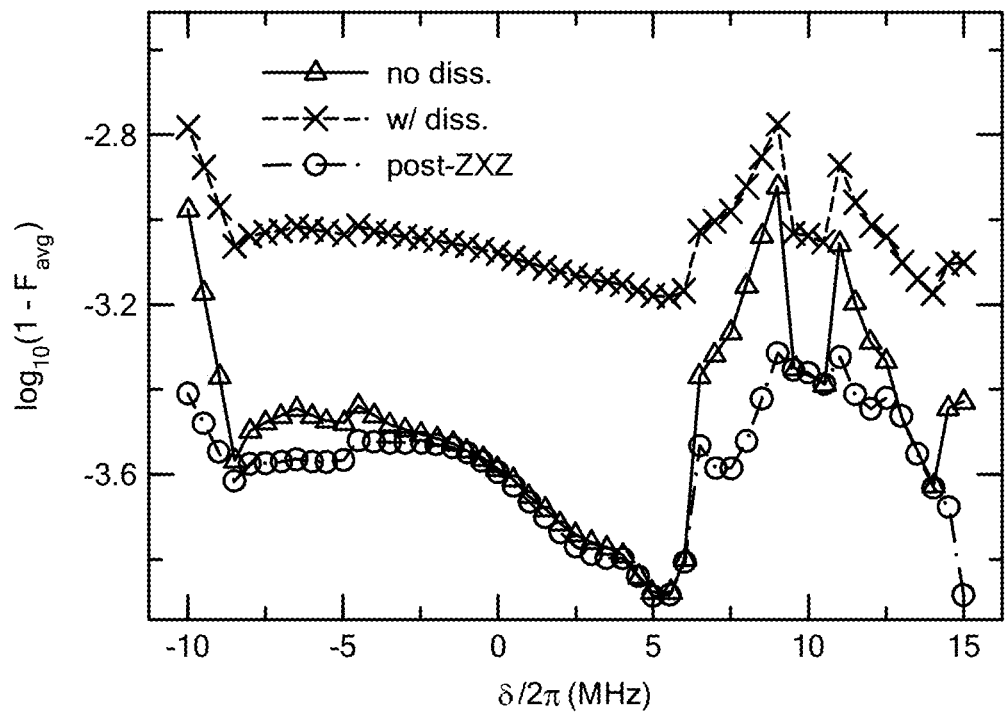

FIGS. 19h and 19i show, respectively, leakage and average gate fidelity against an arbitrary-phase two-qubit gate as a function of detuning. "No diss." markers show the result of unitary time-domain simulations, where the average gate fidelity is estimated up to single-qubit Z rotations. In FIG. 19i, "post-ZXZ" markers show the average gate fidelity up to arbitrary single-qubit rotations applied after the two-qubit gate. For larger detunings, the two-qubit gate fidelity improves when correcting for arbitrary single-qubit rotations. We speculate that single-qubit gates account for nonadiabatic deviations with respect to the ideal process map due to the off-resonant drive. Selecting $Q=8 \times 10^6$ and $T_\varphi=80$ µs, we also show leakage and average gate fidelity in the presence of dissipation ("w/diss" markers). We found that the gate fidelity can exceed 99.9% for realistic circuit parameters for $|\delta/2\pi| \lesssim 5$ MHz, while also offering significant tunability of the conditional phase.

The above analysis of the various amplitude-adiabatic gates is valid for any drive amplitude and frequency. These gates define a continuous family when it comes to evaluating the impact of dissipation from a multi-photon resonance: While the off-resonant gate leverages virtual coupling to noncomputational states, leading to the 'bending' of the computational energy levels as a function of drive amplitude, the resonant and nearly resonant gates exploit direct coupling to noncomputational levels.

While typical pulse schedules for microwave gates in the literature have $t_\uparrow$ times in the range of 5-15 ns and are often accompanied by a transitionless-quantum-driving scheme such as 'Derivative Removal by Adiabatic Gate' (DRAG), our pulses have longer $t_\uparrow$ and are better thought of as a continuous modulation of the drive amplitude. We expect these two approaches to work complementarily and benefit other types of two-qubit gates. Controlled-phase gates based on direct coupling, or via a resonator mode, are obvious choices to investigate next. Two-qubit gates based on cross-resonance or parametric interactions are other possible candidates.

So far, we have thoroughly discussed two-qubit gates that operate at fixed drive frequency and rely on drive-amplitude modulation. Now, we turn our attention to a different type of controlled-phase gates that are implemented by modulating the phase of the drive. In other words, the drive frequency is chirped.

Using the tools developed above in the section "PARAMETRIC MICROWAVE CONTROL", here we introduce the concept of a drive-frequency-variable two-qubit gate, and show that it features very unique and interesting properties. These two-qubit gates offer new possibilities for coherent control, and are especially well suited for driven (i.e., Floquet) qubits.

Figure 20B:
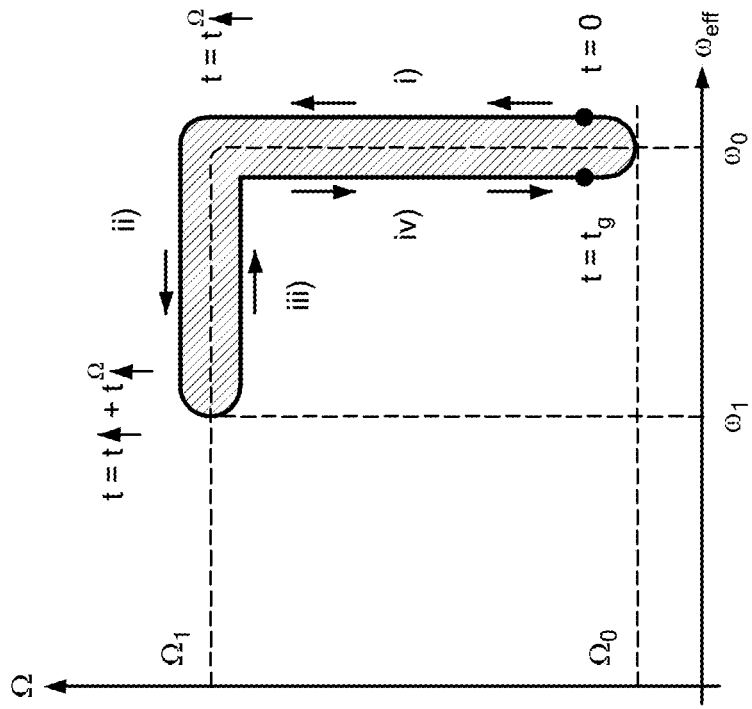
FIG. 20b shows a complete pulse schedule in the $\square_{eff}$-$\Omega$ plane.
Figure 20A:
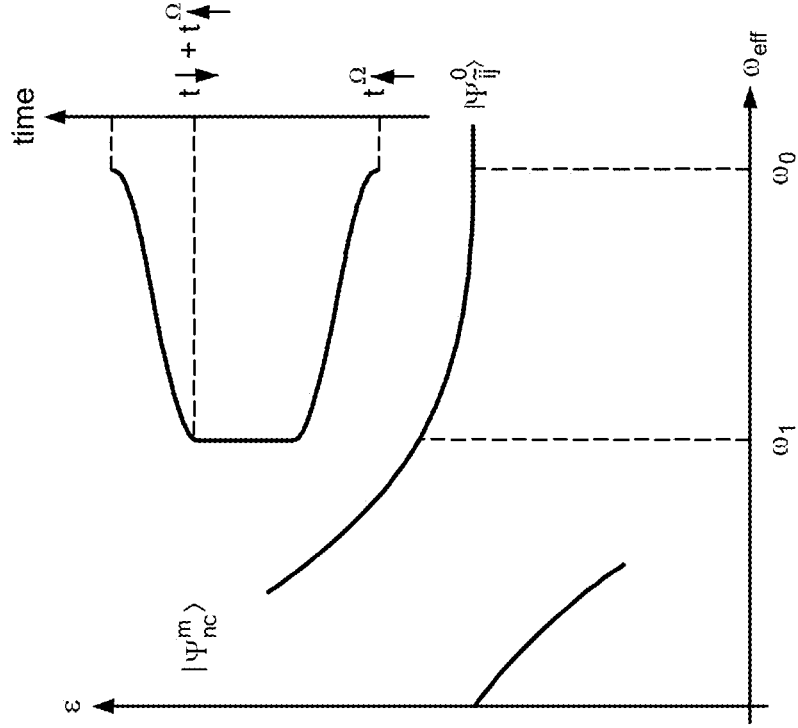
FIG. 20a shows an anticrossing between a pair of states $|\Psi_{ij}^0\rangle$ (computational) and $|\Psi_{nv}^m\rangle$ (noncomputational) of the extended Hilbert space, as a function of effective drive frequency $\omega_{eff}$.

The working principle of a frequency-modulated two-qubit gate is illustrated in FIG. 20a. There, we show an anticrossing between a pair of states $|\Psi_{ij}^{0}\rangle$ (computational) and $|\Psi_{nc}^{m}\rangle$ (noncomputational) of the extended Hilbert space, as a function of effective drive frequency $\omega_{eff}$. The inset shows a schematic of the effective drive frequency as a function of time. Due to the strong coupling between these states, the energy of the computational level shifts as the drive frequency approaches $\omega_1$ from its initial value $\omega_0$. This energy shift of the computational state leads to the accumulation of a conditional phase as the drive frequency is chirped, and it forms the basis of the proposed two-qubit operation.

The accumulation of the conditional phase takes place at the constant drive amplitude $\Omega_1$. The gate is performed in four steps, shown in FIG. 20b. While our pulse schedule has zero area in parameter space, we schematically separate overlapping trajectories for clarity. First, the drive amplitude is adiabatically modified to reach $\Omega_1$ from an initial value $\Omega_0$, in a time $t_\uparrow^\Omega$ [step i]. The frequency chirp $\omega_0 \to \omega_1$ [step ii] follows immediately. A 'hold' time can be added between steps ii and iii, where the latter serves to restore the drive frequency to its original value $\omega_1 \to \omega_0$. Finally, the drive amplitude is adiabatically reduced to its original value $\Omega_0$ in step iv.

By engineering a closed trajectory in the $\omega_{eff}$-$\Omega$ plane and choosing the hold time, the dynamical phases accumulated by the computational states can be adjusted to implement a controlled-phase gate at the end of the schedule. More precisely, the total conditional phase accumulated during the pulse is given by $$\varphi = \int_0^{t_g} \xi[\omega_{eff}(t), \Omega(t)] dt, \tag{29}$$

where the integral is taken along the closed path in FIG. 20b.

We divide the pulse schedule in FIG. 20b in two main parts, including the drive amplitude modulation and the frequency chirp. We design the former with the tools provided above in connection with the off-resonant case. We use similar tools to engineer the frequency chirp. According to Eq. (18), the matrix elements of the operator $\partial_\lambda \hat{H}_{eff}$ for $\lambda = \omega_{eff}$ are needed in this case. From Eq. (11), it follows that $\partial_{\omega_{eff}} \hat{H}_{eff}/\hbar = \hat{m}$. Evaluating the matrix elements of $\hat{m}$ for all computational states in the expanded Hilbert space, we arrive at a differential equation for $\omega_{eff}(t)$. We moreover consider the boundary conditions $\omega_{eff}(t_\uparrow^\Omega) = \omega_0$ and $\omega_{eff}(t_\uparrow + t_\uparrow^\Omega) = \omega_1$, where $t_\uparrow$ sets the time of the first frequency chirp $\omega_0 \to \omega_1$ (see FIG. 20b). The MAGIC pulse for this operation can be followed by a square pulse during which $\omega_{eff}(t) = \omega_1$, and then concatenated with its time-reverse version $\omega_1 \to \omega_0$, restoring the effective drive frequency to its original value. Finally, the MAGIC pulse schedules for amplitude- and frequency-modulation are integrated to compose the full two-qubit-gate schedule in FIG. 20b, which also specifies the timing of each pulse.

For the frequency chirp, we introduce an additional fine-tuning condition that helps mitigating the impact of the dominant nonadiabatic transition as $\omega_{eff}(t) \to \omega_1$. Denoting $\Delta$ to the quasifrequency difference between $|\Psi_{ij}^0\rangle$ and $|\Psi_{nc}^m\rangle$, first-order perturbation theory within a two-level approximation leads to the condition $$\int_{t_\uparrow^\Omega}^{t_\uparrow + t_\uparrow^\Omega} \Delta[\omega_{eff}(t)] dt = 0 \mod 2\pi, \qquad (30)$$

for minimum leakage. In practice, given $\omega_0$, $\omega_1$, and the drive power $\Omega_1$, we pick $t_\uparrow$ such that Eq. (30) is satisfied. Using time-domain simulations, we slightly optimize the value of $t_\uparrow$ by evaluating leakage out of the computational-state manifold at time $t_\uparrow + t_\uparrow^{106}$. We find that the optimal $t_\uparrow$ is generally close to the value predicted by Eq. (30). Other pulse parameters, such as the time $\tau$ used in the cosine filter, are optimized together with $t_\uparrow$.

Additionally, we calculate the instantaneous drive frequency $\omega(t)$ that is used in time-domain simulations, by solving $$\omega(t) + \dot{\omega}(t)t = \omega_{eff}(t). \qquad (31)$$

While seemingly simple, this relation has interesting consequences. For instance, let us consider the instant $t_* = t_\uparrow + t_\uparrow^\Omega$. For $t' \geq t$, we must have $\omega(t) = \omega_0$, as the frequency is no longer modulated past this time. However, $w(t \to t_*) \neq \omega$ for $t \leq t_*$. This apparent contradiction implies a discontinuity of the instantaneous drive frequency at time $t = t_*$, while the drive phase $\theta(t) = \omega(t) t$ remains continuous. We return to these details below.

We now discuss the simulation and predicted fidelities of frequency-modulated two-qubit gates. See the discussion above for details on the master equation and fidelity metrics.

Figure 21A:
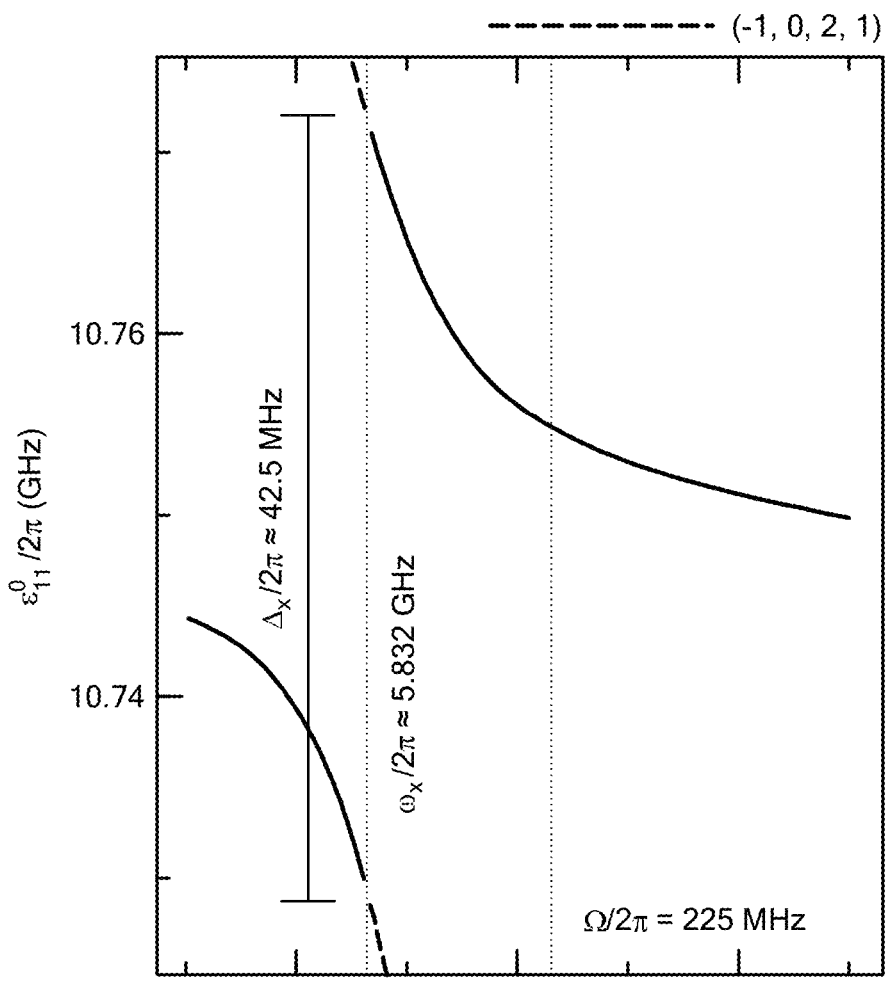
FIG. 21a shows an anticrossing between computational (0,1,1,0) and noncomputational (-1,0,2,1) states of the expanded space as a function of drive frequency.

FIGS. 21a-21h illustrate a drive-frequency adiabatic two-qubit gate. FIG. 21a shows an anticrossing between two expanded-space eigenstates $|\Psi_{11}^0\rangle$ labelled by (0, 1, 1, 0) and $|\Psi_{nc}^m\rangle$ labelled by (−1, 0, 2, 1), for the drive amplitude $\Omega_1/2\pi = 225$ MHz. Recall that the label (m,i,j,k) includes the Floquet photon number m and the excitations (i,j,k) of qubits a, b and coupler c, respectively. The states (0, 1, 1, 0) and (−1, 0, 2, 1) are adiabatically connected to computational and noncomputational states of the undriven system, respectively, with circuit parameters provided in Table II ('Zero static ZZ'), used in previous sections.

To design the frequency chirp, we numerical find the exact frequency $\omega$ where the anticrossing takes place, solving $\partial_{107} \Delta(\omega_x) = 0$ where $$\partial_{\omega_{eff}} \Delta(\omega_{eff}) = \langle \Psi_{11}^0 | \hat{m} | \Psi_{11}^0 \rangle - \langle \Psi_{nc}^m | \hat{m} | \Psi_{nc}^m \rangle. \qquad (32)$$

Figure 21B:
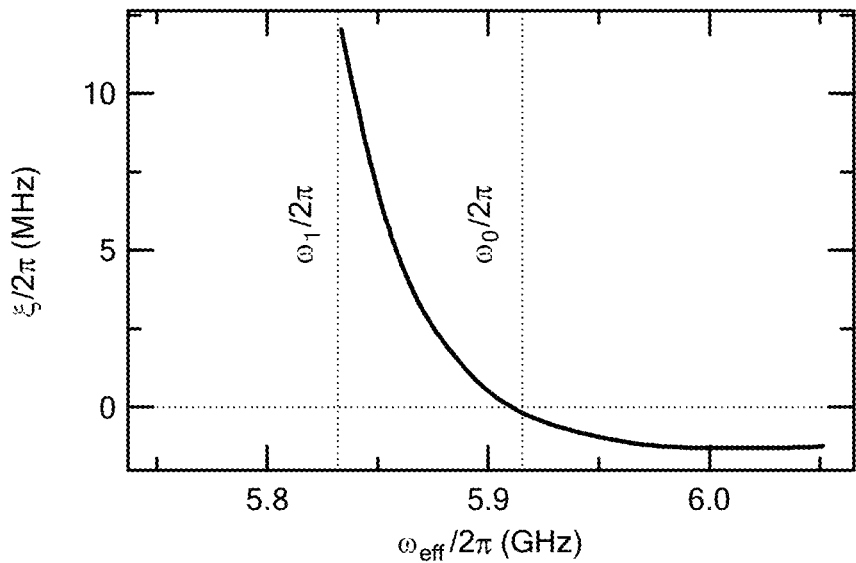
FIG. 21b shows ZZ interaction as a function of drive frequency.

We find $\omega_x/2\pi = 5.832$ GHz and $\Delta_x = \Delta(\omega_x) \approx 42.5$ MHz, as indicated in FIG. 21a. In addition, FIG. 21b shows the ZZ interaction as a function of effective drive frequency. Dashed vertical lines represent the selected boundary conditions $\omega_0$ and $\omega_1$ for the frequency chirp. We choose the initial frequency $\omega_0/2\pi = 5.915$ GHz making sure that the ZZ interaction at this frequency does not counteract the gate operation in the range $\Omega \in [\Omega_0, \Omega_1]$. In this case, the ZZ coupling is vanishing small at $\omega_0$ and in the range $\Omega \in [\Omega_0, \Omega_1]$. However, it can more generally be used to fine-tune the total conditional phase if nonzero. Next, we choose $\omega_1 = \omega_x$, for which the ZZ interaction reaches about 12 MHz.

Figure 21C:
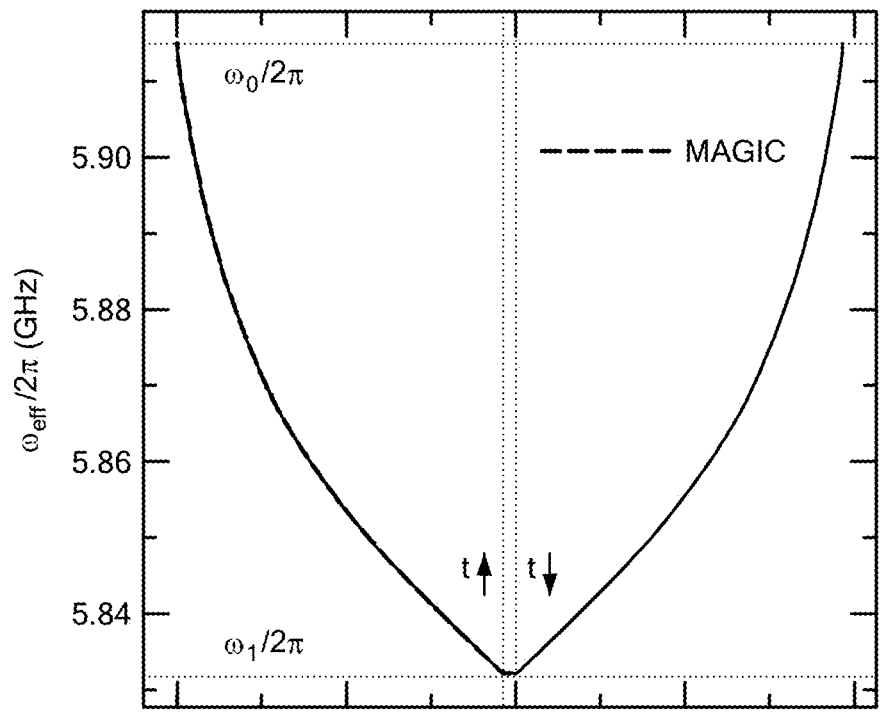
FIG. 21c shows the effective frequency pulse.
Figure 21D:
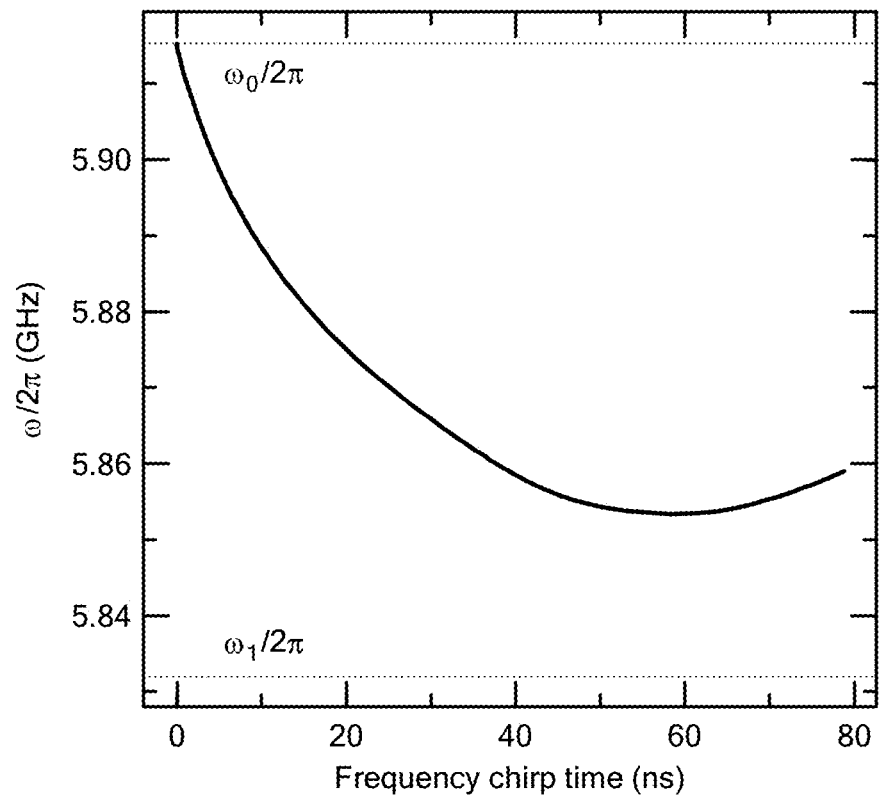
FIG. 21d shows instantaneous drive frequency derived from Eq. (31) for the pulse in FIG. 21c.

We calculate a MAGIC pulse schedule for the first frequency chirp $\omega_0 \to \omega_1$, that we show in FIG. 21c (dashed vertical line). The rise time $t_\uparrow$ is chosen such that Eq. (30) is satisfied, and then numerically optimized to minimize leakage outside the computational space defined by the drive parameters ($\Omega_1$, $\omega_1$) and $t_\uparrow$. We compute the conditional phase $\varphi_{01}$ accumulated during this pulse by integrating the quasienergies as a function of time. Then, we estimate the hold time $t_{flat}$ required to implement a controlled-phase gate, according to $\xi[\omega_1] t_{flat} \approx \pi - 2\varphi_{01}$. We optimize this parameter further using time-domain simulations to target $\Omega = \pi$ accurately, arriving at $t_{flat} \approx 1.7$ ns. The MAGIC pulse is then time-reversed and concatenated with the rise and hold sections of the frequency chirp.

The complete pulse schedule for $\omega_{eff}(t)$ is used in Eq. (31) to obtain the instantaneous drive frequency $\omega(t)$, shown in FIG. 21d. Contrary to $\omega_{eff}(t)$, $\omega(t)$ is not symmetric with respect to $(t_\uparrow + t_\downarrow)/2$, as one might expect. This is one of the very unique and interesting facts associated with this gate.

Figure 21E:
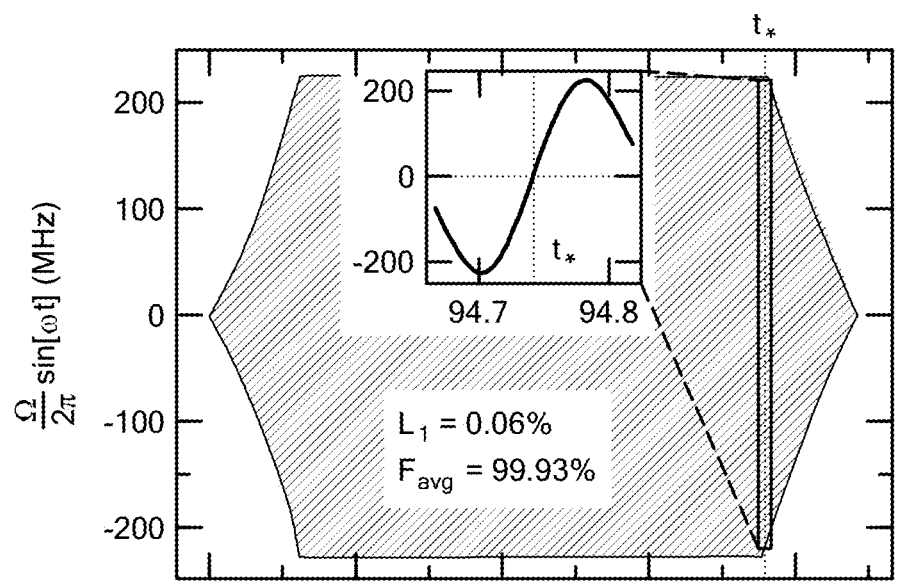
FIG. 21e shows a complete (envelope and carrier) frequency-adiabatic pulse schedule as a function of time.
Figure 21F:
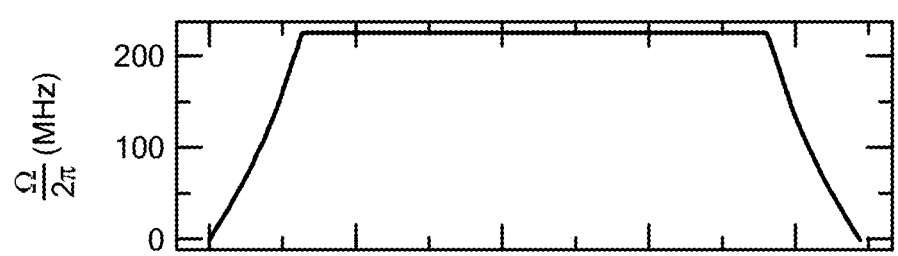
FIGS. 21f-21g show drive amplitude and instantaneous drive frequency, respectively, as a function of time for the complete pulse schedule of FIG. 21e.
Figure 21G:
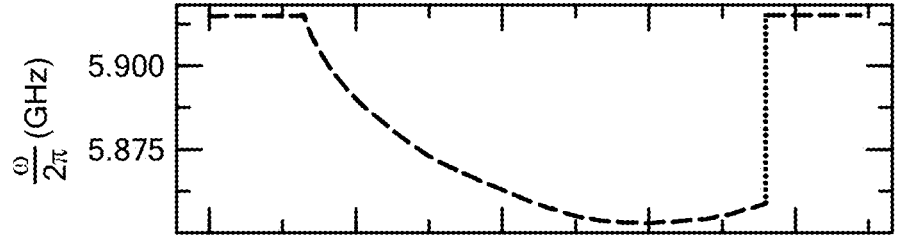

FIG. 21e shows the complete pulse schedule for the two-qubit gate. The schedule is comprised of the amplitude-modulated pulse in FIG. 21f and the frequency-modulated pulse in FIG. 21g. We show leakage and average gate fidelity obtained from a unitary time-domain simulation of the two-qubit gate. The inset shows a thin slice of the waveform around the time $t_*$, where the instantaneous drive frequency is discontinuous. The inset shows the waveform around $t = t_*$, where the instantaneous frequency is discontinuous: while the drive phase remains continuous, its slope as a function of time is different as $t \to t_*$ for $t < t_*$ or $t > t_*$. The amplitude-adiabatic waveform in f is a MAGIC pulse designed using the methods described in previous sections. The time for the process $\Omega_0 \to \Omega_1$ is chosen such that leakage is minimized to a level comparable to that of the frequency chirp. The total gate time is approximately 120 ns, 80 ns corresponding to the frequency chirp and 30 ns corresponding to the amplitude-modulated pulse.

Figure 21H:
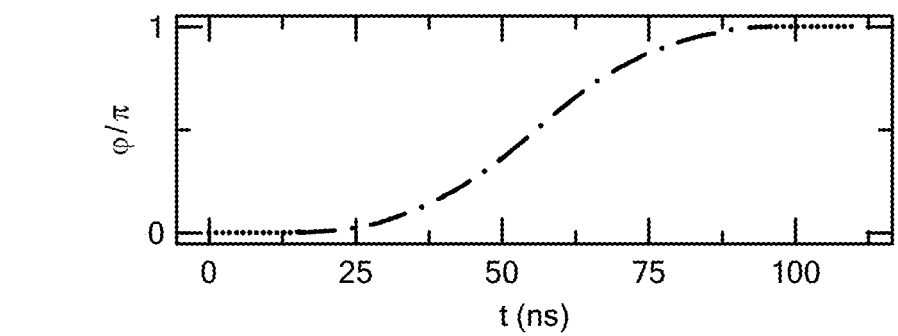
FIG. 21h shows controlled phase accumulated as a function of time.

Finally, FIG. 21h shows the conditional phase accumulated as a function of time, as estimated from the quasienergy spectrum. The conditional phase accumulated during the frequency chirp is represented by a full line. The contribution of the amplitude-modulate pulses to $\varphi$ (dotted line) is negligible due to a vanishing small ZZ coupling strength at $\omega_0$. The complete pulse achieves a unitary average-gate-fidelity of 99.93% up to single-qubit-Z rotations, limited by leakage $L_1$=0.06%. Indeed, we find that the fidelity of frequency-adiabatic two-qubit gates can exceed than 99.9% for realistic circuit parameters, just as often as their counterpart based on drive-amplitude modulation. We discuss the impact of dissipation on the gate fidelity next, but we do so in the context of a system where the coupler drive is always-on.

We now demonstrate that frequency chirps are especially useful for engineering two-qubit gates in the presence of always-on drives. In particular, we focus on the case where a coupler drive is used to suppress spurious two-qubit interactions when the qubits idle. More generally, however, our simulations suggest that frequency modulation can be a versatile tool for Floquet-qubit control. In this connection, FIGS. 22*a-e* show a drive-frequency adiabatic two-qubit gate for Floquet-transmon qubits.

Figure 22A:
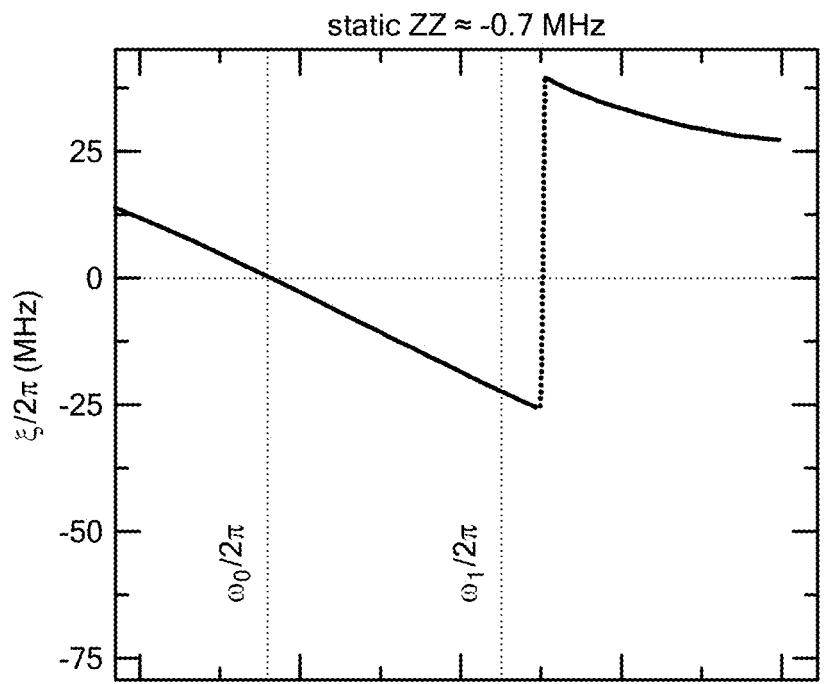
FIG. 22a shows ZZ interaction as a function of drive frequency for $\Omega_0/2\pi=\Omega_1/2\pi=225$ MHz.
Figure 22B:
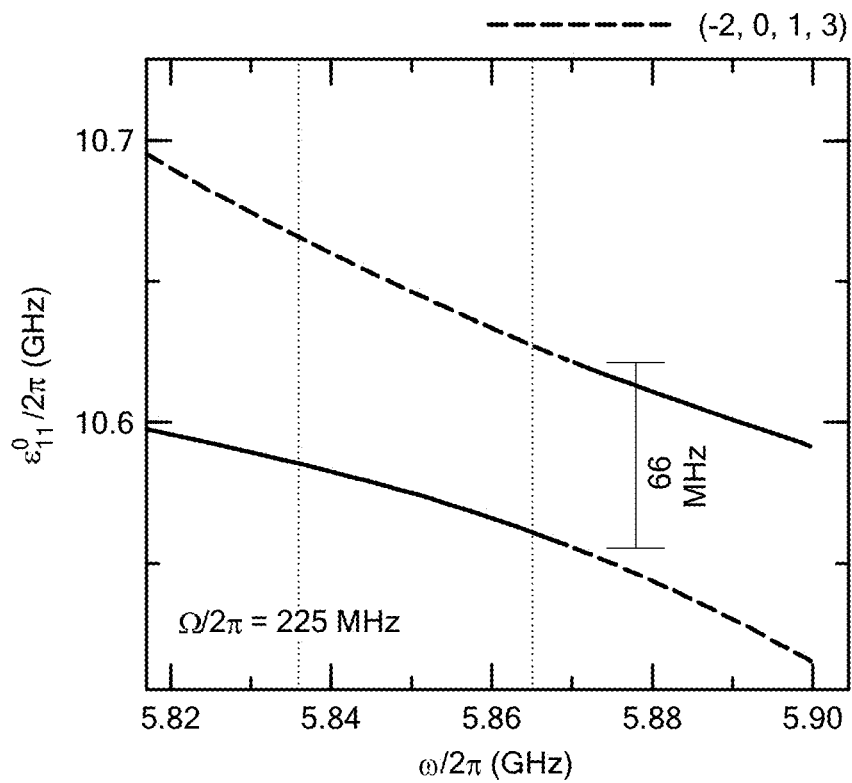
FIG. 22b shows anticrossing between computational (0,1,1,0) and noncomputational (-2,0,1,3) levels of the extended Hilbert space.
Figure 22C:
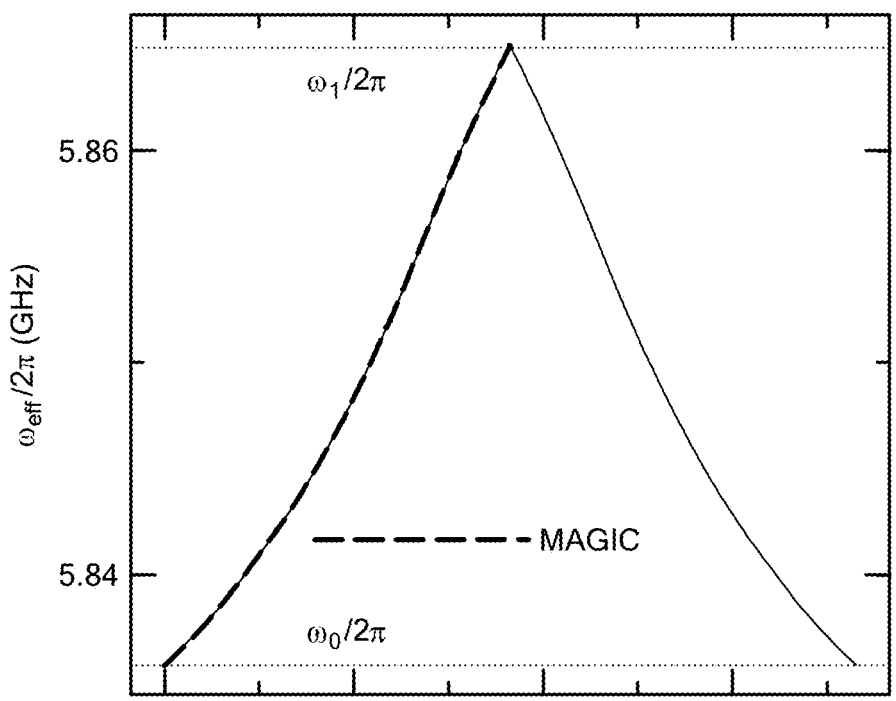
FIG. 22c shows MAGIC pulse for the effective drive frequency.
Figure 22D:
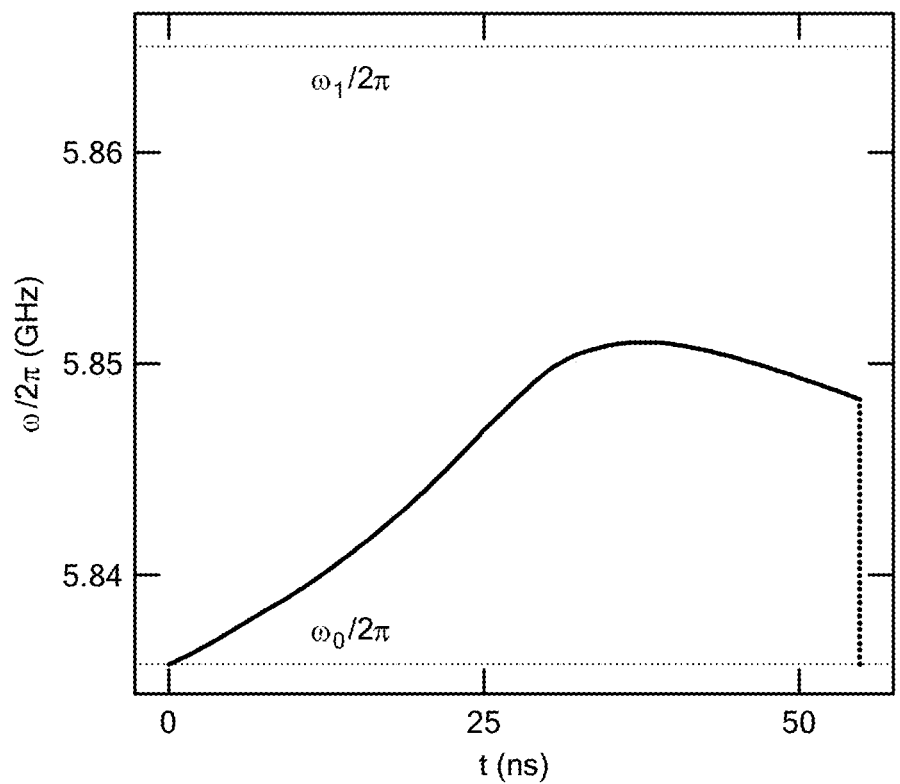
FIG. 22d shows instantaneous drive frequency corresponding to the pulse in FIG. 22c.

To explore this application, we set the coupler frequency at $\omega_c/2\pi$=6.0 GHz (see FIG. 15*b*), where the static ZZ interaction is approximately −0.7 MHz. Because this spurious interaction would be highly detrimental in a real quantum processor, we use a microwave drive on the coupler to counteract the static ZZ coupling. We find that a drive tone of frequency $\omega_0/2\pi$=5.836 GHz and amplitude $\Omega/2\pi$=225 MHz is a possible condition for zero ZZ coupling, as shown in FIG. 22*a*. Because this relatively strong drive is always-on, the coupled transmon qubits are better thought of as Floquet qubits.

The ZZ coupling has a strong dispersion against drive frequency, with a magnitude exceeding 20 MHz. This is mainly due to an anticrossing between the computational state $|\Phi_{110}\rangle$ and the noncomputational state $|\Phi_{0123}\rangle$ shown in FIG. 22*b*. Using Eq. (32), we determine the frequency $\omega_x/2\pi$=5.870 GHz and the size $\Delta_x/2\pi \approx$65.8 MHz of the anticrossing.

We leverage the dispersion of the ZZ coupling with drive frequency to perform a fast two-qubit gate using frequency modulation only. We engineer the frequency chirp to obey the boundary conditions $\omega_0$ and $\omega_1/2\pi$=5.865 GHz=$\omega_x+\delta_x$, for which the ZZ interaction reaches about −22.4 MHz. Here, we incorporate a small detuning $\delta_x$=5 MHz with respect to $\omega_x$, to be used as an additional parameter for the pulse. We derive a MAGIC pulse schedule for the effective-drive-frequency chirp $\omega_0 \rightarrow \omega_1$, which we concatenate with its time-reverse version to obtain the complete $\omega_{eff}(t)$ pulse shown in FIG. 22*c*. We use $\delta_x$ to adjust the total conditional phase accumulated during the pulse to $\varphi=\pi$, while ensuring the leakage-cancellation condition in Eq. (30). We show the instantaneous drive frequency according to Eq. (31) in FIG. 22*d*. Thanks in part to the large ZZ interaction, and the fact that no amplitude modulation is needed in this case, the resulting MAGIC pulse schedule is much shorter than the one shown in FIG. 21.

Figure 22E:
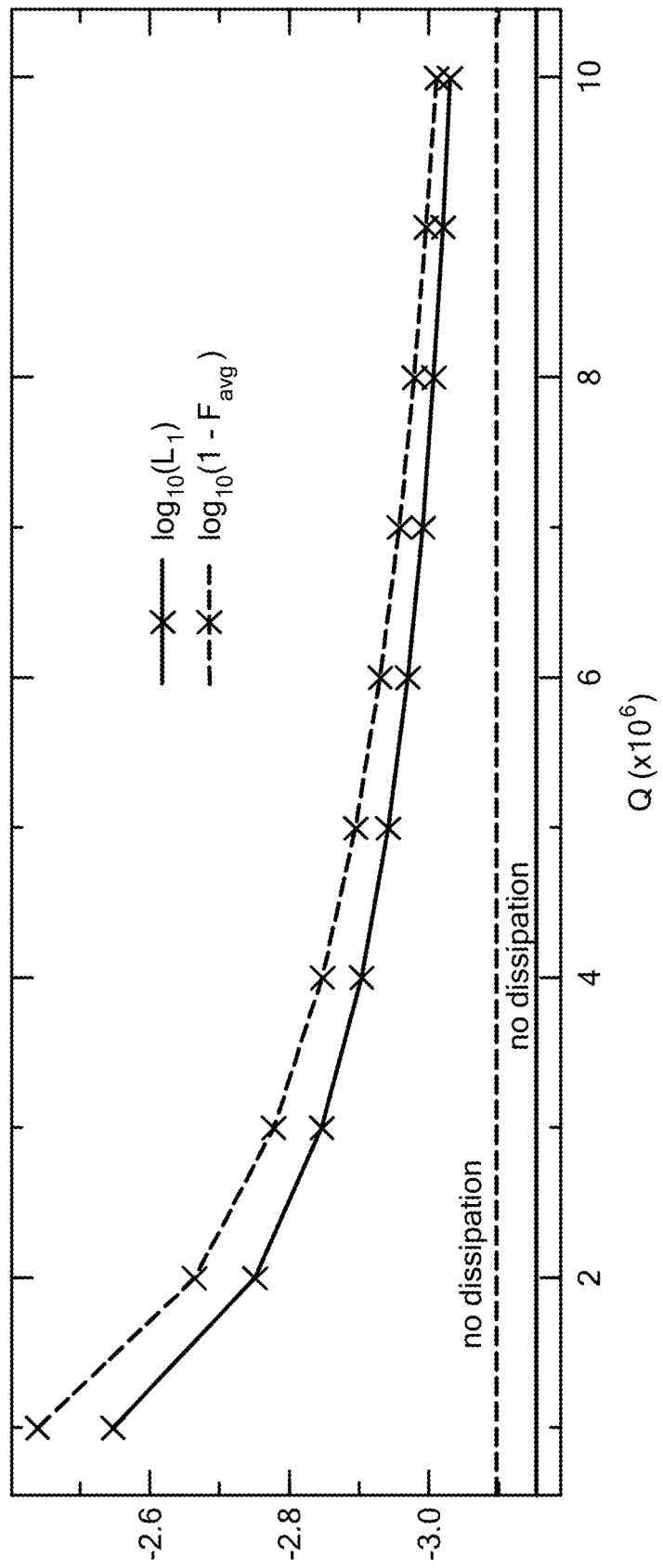
FIG. 22e shows leakage $L_1$ and average gate fidelity $F_{avg}$ as a function of capacitive quality factor Q.

Next, we perform time-domain simulations of the pulse schedule, finding a unitary average-gate-fidelity of $F_{avg}$=99.92%, limited by leakage $L_1$=0.07%. Because the coupler frequency is not fine-tuned to achieve zero static ZZ, we now assume that the coupler is a $T_1$-limited fixed-frequency transmon. FIG. 22*e* shows leakage and average gate fidelity as a function of capacitive quality factor Q for all modes. In this Figure, the dashed lines represent the respective results in absence of dissipation. Despite a short two-qubit gate duration of approximately 55 ns, the gate fidelity reaches 99.9% for relatively high Q (corresponding to 200-300 μs $T_1$ times) according to our Lindblad master equation. This is, however, reasonable because the two-qubit gate leverages a two-photon transition between a computational state and the higher excited state $|\Phi_{013}\rangle$ that involves the third level of the coupler. Limitations to the gate fidelity that arise from dissipation can be mitigated choosing other possible transitions to engineer the gate. Ideally, the operating condition ($\Omega_0$, $\omega_0$) should also take into account the impact of dissipation in the presence of always-on drives, and leverage sweet spots in drive amplitude and frequency, when possible.

We conclude this section by discussing some of the technical and implementation particularities of frequency-modulated pulses.

Due to spurious m-photon transitions with m>>1, frequency chirps spanning a large frequency bandwidth could be challenged by the presence of multiple anticrossings in the range [$\omega_0$, $\omega_1$)]. However, because the effective coupling between computational and noncomputational levels quickly decreases as m increases, typical pulse times in the order of tens of nanoseconds result in largely diabatic transitions across spurious anticrossings. Indeed, even in such cases, we find that average gate fidelities beyond 99.9% are still possible, and conclude that these spurious interactions do not significantly impact gate performance in practice. Ultimately, however, the presence of spurious resonances can be taken into account when choosing the operating frequency and the boundary conditions for the frequency chirp.

In addition, we briefly discuss some of the experimental implementation details of frequency chirps. Because the frequency modulation in FIGS. 21 and 22 is only of tens of MHz, these pulses could be realized by single sideband mixing of a 1 GHz-bandwidth arbitrary waveform generator (AWG) with a microwave source. This corresponds to standard microwave control electronics for superconducting qubits. However, direct-digital synthesis using AWGs of higher bandwidth would be a better solution, allowing us to jointly specify the pulse envelope and drive phase at all times. Known works using frequency chirps in circuit QED for other applications discuss implementation aspects in greater detail.

To the best of our knowledge, two-qubit gates based on frequency modulation have not been previously considered in the literature. Furthermore, these gates feature distinctive properties, such as a discontinuous instantaneous drive frequency, which have not been discussed elsewhere either. We have addressed quantum control of frequency-modulated interactions in detail, numerically demonstrating that two-qubit gates based on frequency chirps are a viable architectural choice. We speculate that multi-photon processes and frequency chirps could become increasingly useful to mitigate frequency crowding and coherent errors in future quantum processors with steadily increasing qubit coherence.

Finally, it is worth mentioning that extensions of the proposed two-qubit gate leveraging simultaneous drive amplitude and frequency modulation and nonzero geometric phases are also possible.

Extensibility Analysis

In previous sections, we discussed the engineering of microwave two-qubit interactions and high-fidelity two-qubit control. However, in a device with more than two qubits, the two-qubit gate fidelity can be limited by spurious interactions with neighboring qubits, also referred to as spectator qubits.

In a multi-qubit setup, the qubit, coupler and drive frequencies are chosen to minimize the impact of spectator qubits while maximizing the desired interactions. A circuit-QED architecture is extensible if it can accommodate a large number of qubit modes without sacrificing the average two-qubit gate fidelity between all pairs of neighboring qubits.

We now study the extensibility of the proposed architecture, dividing the subject into two parts. First, we address the frequency allocation problem for our architecture. In short, our approach seeks to determine mode and drive frequencies such that coherent errors are suppressed in a multi-qubit lattice. We tackle this problem using perturbation theory. Second, we qualitatively discuss the extension of quasiadiabatic microwave control to the multi-qubit setting.

Frequency allocation in a multi-qubit chip with driven interactions has been theoretically studied in the prior art for the cross-resonance and the controlled-phase gates based on direct capacitive coupling. These works use a predetermined list of frequency collisions and an optimizer to distribute qubit frequencies such that unwanted resonances are avoided to a desired tolerance. The problem is highly constrained and rarely leads to globally optimal solutions. This is mainly due to a finite frequency bandwidth for qubit placement and competing requirements for fast two-qubit gates and reduced spurious couplings.

Using perturbation theory, we develop an alternative approach that systematically accounts for similar frequency constraints, with and without a microwave drive. We take advantage of the approximate decoupling between static and driven interactions in the proposed architecture, and optimize the parameters using a two-step process. The frequencies of the qubit and coupler modes are chosen first to minimize undesired static ZZ couplings. The drive frequencies for the two-qubit gates are selected in a second step, maximizing desired gate interactions over undesired drive-activated spectator-qubit effects.

Figure 23A:
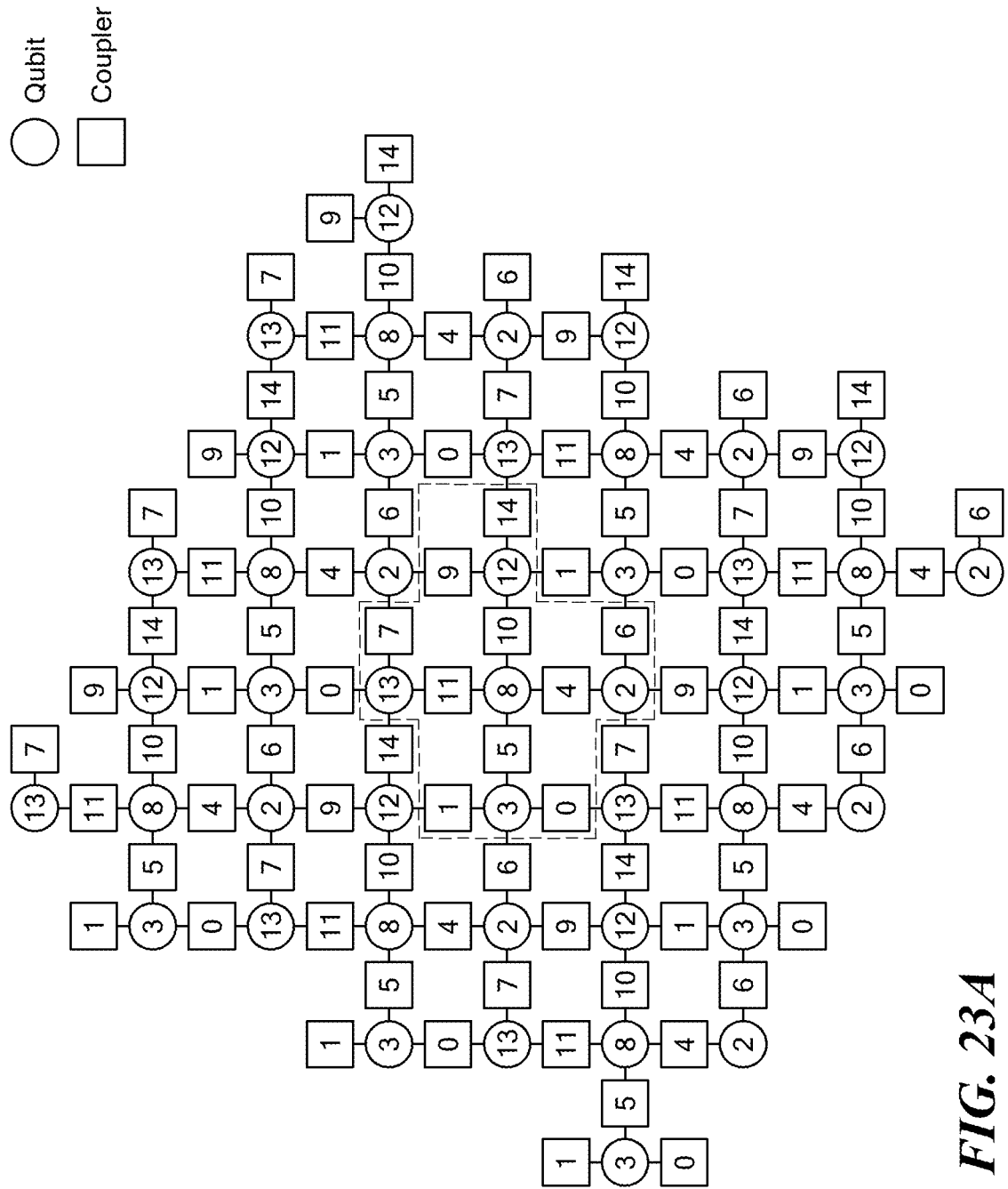
FIG. 23a shows a full-device model of a multi-qubit processor having a unit cell characterized by the Manhattan distance $d_{UC}=3$.

To simplify the problem, we define a unit cell with a fixed number of qubits and couplers that repeats itself multiple times in a full-scale, multi-qubit quantum processor. An example is shown in FIG. 23a, where qubits (respectively couplers) are represented by circles (respectively squares), and labelled according to their frequency. The unit cell is defined by the minimum Manhattan (i.e. "city block") distance between two qubits or couplers with the same frequency, $d_{UC}$. This parameter determines the number of qubits ($[d_{UC}^2/2]$), couplers ($2[d_{UC}^2/2]$), and total modes ($3[d_{UC}^2/2]$) in the unit cell.

We consider direct coupling between adjacent qubits and couplers, and spurious next-neighbor couplings representing circuit-element disorder. Furthermore, our unit-cell Hamiltonian with periodic boundary conditions includes fictitious couplings of higher connectivity, which model the additional interactions that appear at the boundary of the unit cell in a full-scale chip (see FIG. 23a). Optimizing the unit-cell frequency layout with these additional links makes the result extensible to a device with an arbitrary number of qubits. For concreteness, we now focus on $d_{UC}=3$ with a total of 15 modes.

As previously explained, we model all circuit modes as Kerr nonlinear oscillators with frequencies $\{\omega_\mu\}$ and anharmonicities $\{\alpha_\mu\}$. For simplicity, we assume uniform first-neighbor (qubit-coupler) coupling $J_1$ and next-neighbor (qubit-qubit and coupler-coupler) coupling $J_2$. We also consider a single coupler the drive amplitude is $\Omega$, and we work in a frame rotating at the drive frequency $\omega$.

In what follows, we assume that the couplings $J_1$ and $J_2$ are given, and optimize over the mode parameters and the drive frequencies. To make sure that the perturbative result is accurate, we work with moderate coupling parameters $J_1/2\pi=50$ MHz, $J_2=2$ MHz, and drive strength $\Omega/2\pi=50$ MHz. We consider a total frequency bandwidth for the qubit and coupler modes of 1.5 GHz, and anharmonicities in the range of (−350, −250) MHz.

We write the unit-cell Hamiltonian $\hat{H}=\hat{H}^0+\eta\hat{V}$ as before, where $\hat{H}^0$ denotes the noninteracting part. Once the interaction $\eta\hat{V}$ is turned on, the self-energies associated with the computational eigenstates are approximated to second (respectively leading) order in the couplings (respectively drive amplitude). In the limit where the self-energy $\Sigma_\alpha$ of a computational state $|\Phi_\alpha\rangle$ is much smaller than the detunings $\epsilon_\alpha^0-\epsilon_\beta^0$, where $\beta$ labels labels a noncomputational state, the self-consistent nature of Eq. (4) can be simplified by omitting the self-energy from all denominators in that expression. In this approximation, a two-level truncation near the resonance $\epsilon_\alpha^0-\epsilon_\beta^0\to 0$ leads to the dispersive form for the self-energy $\Sigma_\alpha\approx|G_{\alpha\beta}|^2/(\epsilon_\alpha^0-\epsilon_\beta^0)$, where $$G_{\alpha\beta} = \sum_{k=1}\sum_{\alpha_1,\ldots,\alpha_k} \langle\Phi_\beta^0|\eta\hat{V}|\Phi_{\alpha_1}^0\rangle\frac{\langle\Phi_{\alpha_1}^0|\eta\hat{V}|\Phi_{\alpha_2}^0\rangle}{\epsilon_\alpha^0-\epsilon_{\alpha_1}^0}\ldots \frac{\langle\Phi_{\alpha_k}^0|\eta\hat{V}|\Phi_\alpha^0\rangle}{\epsilon_\alpha^0-\epsilon_{\alpha_k}^0}, \quad (33)$$

is the virtual interaction rate between the eigen-states $|\Phi_\alpha^0\rangle$ and $|\Phi_\beta^0\rangle$ of the bare Hamiltonian $\hat{H}^0$. Here, we assume that $|G_{\alpha\beta}|$ is small compared to $|\epsilon_\alpha^0-\epsilon_\beta^0|$. We use this simplified expression to compute the self-energies of computational states in the unit cell.

Our two-step frequency optimization seeks to: i) minimize the static ZZ interaction between all pairs of qubits, ii) minimize drive-activated ZZ interactions on spectator qubits, iii) maximize desired two-qubit gate rates. The cost function also incorporates the dispersive-coupling ratios $v_{\alpha\beta}=|G_{\alpha\beta}/(\epsilon_\alpha^0-\epsilon_\beta^0)|$, where $\alpha$ and $\beta$ are computational and noncomputational states, respectively. Because the excitation number is constant in the absence of a drive and under a rotating-wave approximation, we estimate the static ZZ interaction taking into account states with up to two excitations. However, we consider computational (noncomputational) states with up to two (three) excitations in the presence of a drive.

Figures 23B, 23C:
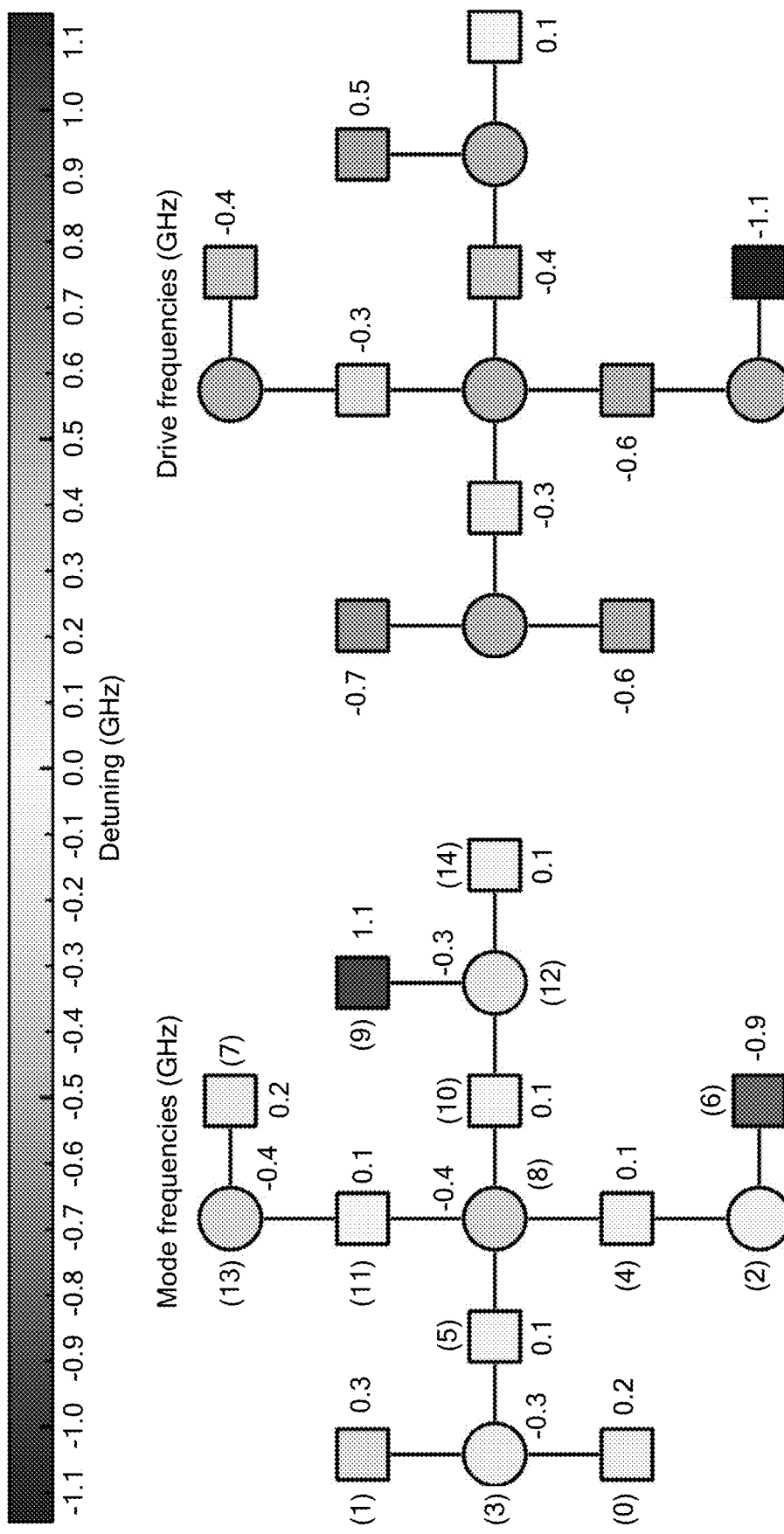
FIG. 23b shows example mode frequencies that minimize the static ZZ interaction between all pair of qubits in the chip.
FIG. 23c shows example drive frequencies that minimize the impact of a coupler drive on spectator qubits.
Figure 23D:
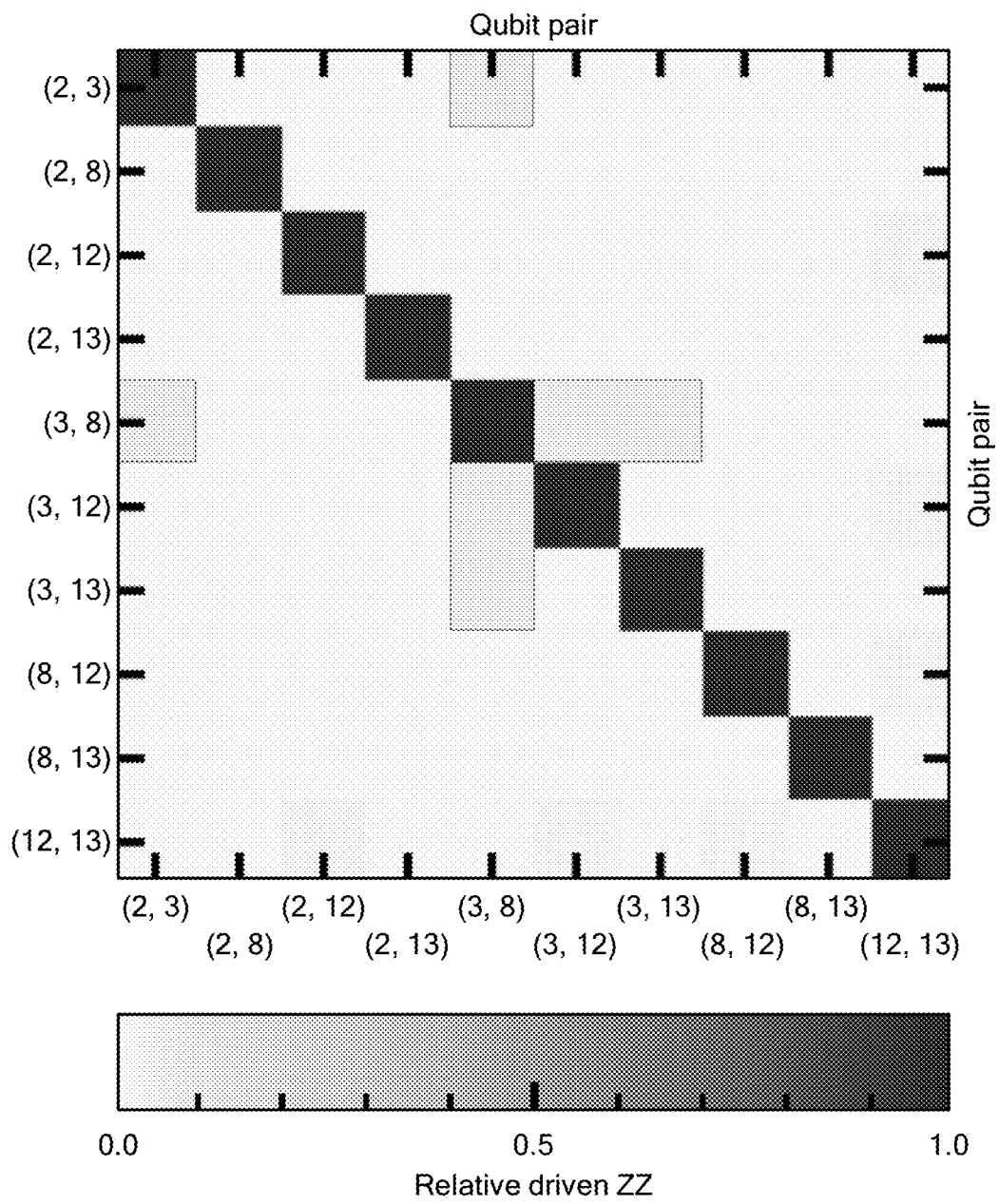
FIG. 23d shows relative two-qubit gate (diagonal) and spurious (off-diagonal) drive-activated ZZ interactions for all pair of qubits in the unit cell.

We begin by generating several frequency layouts as independent initial conditions for the optimizer. At this point, the qubits and couplers anharmonicities are −300 MHz and −350 MHz, respectively. Next, we optimize these frequency layouts independently using a least-squares algorithm. The optimization is done over the mode frequencies and anharmonicities. The cost function incorporates penalties to ensure that both the dispersive-coupling ratios and the ZZ interaction between any pair of qubits are below the chosen bounds of 0.05 and 20 kHz, respectively. The result of a typical optimizer run is shown in FIG. 23b. The mode frequencies are shown as detunings with respect to an arbitrary common frequency. We find that the static ZZ interaction lies below the desired bound for all pairs of qubits.

Each pair of qubits offers many potential operating points for the two-qubit gate, depending on the drive frequency. However, not all resonances are equivalent when it comes to minimizing the impact of the coupler drive on neighboring qubits. We evaluate these effects by taking into account all possible single- and two-photon resonances for a given pair of qubits, and computing the driven ZZ interaction for any other qubit pair in the device.

More precisely, our cost function incorporates: i) the driven ZZ interaction between the qubits that participate of the two-qubit gate, ii) the ratio between the driven ZZ interaction for other pair of qubits and that calculated in i), and iii) the ratios vP for qubits that do not participate of the gate. The cost is evaluated for all coupler-drive frequencies corresponding to a transition between a computational and a noncomputational state of a specific two-qubit pair, and then added up for all pair of neighboring qubits in the device. While information in i-iii) is somewhat redundant, we find that partitioning the cost function in this way gives us enough flexibility for the optimization.

A typical optimization result is provided in FIG. 23c. There, the drive frequency is shown as a detuning with respect to the respective coupler frequency defined in the previous step. Furthermore, panel d shows the relative driven ZZ interaction for all pair of qubits. A diagonal matrix element in this plot corresponds to the normalized gate interaction between a pair of qubits (i,j) connected by a driven coupler mode. In the row associated with (i,j), off-diagonal matrix elements represent undesired two-qubit couplings between other pair of qubits (i',j'), activated by the drive on the coupler mode that connects (i,j). These spurious couplings are shown normalized with respect to the (i,j) interaction rate.

In practice, the results from perturbation theory should be complemented by numerical simulations of a more elaborate circuit model, including simultaneous drives and potentially larger couplings and drive strengths. While a side-by-side comparison against other transmon-based architectures is outside the scope of this work, we expect our setup to allow for comparable or larger extensibility with respect to other all-microwave architectures. The results of this section are a first step towards building a full-scale processor based on our architecture.

We conclude our extensibility analysis with a qualitative description of quasiadiabatic multi-qubit microwave control. We consider a system of K superconducting qubits subject to D microwave drives. Following the derivation above, we group the drive phases and parameters in the vectors $\theta(t) = (\theta_1, \theta_2, \ldots, \theta_D)^T$ and $\Omega(t)$, respectively, such that the system Hamiltonian [see Eq. (9)] becomes $$\hat{H}(\hat{\phi}, \hat{n}, t) = \hat{H}_s(\hat{\phi}, \hat{n}) + \hat{H}_{drive}[\hat{\phi}, \hat{n}, \Omega(t), \theta(t)]. \tag{34}$$

Next, we promote the drive-phase variables to a vector operator $\theta(t) \to \hat{\vartheta}$, with conjugate momenta $\hat{m} = -i\hat{\nabla}_\vartheta$. With these definitions, the effective Hamiltonian in Eq. (11) takes the form $$\hat{H}_{eff}(\hat{\vartheta}, \hat{m}, \hat{\phi}, \hat{n}, t) = \hat{H}(\hat{\phi}, \hat{n}, t) + \hbar\omega_{eff}(t) \cdot \hat{m}, \tag{35}$$

where $\omega_{eff}(t) = \dot{\theta}(t)$ groups the effective drive frequencies.

The expanded-space wavefunction in Eq. (10) and the prescription in Eq. (12) can be straightforwardly extended to more than one dimension. Using that $(2\pi)^{-D}\int d^D\vartheta |\vartheta\rangle = |0\rangle$ and $\langle \varepsilon | = \Sigma_m e^{i\vartheta \cdot m} \langle m|$, where $|m\rangle$ are the eigenstates of $\hat{m}$, we arrive at the propagator $$\mathcal{U}(t) = \tag{36}$$

$$\sum_{\alpha, m, m'} \langle m' - m | \Psi_\alpha^0[\lambda(t)]\rangle\langle\Psi_\alpha^0[\lambda(0)] | -m\rangle \times e^{i\theta(t) \cdot m'} e^{-i\int_0^t \varepsilon_\alpha^m[\lambda(t')]dt'},$$

where $|\Psi_\alpha^m[\lambda(t)]\rangle$ and $\varepsilon_\alpha^m[\lambda(t)]$ are the parametric eigenstates of Eq. (34), and $\lambda(t) = [\Omega(t), \omega_{eff}(t)]^T$. This expression is the generalization of the single-drive result in Eq. (16).

The K-qubit Floquet-mode basis $\{|u_\alpha[\theta(t)]\rangle\}$ with $\alpha \in \{0, 1\}^K$ defines the multi-qubit computational basis. A gate operation from time t0 to t1 implements a unitary map between the bases $\{|u_\alpha[\theta(t_0)]\rangle\}$ and $\{|u_\alpha[\theta(t_1)]\rangle\}$. If such an operation is performed in a nonadiabatic fashion, then multi-qubit control must explicitly account for the instantaneous phases of the microwave drives. Nonadiabatic microwave control requires to track all drive phases, and to potentially introduce phase delays (frequency chirps) to synchronize the logical subspace with independently calibrated waveforms for single- and two-qubit gates.

Figure 24:
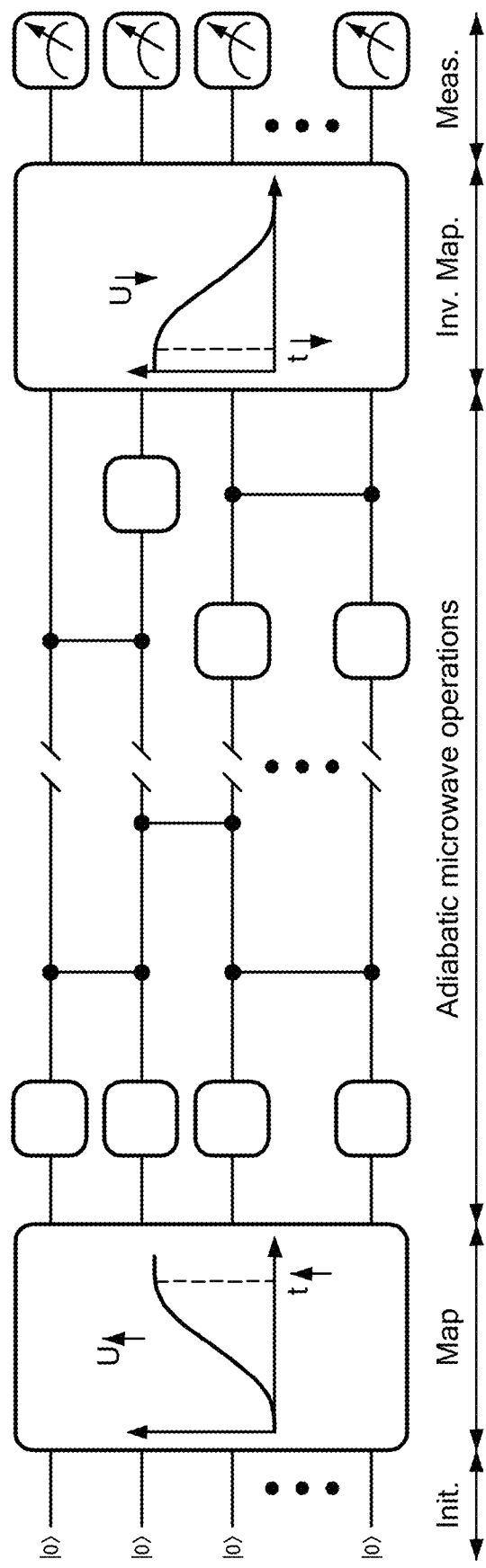
FIG. 24 shows a quantum computation with several driven qubit modes and quasiadiabatic microwave operations.

At the expense of longer gate times, quasiadiabatic microwave control could help mitigating these fine-tuning conditions, for the reasons that we have previously discussed. In a full-scale chip, adiabatic initialization and readout would also be necessary. Thus, illustratively, FIG. 24 shows a quantum computation with several driven qubit modes and quasiadiabatic microwave operations. For initialization (Init. and Map.), an eigenstate of the static Hamiltonian is adiabatically connected to a Floquet mode of the driven Hamiltonian by a slow rise of the drive amplitudes. For readout (Inv.Map. and Meas.), a state specified in the Floquet-mode basis at time t is adiabatically connected to an equivalent superposition of the static Hamiltonian eigenstates by a slow fall of the drive amplitudes.

One can picture the adiabatic limit using the framework of analog quantum computation: The multi-qubit dynamics follow the slow change of the drive parameters in Eq. (35), leading to digital gate operations on the multi-qubit state at specific times during the pulse schedule.

CONCLUSION

In summary, we introduced a circuit-QED architecture that leverages an amplitude- and frequency-modulated microwave drive applied on a coupler mode to perform two-qubit gates and mitigate coherent errors. To characterize the two-qubit interaction, we developed a version of perturbation theory that accurately captures drive-amplitude-dependent frequency shifts of the computational states. We compared the perturbative result against Floquet numerics, finding an excellent agreement between these two estimations for large coupling strengths and drive amplitudes. Using a parametric version of Floquet theory, we described the working principles of controlled-phase gates based on drive amplitude and frequency modulation. We introduced a pulse-shaping technique to engineer low-leakage two-qubit-gate pulse schedules by incorporating the details of the Floquet Hamiltonian, with relatively low added control complexity. We performed numerical simulations of the proposed two-qubit gates using the full-circuit Hamiltonian and including dissipation, demonstrating that the average gate fidelity can exceed 99.9% for realistic circuit parameters. Finally, we discussed how our two-qubit-gate theory extends to multi-qubit setups. More precisely, we addressed the problem of frequency allocation for this architecture, and multi-qubit control in the presence of always-on microwave drives.

Our work introduces a number of technical developments which expand the microwave-control toolbox for superconducting qubits. Because of the generality of our approach, these techniques are readily applicable to other circuit-QED setups based on drive-activate interactions and/or stabilized Floquet modes.

In illustrative implementations of the concepts described herein, one or more computers (e.g., integrated circuits, microcontrollers, controllers, microprocessors, processors, field-programmable-gate arrays, personal computers, onboard computers, remote computers, servers, network hosts, or client computers) may be programmed and specially adapted: (1) to perform any computation, calculation, program or algorithm described or implied above; (2) to receive signals indicative of human input; (3) to output signals for controlling transducers for outputting information in human perceivable format; (4) to process data, to perform computations, to execute any algorithm or software, and (5) to control the read or write of data to and from memory devices. The one or more computers may be connected to each other or to other components in the system either: (a) wirelessly, (b) by wired or fiber optic connection, or (c) by any combination of wired, fiber optic or wireless connections.

In illustrative implementations of the concepts described herein, one or more computers may be programmed to perform any and all computations, calculations, programs and algorithms described or implied above, and any and all functions described in the immediately preceding paragraph. Likewise, in illustrative implementations of the concepts described herein, one or more non-transitory, machine-accessible media may have instructions encoded thereon for one or more computers to perform any and all computations, calculations, programs and algorithms described or implied above, and any and all functions described in the immediately preceding paragraph.

For example, in some cases: (a) a machine-accessible medium may have instructions encoded thereon that specify steps in a software program; and (b) the computer may access the instructions encoded on the machine-accessible medium, in order to determine steps to execute in the software program. In illustrative implementations, the machine-accessible medium may comprise a tangible non-transitory medium. In some cases, the machine-accessible medium may comprise (a) a memory unit or (b) an auxiliary memory storage device. For example, in some cases, while a program is executing, a control unit in a computer may fetch the next coded instruction from memory.

As used herein, "including" means including without limitation. As used herein, the terms "a" and "an", when modifying a noun, do not imply that only one of the noun exists. As used herein, unless the context clearly indicates otherwise, "or" means and/or. For example, A or B is true if A is true, or B is true, or both A and B are true. As used herein, "for example", "for instance", "e.g.", and "such as" refer to non-limiting examples that are not exclusive examples. The word "consists" (and variants thereof) are to be give the same meaning as the word "comprises" or "includes" (or variants thereof).

The above description (including any attached drawings and figures) illustrate example implementations of the concepts described herein. However, the concepts described herein may be implemented in other ways. The methods and apparatus which are described above are merely illustrative applications of the principles of the described concepts. Numerous modifications may be made by those skilled in the art without departing from the scope of the disclosed embodiments. Also, the described concepts includes without limitation each combination, sub-combination, and permutation of one or more of the abovementioned implementations, embodiments and features.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the specification to modify an element does not by itself connote any priority, precedence, or order of one element over another or the temporal order in which acts of a method are performed, but are used merely as labels to distinguish one element having a certain name from another element having a same name (but for use of the ordinal term) to distinguish the elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter.

Accordingly, although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

We claim:

1. A system comprising:
   a first qubit associated with a first resonant frequency;
   a second qubit associated with a second resonant frequency;
   a qubit coupler inductively or capacitively coupling the first qubit to the second qubit according to a ZZ interaction strength; and
   a microwave driver for driving the qubit coupler with microwaves according to a driver power and a third driver frequency that is different than the first resonant frequency and the second resonant frequency,
   wherein the microwave driver is configurable to selectively increase or decrease the ZZ interaction strength, and
   wherein the microwave driver is configurable to reduce spurious interactions between the first qubit and the second qubit by selectively decreasing the ZZ interaction strength, and
   wherein the microwave driver is configurable to form a two-qubit gate by selectively increasing the ZZ interaction strength, and
   wherein the microwave driver is configurable for selectively tuning to obtain a given leakage rate, or a given gate speed, or a balance between a leakage rate and a gate speed.

2. The system of claim 1, wherein either the first qubit or the second qubit comprises a fixed-frequency transmon, or a tunable-frequency transmon, or a fluxonium.

3. The system of claim 1, wherein the qubit coupler comprises a split-transmon, an inductively-shunted transmon, or a fluxonium.

4. The system of claim 1, wherein the microwave driver is configurable by selectively tuning either the driver power, or the driver frequency, or both.

5. The system of claim 1, further comprising one or more additional qubits, wherein the microwave driver is further configurable to selectively decrease a ZZZ interaction strength or a ZZZZ interaction strength between the first qubit, the second qubit, and the one or more additional qubits.

6. A method of tuning ZZ interactions between a first qubit and a second qubit that are inductively or capacitively coupled using a qubit coupler, the method comprising:
   driving the qubit coupler using microwaves having a driver power, and having a driver frequency that is different than a resonant frequency of the first qubit and a resonant frequency of the second qubit;
   tuning a resonant frequency of the qubit coupler to reduce spurious interactions between the first qubit and the second qubit by selectively decreasing the ZZ interaction strength; and
   driving the qubit coupler to selectively increase the ZZ interaction strength, thereby forming a two-qubit gate,
   wherein driving the qubit coupler selectively increases or decreases a ZZ interaction strength between the first qubit and the second qubit through the qubit coupler, and wherein driving the qubit coupler comprises selectively tuning to obtain a given leakage rate, or a given gate speed, or a balance between a leakage rate and a gate speed.

7. The method of claim 6, wherein driving the qubit coupler comprises selectively tuning either the driver power, or the driver frequency, or both.

8. The method of claim 6, further comprising driving the qubit coupler to selectively decrease a ZZZ interaction strength or ZZZZ interaction strength between the first qubit, the second qubit, and one or more additional qubits.

9. A multi-qubit processor comprising:
   a plurality of qubits, each qubit in the plurality of qubits being associated with a respective resonant frequency;
   a plurality of qubit couplers, each qubit coupler in the plurality of qubit couplers being associated with a respective resonant frequency and inductively or capacitively coupling a respective pair of qubits in the plurality of qubits; and
   a plurality of microwave drivers, each microwave driver configurable for driving a corresponding qubit coupler with microwaves according to a driver power and a driver frequency, the driver power and driver frequency being selected to reduce crosstalk between the qubits inductively coupled by the corresponding qubit coupler.

10. The multi-qubit processor of claim 9, further comprising at least one qubit coupler that inductively or capacitively couples a first pair of qubits in the plurality of qubits to a second pair of qubits in the plurality of qubits.

11. The multi-qubit processor of claim 9, wherein the plurality of qubits and the plurality of qubit couplers comprise a two-dimensional repeating pattern of unit cells, each unit cell having at least two qubits and at least one qubit coupler.

12. The multi-qubit processor of claim 11, wherein each unit cell is characterized by a minimum Manhattan distance between qubits in the plurality of qubits, or couplers in the plurality of couplers, that have the same resonant frequency.

13. The multi-qubit processor of claim 9, wherein at least one microwave driver is configured according to a driver power and driver frequency selected to minimize or cancel crosstalk between the qubits inductively coupled by the corresponding qubit coupler.

* * * * *